United States Patent
Hironaga et al.

(10) Patent No.: US 7,229,921 B2
(45) Date of Patent: Jun. 12, 2007

(54) SEMICONDUCTOR DEVICE AND MANUFACTURING METHOD FOR THE SAME

(75) Inventors: Nobuo Hironaga, Tokyo (JP);
Toshiyuki Takewaki, Tokyo (JP);
Hiroyuki Kunishima, Tokyo (JP);
Yoshiaki Yamamoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 400 days.

(21) Appl. No.: 10/281,306

(22) Filed: Oct. 28, 2002

(65) Prior Publication Data

US 2003/0173671 A1  Sep. 18, 2003

(30) Foreign Application Priority Data

Mar. 13, 2002 (JP) ............................ 2002-068044
Jul. 8, 2002 (JP) ............................ 2002-198351
Sep. 10, 2002 (JP) ............................ 2002-264666

(51) Int. Cl.
*H01L 21/44* (2006.01)
*H01L 21/4763* (2006.01)

(52) U.S. Cl. ................. 438/687; 438/630; 438/649; 438/651; 438/655

(58) Field of Classification Search ............... 438/630, 438/647–651, 655, 683, 685, 687, 657
See application file for complete search history.

(56) References Cited

U.S. PATENT DOCUMENTS 5,447,887 A * 9/1995 Filipiak et al. ............. 438/644
6,181,013 B1  1/2001 Liu et al.
6,211,084 B1  4/2001 Ngo et al.
6,242,349 B1 * 6/2001 Nogami et al. ............. 438/687

(Continued)

FOREIGN PATENT DOCUMENTS

CN  1203450 A  12/1998

(Continued)

OTHER PUBLICATIONS

1998 Semiconductor Technology Outlook, pp. 431-435.

*Primary Examiner*—Hung Vu
(74) *Attorney, Agent, or Firm*—Sughrue Mion, PLLC

(57) ABSTRACT

In a method of manufacturing a semiconductor device, a first wiring line composed of a copper containing metal film is formed on or above a semiconductor substrate. A first interlayer insulating film is formed on a whole surface of the semiconductor substrate to cover the first wiring line. The first interlayer insulating film is selectively removed to form a connection hole reaching the first wiring line. A barrier metal film is formed to cover an inner surface of the connection hole and then a copper containing metal film is formed to fill the connection hole. The copper containing metal film formed outside the connection hole is removed. A second interlayer insulating film is formed on a whole surface of the semiconductor substrate to cover the copper containing metal film formed in the connection hole. The second interlayer insulating film is selectively removed to form a wiring line groove such that the copper containing metal film formed in the connection hole is exposed at a bottom. A barrier metal film is formed to cover an inside of the wiring line groove and then a copper containing metal film is formed to fill the wiring line groove. Then, the copper containing metal film outside the wiring line groove is removed to form a second wiring line.

62 Claims, 40 Drawing Sheets

U.S. PATENT DOCUMENTS

| | | |
|---|---|---|
| 6,358,838 B2 * | 3/2002 | Furusawa et al. ............ 438/622 |
| 6,391,774 B1 | 5/2002 | Takewaki |
| 6,492,266 B1 * | 12/2002 | Ngo et al. .................. 438/687 |
| 6,509,273 B1 * | 1/2003 | Imai et al. .................. 438/693 |
| 2001/0053592 A1 * | 12/2001 | Sone ........................... 438/584 |

FOREIGN PATENT DOCUMENTS

| | | |
|---|---|---|
| CN | 1307363 A | 8/2001 |
| JP | 9-232312 A | 9/1997 |
| JP | 9-255687 A | 9/1997 |
| JP | 9-321045 A | 12/1997 |
| JP | 10-116909 A | 5/1998 |
| JP | 2809196 B2 | 7/1998 |
| JP | 11-330023 A | 11/1999 |
| JP | 2000-58544 A | 2/2000 |
| JP | 2000-150517 A | 5/2000 |
| JP | 2000-306996 A | 11/2000 |
| JP | 2001-118924 A | 4/2001 |
| JP | 2001-345317 A | 12/2001 |
| JP | 2002-9150 A | 1/2002 |
| JP | 2002-50690 A | 2/2002 |

* cited by examiner

CURRENT PATH

Fig. 25A
ETCHING RATE IN CASE OF LAL 700 Å
|  | ① | ② | ③ | ④ | ⑤ |
|---|---|---|---|---|---|
| L-Ox | 957 | 981 | 915 | 922 | 932 |
| HSQ | 1198 | 1232 | 1007 | 1101 | 1058 |
Fig. 25B
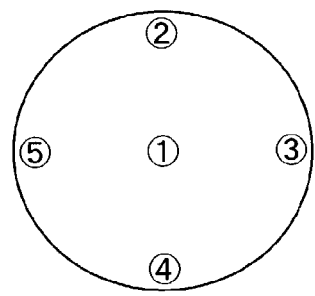
Fig. 26A
|  | YIELD | WIRING STRUCTURE |
|---|---|---|
| SILICIDE   NO PLASMA | 100% | 1, 2, 5 |
| SILICIDE   PLASMA | 24% | 7 |
| NO SILICIDE | 100% | 3, 4, 6 |
Fig. 26B
LEAK MEASUREMENT PATTERN
(COMB PATTERN)
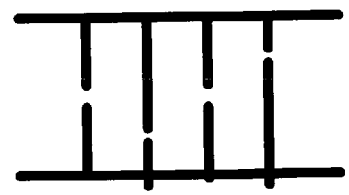
DISTANCE 24 mm

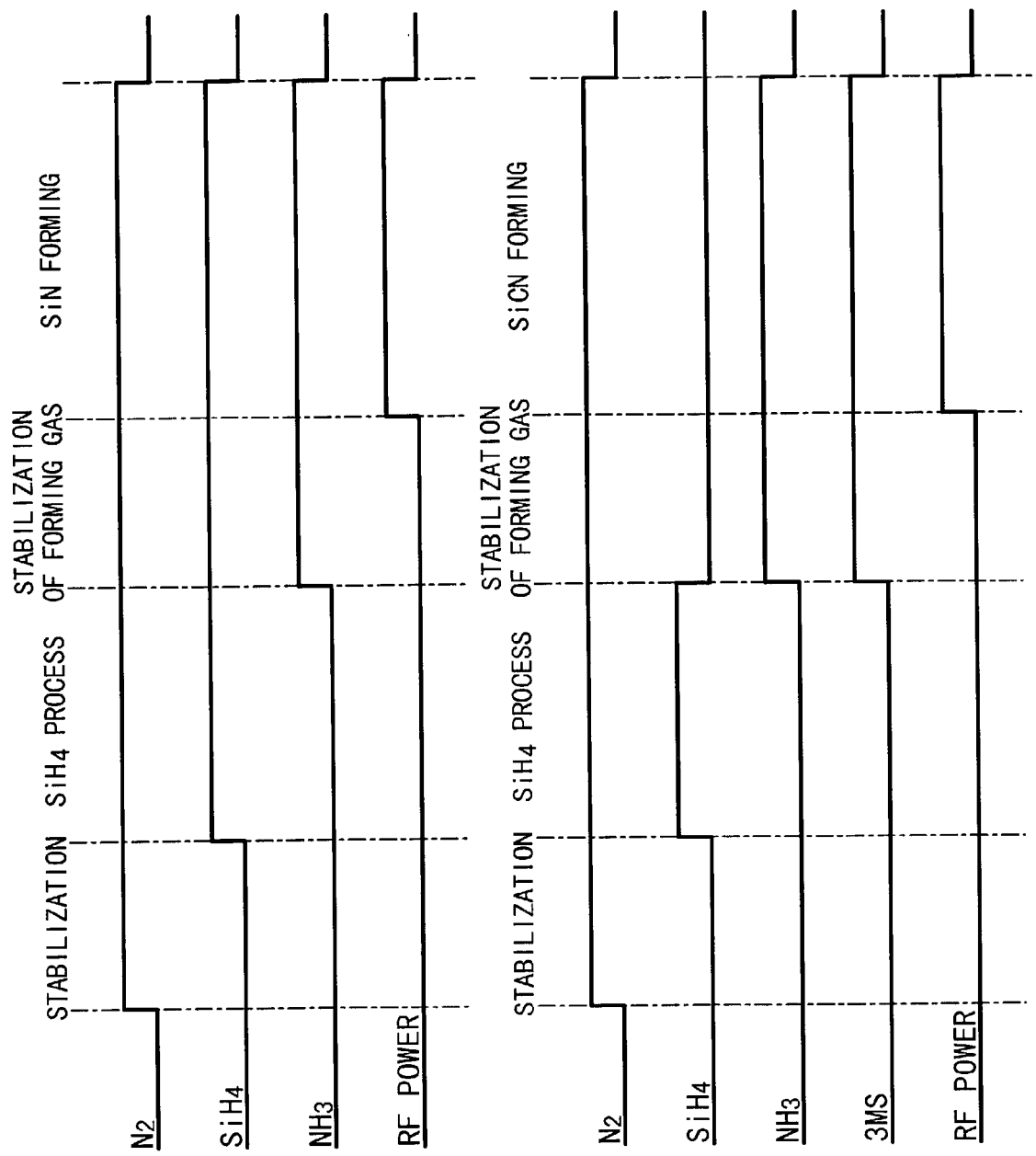

| DIELECTRIC CONSTANT (@1MHz) | 2.9 |
|---|---|
| REFRACTIVE INDEX (@633nm) | 1.39 |
| STRESS (dyne/cm$^2$) | 7.00E+08 |
| HARDNESS (Gpa) | 0.9 |
| ELASTIC MODULUS (Gpa) | 6 |
| THERMAL EXPANSION COEFFICIENT (ppm/deg-C) | 18 |
| GLASS TRANSITION TEMPERATURE (dge-C) | NONE |
| THERMAL CONDUCTIVITY (W/mk@25 deg-C) | 0.31 |

SEMICONDUCTOR DEVICE AND MANUFACTURING METHOD FOR THE SAME

BACKGROUND OF THE INVENTION

1. Field of the Invention

The present invention relates to a semiconductor device and a manufacturing method for the same. More particularly, the present invention relates to a semiconductor device containing a copper containing metal wiring line and a manufacturing method for the same

2. Description of the Related Art

In recent years, a low resistance material such as copper is used as a wiring line material for demand of the high speed operation of a semiconductor device.

As a damascene process for forming a copper wiring line structure, a single damascene method and a dual damascene method are known. In the single damascene method, only a wiring line is formed by the damascene process. In the dual damascene method, a wiring line groove is embedded with copper in addition to a connection hole, to form the connection plug and the wiring line. Conventionally, in the single damascene method, the connection plug is formed of a refractory metal such as tungsten. However, in the dual damascene method, the connection plug is formed of a copper containing metal in addition to the wiring line. Therefore, the low resistance of the wiring line structure can be realized, and it is possible to contribute for the high speed operation of the semiconductor device.

FIGS. 1A to 1E are cross section views showing the wiring line structure formed by a method forming of the connection plug and the wiring line by the dual damascene method. FIG. 1A is a cross sectional view showing a state in which a first copper containing metal wiring line 220a has been formed. First, processes to the state of FIG. 1A will be described. First, a first silicon nitride film 212 and a first silicon oxide film 214 are formed on a semiconductor substrate 210 on which devices such as a transistor are formed. Subsequently, a wiring line groove is formed in the first silicon nitride film 212 and the first silicon oxide film 214 by a dry etching. A barrier metal film 216a and a copper film 218a are formed in this order to fill the wiring line groove. Subsequently, the surface of the substrate is flattened by a CMP method. Thus, the first copper containing metal wiring line 220a is formed. Subsequently, a second silicon nitride film 222 and a second silicon oxide film 224 are formed. In this way, the state of FIG. 1A is achieved.

Next, as shown in FIG. 1B, a connection hole 226 for a connection plug and a wiring line groove 228 are formed in a second silicon oxide film 224 by a lithography method and an etching method. Subsequently, an etching gas is changed and the etching of a second silicon nitride film 222 is carried out. Subsequently, as shown in FIG. 1C, the barrier metal film 230 is formed on the whole of second silicon oxide film 224 having the connection hole 226 and the wiring line groove 228.

Next, as shown in FIG. 1D, a copper film 232 is formed on the barrier metal film 230 and fills the connection hole 226 and the wiring line groove 228.

Next, as shown in FIG. 1E, the surface of the substrate is flattened by the CMP method, and the copper film 232 and the barrier metal film 230 in a portion other than the wiring line groove 228 are removed. Thus, the connection plug 234 and a second copper containing metal wiring line 220b are formed.

By repeating a series of the above-mentioned processes, the semiconductor device is formed to contain a multiple wiring line structure.

However, as mentioned above, when a wiring line and a connection plug are formed of copper by the dual damascene method, a production yield of the semiconductor device is so low that the semiconductor device can not be produced stably.

Also, in order to use the semiconductor device stably for a long term, points to be improved are still remained. Therefore, further improvement is demanded to increase the reliability of the semiconductor device. It is easy for copper and copper containing metal to cause migration, and the migration is supposed as one of the estimated causes that such a problem occurs. However, the cause is not clear.

SUMMARY OF THE INVENTION

Therefore, an object of the present invention is to improve the production yield of a semiconductor device with a copper containing metal wiring line structure.

Another object of the present invention is to extend the lifetime of a semiconductor device with a copper containing metal wiring line structure.

Still another object of the present invention is to increase the reliability of a semiconductor device.

In an aspect of the present invention, a method of manufacturing a semiconductor device, is achieved by forming a first wiring line composed of a copper containing metal film on or above a semiconductor substrate; by forming a first interlayer insulating film on a whole surface of the semiconductor substrate to cover the first wiring line; by selectively removing the first interlayer insulating film to form a connection hole reaching the first wiring line; by forming a barrier metal film to cover an inner surface of the connection hole and then forming a copper containing metal film to fill the connection hole; by removing the copper containing metal film formed outside the connection hole; by forming a second interlayer insulating film on a whole surface of the semiconductor substrate to cover the copper containing metal film formed in the connection hole; by selectively removing the second interlayer insulating film to form a wiring line groove such that the copper containing metal film formed in the connection hole is exposed at a bottom; by forming a barrier metal film to cover an inside of the wiring line groove and then forming a copper containing metal film to fill the wiring line groove; by and removing the copper containing metal film outside the wiring line groove to form a second wiring line.

Here, the manufacturing method of a semiconductor device may further include: changing a surface portion of the first wiring line into an amorphous layer before the step of forming the first interlayer insulating film. Also, the manufacturing method of a semiconductor device may further include siliciding a surface layer of the first wiring line before the step of forming the first interlayer insulating film.

Also, the manufacturing method of a semiconductor device may further include: cleaning the surface portion of the first wiring line before the step of forming the connection plug after the step of forming the first wiring line.

Also, the copper containing metal film of the first wiring line may be formed by a plating method.

Also, the insulating film may include ladder-type siloxane hydride.

Also, the manufacturing method of a semiconductor device may further include: forming a diffusion preventing film composed of SiC, SiCN, SiN or SiOC on the first wiring line before the step of forming the insulating film. The step of forming the connection hole may include the step of: selectively removing the first interlayer insulating film and the diffusion preventing film to form the connection hole.

Also, the step of forming the first wiring line may be achieved by forming the first copper containing metal film by a plating method; by forming a second copper containing metal film by a sputtering method on a surface of the semiconductor substrate to cover the first copper containing metal film; and by carrying out thermal treatment to the first copper containing metal film and the second copper containing metal film.

In another aspect of the present invention, a manufacturing method of a semiconductor device, may be achieved by forming an insulating film on a semiconductor substrate and then forming a first wiring line composed of a copper containing metal film in the insulating film; by changing a surface portion of the first wiring line into an amorphous layer; and by forming a connection plug connected with the first wiring line and a second wiring line connected with the connection plug on the first wiring line, the connection plug and the second wiring line being composed of a copper containing metal film.

In another aspect of the present invention, a manufacturing method of a semiconductor device, may be achieved by forming an insulating film on a semiconductor substrate and then forming a first wiring line composed of a copper containing metal film in the insulating film; by siliciding a surface portion of the first wiring line; and by forming a connection plug connected with the first wiring line and a second wiring line connected with the connection plug on the first wiring line, the connection plug and the second wiring line being composed of a copper containing metal film.

Here, the step of siliciding a surface layer of the first wiring line may include the step of: exposing the surface portion of the first wiring line to a gas containing silicon in a state of no plasma.

In this case, the manufacturing method of a semiconductor device may further include: cleaning the surface portion of the first wiring line before the step of forming the connection plug after the step of forming the first wiring line.

Also, the step of cleaning the surface portion of the first wiring line may include the step of: rinsing the surface portion of the first wiring line with liquid containing carboxylic acid or the salt.

Also, the carboxylic acid may contain at least one selected from the group consisting of oxalic acid, citric acid, malic acid, maleic acid, succinic acid, tartaric acid or malonic acid.

Also, the step of cleaning the surface portion of the first wiring line may include the step of: processing the surface portion of the first wiring line with anti-corrosion agent containing benzotriazole or benzotriazole derivative.

Also, the step of cleaning the surface portion of the first wiring line may include the step of: carrying out a plasma process to the first wiring line.

Also, the step of cleaning the surface portion of the first wiring line may include the step of: carrying out the plasma process to the first wiring line in a deoxidization atmosphere.

Also, the copper containing metal film of the first wiring line may be formed by a plating method.

Also, the insulating film includes ladder-type siloxane hydride. In this case, the ladder-type siloxane hydride may contain L-Ox.

Also, the forming the insulating film may include the step of: sintering the insulating film in an atmosphere temperature in a range of 200 to 400° C.

Also, the manufacturing method of a semiconductor device may further include: forming a diffusion preventing film composed of SiC, SiCN, SiN or SiOC on the first wiring line before the step of forming the insulating film. The step of forming the connection hole may include the step of: selectively removing the first interlayer insulating film and the diffusion preventing film to form the connection hole. In this case, the diffusion preventing film may be SiCN film.

Also, the step of forming the first wiring line may include the steps of: forming the first copper containing metal film by a plating method; forming a second copper containing metal film by a sputtering method on a surface of the semiconductor substrate to cover the first copper containing metal film; and carrying out thermal treatment to the first copper containing metal film and the second copper containing metal film.

In another aspect of the present invention, a manufacturing method of a semiconductor device, may be achieved by forming on a semiconductor substrate, a copper containing metal film to have substantially uniform plane orientation at a surface of the copper containing metal film; and by forming a different kind element containing film containing a different kind element which is different from copper on the surface of the copper containing metal film.

Also, in another aspect of the present invention, a manufacturing method of a semiconductor device, may be achieved by forming a copper containing metal film on a semiconductor substrate having by a plating method to have an average grain size equal to or larger than 1 μm; and by forming a different kind element containing film containing a different kind element which is different from copper on the surface of the copper containing metal film.

In both, the step of forming the copper containing metal film may include the steps of: forming a first copper containing metal film on the semiconductor substrate; forming a second copper containing metal film by a sputtering method on the semiconductor substrate to cover the first copper containing metal film; and carrying out thermal treatment to the first copper containing metal film and the second copper containing metal film.

Also, the manufacturing method of the semiconductor device may further include: forming an insulating film on the semiconductor substrate; and forming a concave section in the insulating film. The step of forming the first metal film may be achieved by forming the first copper containing metal film to fill a part of the concave section, the step of forming the second copper containing metal film may be achieved by forming the second copper containing metal film to fill a remaining part of the concave section. The step of forming the copper containing metal film may be achieved by removing the first copper containing metal film and the second copper containing metal film outside the concave section.

Also, the concave section may be a wiring line groove and the copper containing metal film forms a wiring line.

Also, the second copper containing metal film may be formed by a bias sputtering method in which a bias is applied to the semiconductor substrate.

Also, the step of forming the second copper containing metal film may be achieved by forming the second copper containing metal film such that a film thickness of the second copper containing metal film in a flat portion is thicker than a film thickness of the first copper containing metal film in the flat portion.

Also, the different kind element may be silicon, and the step of forming the different kind element containing film may be achieved by siliciding a surface portion of the copper containing metal film.

Also, the step of forming the different kind element containing film may be achieved by forming an alloy of copper and the different kind element on the surface of the copper containing metal film.

Also, the step of forming the different kind element containing film may be achieved by converting a surface portion of the copper containing metal film into an amorphous layer.

Also, the step of forming the copper containing metal film may be achieved by forming the copper containing metal film such that a plane orientation in the surface of the copper containing metal film is (200).

In another aspect of the present invention, a semiconductor device include: a semiconductor substrate; a first wiring line provided into an insulating film on the semiconductor substrate and formed of a copper containing metal film; a connection plug formed of a copper containing metal film, and connected with the first wiring line; and a second wiring line formed of the copper containing metal film, and connected with the connection plug. The surface portion of the first wiring line is an amorphous layer.

In another aspect of the present invention, a semiconductor device include: a semiconductor substrate; a first wiring line provided in a insulating film on the semiconductor substrate and formed of a copper containing metal film; a connection plug formed of a copper containing metal film, and connected with the first wiring line; and a second wiring line formed of the copper containing metal film, and connected with the connection plug. The surface portion of the first wiring line is a silicide layer.

In another aspect of the present invention, a semiconductor device include: a semiconductor substrate; a first wiring line provided in an insulating film on the semiconductor substrate and formed of a copper containing metal film; an interlayer insulating film formed on the first wiring line; a connection plug formed of the copper containing metal film, and connected with the first wiring line; and a second wiring line formed by laminating a barrier metal film and a copper containing metal film in this order, and connected with the connection plug.

Here, the surface portion of the first wiring line may be an amorphous layer.

Also, the surface portion of the first wiring line may be a silicide layer.

Also, the insulating film may contain ladder-type siloxane hydride. In this case, the ladder-type siloxane hydride may contain L-Ox.

Also, when the insulating film is formed, the insulating film is sintered at a temperature from 200° C. to 400° C.

Also, the copper containing metal film of the first wiring line may be formed by a plating method.

Also, a plane orientation of the surface of the copper containing metal film which of the first wiring line may be substantially uniform.

In another aspect of the present invention, a semiconductor device, include: a semiconductor substrate; a copper containing metal film formed on the semiconductor substrate to substantially uniform plane orientation in a surface of the copper containing metal film; and a different kind element containing conductive film formed of different kind element from copper on the surface of the copper containing metal film.

In another aspect of the present invention, a semiconductor device include: a semiconductor substrate; a copper containing metal film formed on the semiconductor substrate to have an average grain size equal to or more than 1 µm; and a different kind element containing conductive film formed of a different kind element from copper on the surface of the copper containing metal film.

In another aspect of the present invention, a semiconductor device includes a semiconductor substrate; a copper containing metal film formed on the semiconductor substrate; and a different kind element containing conductive film formed on the surface of the copper containing metal film and containing a different kind element from copper. An average grain size of crystal of the copper containing metal film is larger than an average film thickness of the copper containing metal film.

Here, the different kind element may be silicon, and the different kind element containing film may be a silicide layer.

Also, the different kind element containing film may be formed of an alloy of the different kind element and copper.

Also, the different kind element containing film may be an amorphous layer.

Also, the plane orientation of the surface of the copper containing metal film may be (200).

Also, the copper containing metal film may function a wiring line, a plug or a pad.

In another aspect of the present invention, a metal wiring line, formed of a copper containing plating film, contains a different kind element containing conductive film formed on the surface of the copper containing plating film and containing a different kind element from copper. An average size of grains contained in the copper containing plating film is equal to or more than 1 µm.

In another aspect of the present invention, a metal wiring line, formed a copper containing plating film, contains a different kind element containing conductive film formed on the surface of the copper containing plating film and containing a different kind element from copper. The copper containing plating film is formed of a single grain.

In this case, a width of the metal wiring line is equal to or more than 1 µm.

BRIEF DESCRIPTION OF THE DRAWINGS

FIG. 25A is a diagram showing a difference in wet etching rate in case of L-Ox and HSQ, and FIG. 25B is a diagram showing test points on a waver;

FIG. 26A is a diagram showing the measured results of leak current in the wiring line structures formed in the embodiments, and FIG. 26B is a diagram showing a leak measurement pattern;

FIGS. 27A and 27B are diagrams showing sequences of supply of gases and application of RF power when a SiCN film and a SiN film are formed, respectively;

DESCRIPTION OF THE PREFERRED EMBODIMENTS

Hereinafter, a semiconductor device of the present invention will be described with reference to the attached drawings.

Figure 9:
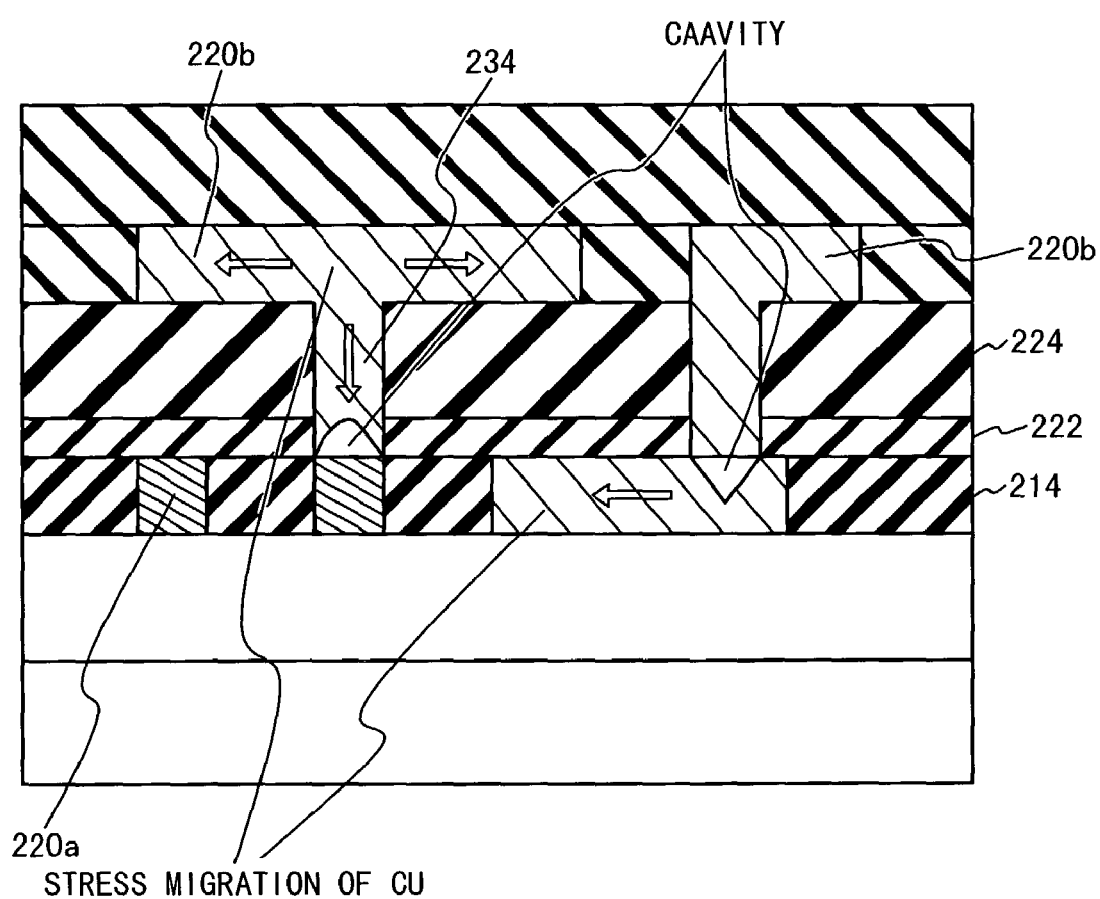
FIG. 9 is a diagram showing generation of a cavity between a connection plug and a copper wiring line in the semiconductor device manufactured by a dual damascene method.

The inventors of the present invention examined the causes that the production yield of the semiconductor device with the copper containing metal wiring line formed by the dual damascene method is low. As a result, the inventors found that a cavity was generated between a connection plug and a copper containing metal wiring line under the connection plug as shown in FIG. 9. The following two causes of the cavity generation could be considered.

First, as shown in the left side in the figure, copper in the connection plug 234 was sucked up by the second copper containing metal wiring line 220b and the cavity was generated in the second silicon nitride film 222 and the second silicon oxide film 224.

Second, as shown in the right in the figure, the cavity was generated in the first copper containing metal wiring line 220a around a lower portion of the connection plug 234. The cavity in the first copper containing metal wiring line 220a was easy to be generated in the wiring line, especially, when the width of the connection plug was about 1 to 12 μm. Also, the fact was found that such a cavity generation phenomenon occurs conspicuously at about 150° C., which was a practical use temperature in the manufacturing processes of the semiconductor device such as a bonding process, and a baking process of the photo-resist. The cavity causes a connection defect between the connection plug and the wiring line, the decrease of the production yield of the semiconductor device and an unstable operation of the semiconductor device as the result of a long-term use.

Figure 10:
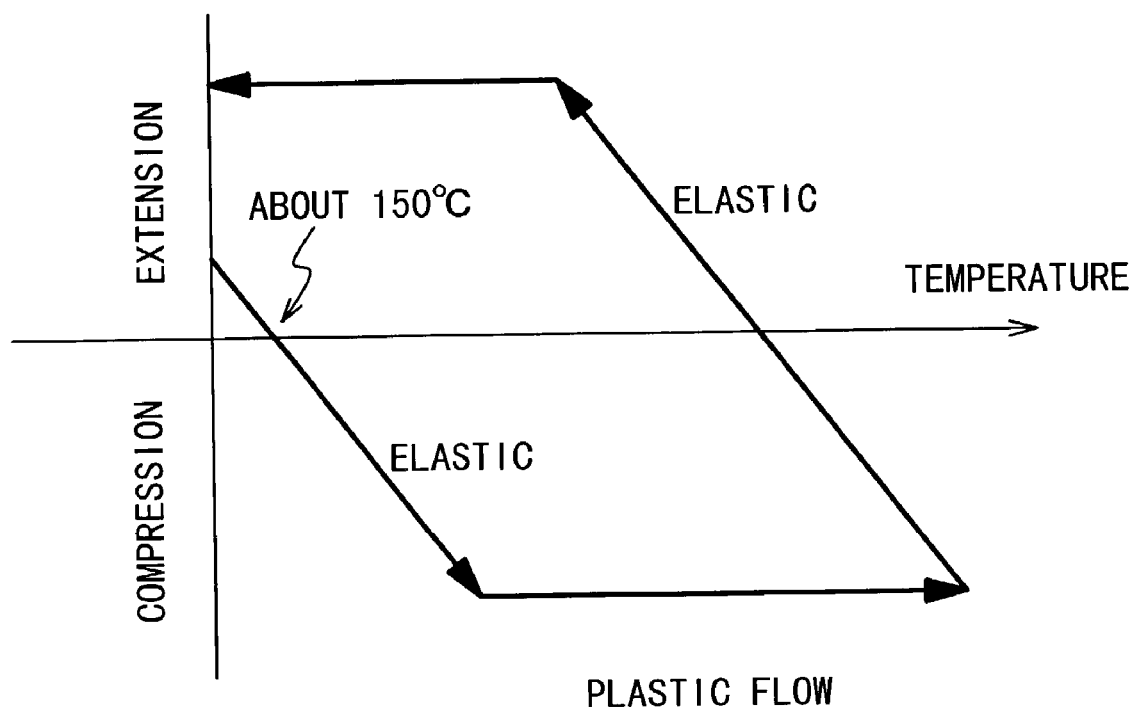
FIG. 10 is a diagram showing one of the causes that the cavity is generated.
Figure 12:
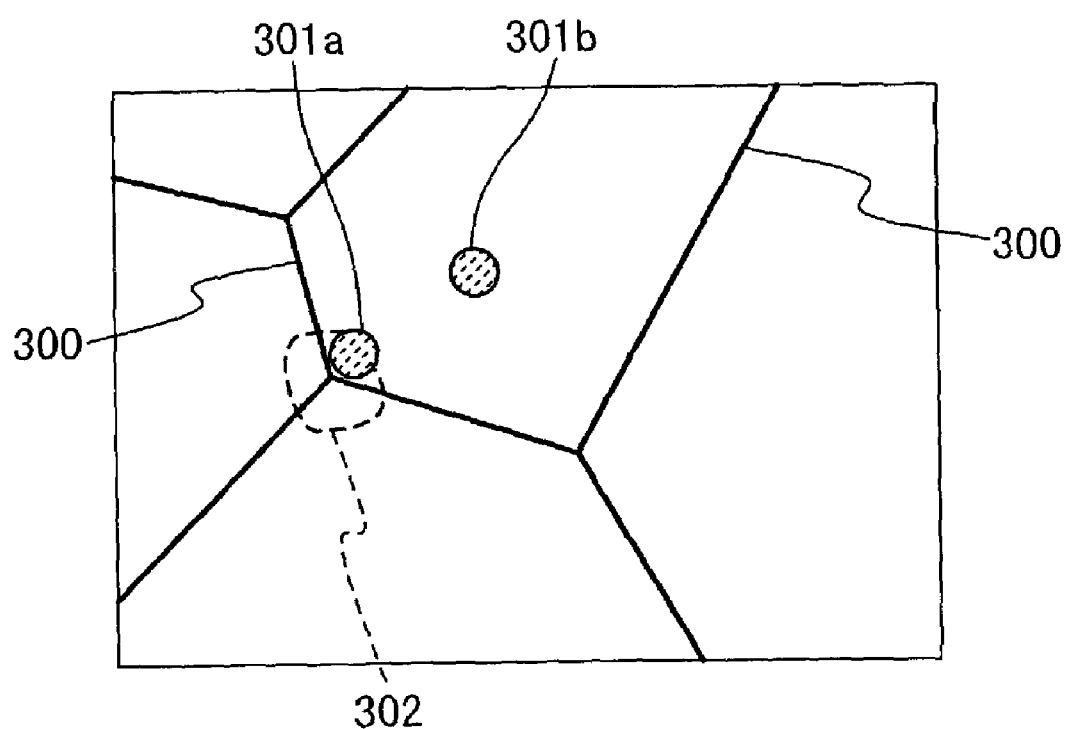
FIG. 12 is a schematic plan view showing the boundaries of grains.

FIG. 10 is a diagram showing one of the causes that the cavity is generated. FIG. 10 shows the stress which is added to copper when a copper film is heated. The horizontal axis of FIG. 12 shows temperature and the vertical axis shows stress. As shown in FIG. 10, when the copper film was heated from the room temperature, the stress applied to the copper film changed from a stiffness mode into a compression mode at about 150° C. The inventors supposed that the stress migration was caused in the copper containing metal in the connection plug and the wiring line to generate a cavity, when the change of such a stress mode has occurred. Especially, the inventors supposed that such a stress migration was promoted at the interfaces between the connection plug and the wiring line to generate a cavity.

Therefore, the inventors led the present invention based on the above suppositions to restrain the stress migration in the interfaces between the connection plug and the wiring lines.

In the present invention, a barrier metal film was formed between the copper containing metal films of the second wiring line and the connection plug. Therefore, it is possible to prevent the sucking-up of copper containing metal from the connection plug into the second wiring line due to the stress migration. For this reason, it is possible to prevent a connection defect between the connection plug and the wiring line. For example, the copper containing metal may be metal which contains copper equal to or more than 30%. Also, the copper containing metal may contain gold, silver, platinum and so on. The copper containing metal may contain chrome and molybdenum.

Figure 11:
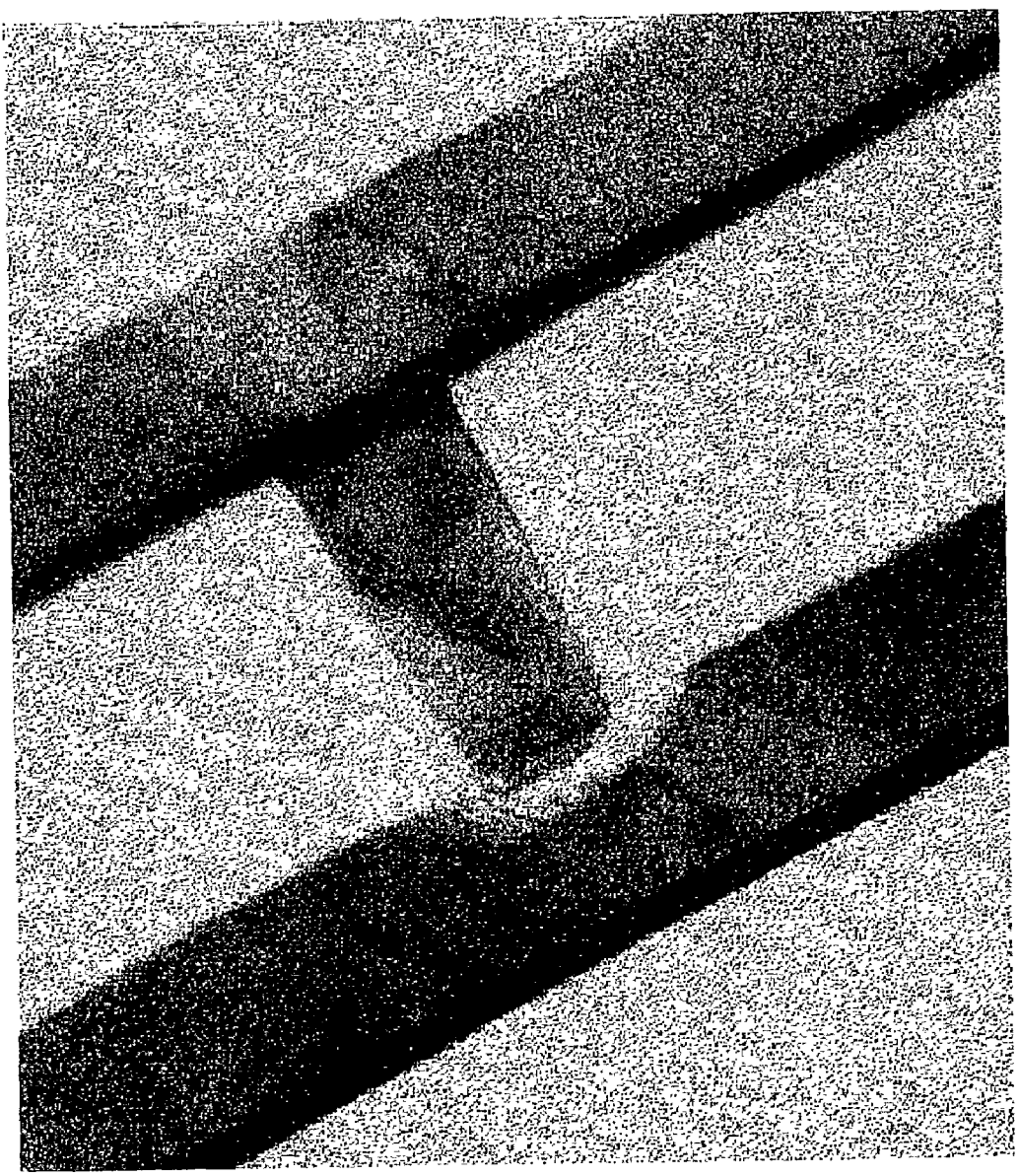
FIG. 11 is TEM photograph of the wiring line structure when the copper connection plug and the copper wiring line are formed by a single damascene method and are located for 500 hours at about 150 C.

FIG. 11 is a transmission-type electron microscope (TEM) photograph of a semiconductor device after the wiring ling structure was formed by such a single damascene method and the semiconductor device was located for 500 hours in the circumstance of about 150° C. As shown, when the connection plug and the second wiring line were formed by the single damascene method, the cavity in the copper film in the connection plug disappeared. Also, it was found that comparing with the semiconductor device formed by the dual damascene method, a cavity in the first wiring line around the lower portion of the connection plug was made small but was not eliminated.

FIG. 12 is a schematic plane view showing the cavity shown in FIG. 11. As shown, the cavity 302 was generated around the lower portion of the connection plug, when the connection plug was formed in the neighborhood of a boundary (301a) between particles or grains in the first wiring line surface. However, when the connection plug was formed in a part (301b) which was not a boundary, the cavity was difficult to be generated around the lower portion of the connection plug. Also, even when the connection plug was formed in the neighborhood of the boundary, the cavity was generated not directly below the connection plug but in the boundary. Especially, it was found that the cavity was easy to be generated in a region where the boundaries of the plurality of grains overlap complicatedly. From these results, the inventors found that it was one cause of the generation of the cavity that the stress migration was easy to be caused in the boundary portion in the first wiring line, especially, when the boundary exists in the neighborhood of the interface with the connection plug.

In the present invention, an amorphous layer may be provided on the surface portion of the first wiring line. In the amorphous layer, a halo pattern is confirmed in the refraction of an electron beam. When the amorphous layer is formed on the surface portion of the first wiring line, the stress migration from the first wiring line can be reduced. Therefore, it is possible to prevent the generation of a cavity between the first wiring line and the connection plug.

Also, a silicide layer may be provided on the surface portion of the first wiring line. When the silicide layer is on the surface portion of the first wiring line, the stress migration from the first wiring line can be reduced. Therefore, it is possible to prevent the generation of a cavity between the first wiring line and the connection plug.

In the present invention, as shown in FIG. 12, the cavity 302 is easy to be generated in the boundary of the grains. The cavity generation phenomenon is especially conspicuous when the copper containing metal film is formed by a plating method. The boundaries are generated between the grains when the copper containing metal film of the first wiring line is formed by the plating method. Therefore, it becomes easy for the cavity to be generated. Also, in the copper containing metal film formed by the plating method, the plane orientation in the copper surface differs for every grain such as (111) and (511), and the copper containing metal film surface with various plane orientations is exposed. This causes cavities. In the manufacturing method of the present invention, even when the copper containing metal film of the first wiring line is formed by the plating method, it is possible to prevent the generation of a cavity between the first wiring line and the connection plug and between the connection plug and the second wiring line. Thus, the semiconductor device can be stably manufactured.

Also, the copper containing metal film of the connection plug and/or the copper containing metal film of the second wiring line may be formed by the plating method. When the copper containing metal film of the connection plug is formed by the plating method, it is easy for the boundaries between the grains to be generated. As a result, the semiconductor device is easy to receive the stress migration. In the manufacturing method of the present invention, the generation of a cavity between the first wiring line and the connection plug can be prevented.

In the present invention, the silicide layer may be provided on the first wiring line. When an oxide film exists on the copper containing metal film of the first wiring line, it is difficult to form the silicide layer in a region where the oxide film is formed. As a result, when the forming process of the silicide layer is carried out in the condition that the oxide film is adhered to the surface of the first wiring line, the thickness of the silicide layer is not uniform. Especially, when the first wiring line is formed by the plating method, the plane orientation in the surface of the copper containing metal film is different, as mentioned above. In this case, the oxide film is formed ununiformly in thickness on the surface, because the easiness of the oxidation of the surface is different for every plane orientation. As a result, the metal silicide layer cannot have a uniform thickness.

In order to reduce the stress migration from the first wiring line, it is preferable that the thickness of the silicide layer is thick. However, in order to reduce a contact resistance between the first wiring line and the connection plug, it is preferable that the thickness of the silicide layer is thin. Therefore, it is important to control the thickness of the silicide layer to an appropriate thickness such that the above both conditions are met, in order to increase the production yield of the semiconductor device with a copper containing metal wiring line. When the oxide film with un-uniform thickness has been formed on the copper containing metal film, it is difficult to control the thickness of the silicide layer. Therefore, the process of removing the oxide film from the copper containing metal film surface is important. Accordingly, in the present invention, a process is used which the surface portion of the first wiring line is cleaned. In this way, the oxidation of the copper containing metal film surface can be prevented and the oxide film such as an already formed CuOx film can be removed. Thus, the surface of the copper containing metal film can be uniformly silicided. Also, the performance of the semiconductor device can be improved.

In the cleaning process of the present invention, the surface portion of the first wiring line may be rinsed with a rinse liquid containing carboxylic acid or the salt. The carboxylic acid may contain at least one of oxalic acid, citric acid, malic acid, maleic acid, succinic acid, tartaric acid or malonic acid. Of the acids, the oxalic acid is especially preferable. The oxalic acid can efficiently remove the CuOx film due to the chelate operation. In this way, the copper containing metal film surface can be uniformly silicided.

Also, in the present invention, the surface portion of the first wiring line may be processed with anti-corrosion agent containing benzotriazole or benzotriazole derivative. The process of the anti-corrosion agent may be carried out immediately after a CMP process to the copper containing metal film in the first wiring line. In this case, the copper containing metal film surface can be protected from oxidixation and the copper containing metal film can be uniformly silicided. Also, the copper containing metal film surface may be rinsed and then the process of the anti-corrosion agent may be carried out. Thus, oxide films such as the CuOx film can be removed and a new oxide film can be prevented in the copper containing metal film of the first wiring line.

The cleaning process may be achieved by carrying out a plasma process to the first wiring line under the deoxidizing atmosphere. Through the plasma process under such a deoxidizing atmosphere, the anti-corrosion agent can be volatilized. Moreover, the oxide film such as the CuOx film formed on the copper containing metal film surface can be removed. Thus, the copper containing metal film surface can be uniformly silicided. Also, through this process, the anti-corrosion agent can be volatilized from the copper containing metal film surface. This process may be carried out after the process of siliciding the surface portion of the first wiring line. Even if silicon is deposited on the insulating film of the semiconductor device during the siliciding process, silicon is nitrided to prevent a short-circuit between wiring lines by carrying out the process as an ammonia plasma process.

The method of siliciding the surface of the copper wiring line is described in Japanese Patent No. 2,809,196, Japanese Laid Open Patent Application (JP-A-Heisei 9-255687), and Japanese Laid Open Patent Application (JP-P2000-150517A), for example. In these conventional examples, the technique is described that a silicide layer is formed on the surface portion of the copper wiring line for prevention the oxidation of the copper wiring line. However, with the demand of the high speed operation of the semiconductor device in recent years, the miniaturization of the copper wiring line is being advanced. For this reason, the increase of the contact resistance when the silicide layer is formed on the copper wiring line is focused as a new problem. If the film thickness of the silicide layer cannot be appropriately controlled, a relative thickness of the silicide layer to the whole film thickness of the copper wiring line increases. Therefore, in the semiconductor device with the multiple wiring line structure which a copper wiring line and a connection plug are stacked, various processes are carried out rather to suppress the forming of the silicide layer.

Figure 18:
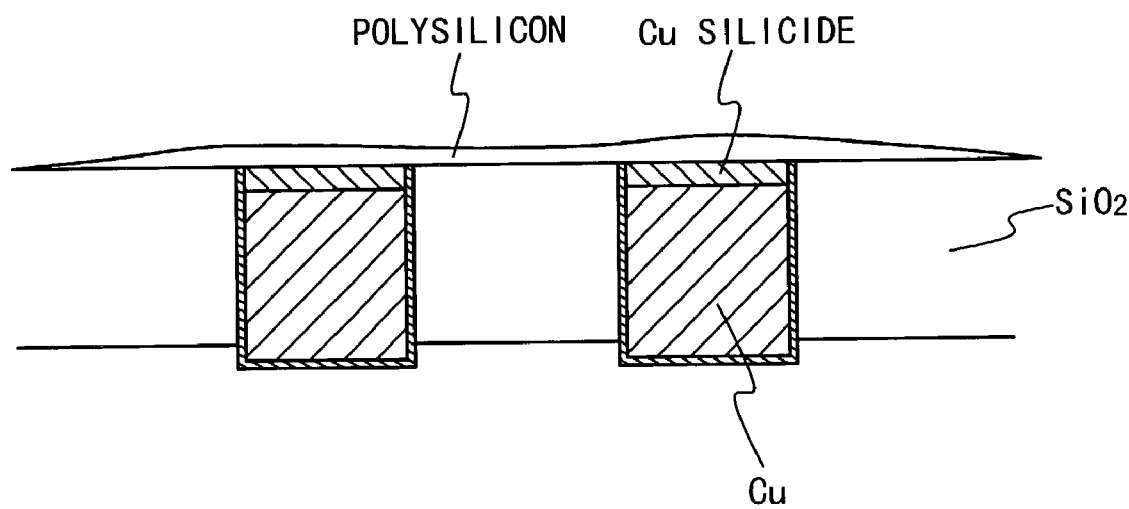
FIG. 18 is a diagram showing a conventional silicide forming process.

On the other hand, a method of controlling a silicide layer thickness is described in U.S. Pat. No. 6,181,013 and U.S. Pat. No. 6,211,084. For example, in U.S. Pat. No. 6,211,084, $SiH_4$ plasma is generated to try to control the forming a silicide layer on the copper surface before the oxidation prevention film such as SiN is formed. However, in this case, as shown in FIG. 18, a polysilicon film is formed in a region other than the copper surface. Therefore, there is a risk that a short-circuit is formed between the wiring lines. This point will be described later.

Also, in U.S. Pat. No. 6,181,013, after a copper film is subjected to a CMP process to leave a very thin film, a silicide layer of $Cu_5Si$ is formed through silane irradiation. Subsequently, a CMP process is carried out once again and a $Cu_5Si$ protection layer is selectively formed on the copper wiring line surface. When such a process is adopted, a dishing or recess is caused in the copper film surface when the second CMP process is carried out, which leads the deviation of the layer resistance.

Also, for example, in Japanese Patent No. 2,809,196, an example is described in which a copper wiring line is formed by a sputtering method or a CVD method. However, when the copper containing metal film is formed by the sputtering method and the CVD method, the above-mentioned boundaries of the grains are hardly generated. Therefore, the problem of the stress migration due to the existence of the boundary is not recognized at all.

In the present invention, from the viewpoint that is different from the above conventional examples, the forming of a silicide layer is demanded to reduce the stress migration in the semiconductor device containing a connection plug and a wiring line which are composed of a copper containing metal film. Especially, when the copper containing metal wiring line is formed by a plating method, it is important to form the silicide layer with an appropriate film thickness, because the generation of the boundaries of the grains is inevitable.

In the present invention, an oxide film can be removed from the surface of the copper containing metal film of the first wiring line by a cleaning process of the surface portion of the first wiring line. Also, especially, the forming of a further oxide film can be prevented by the processing of using an anti-corrosion agent. Therefore, it is possible to control the thickness of the silicide layer appropriately in the copper containing metal wiring line film. In this way, in the semiconductor device having a multiple wiring line structure, it is possible to suppress the influence of the contact resistance and to reduce the stress migration, resulting in the increase in the reliability of the device.

In the present invention, the copper containing metal wiring line film with the substantially uniform plane orientation is formed. The substantial uniformity of the plane orientation means that grains equal to or more than 70% at least in the copper containing metal have the same plane orientation as the result of an X-ray analysis method. By making the plane orientations in the surface of the copper containing metal film substantially uniform, it is possible to uniformly form a different kind element containing film on the surface, and to control the film thickness of the different kind element containing film appropriately. In this way, while the resistance increase of the copper containing metal film is suppressed, the copper containing metal film can be protected with the different kind element containing film. Also, it is possible to improve the stress migration endurance of the copper containing metal film. Here, the different kind element may contain one or more selected from the group consisting of Si, Ag, W, Mg, Be, Zn, Pd, Cd, Au, Hg, Pt, Zr, Ti and Sn. When Si is used as the different kind element, the copper containing metal film surface can be silicided and can improve the stress migration endurance of the copper containing metal film. Also, the different kind element containing film may be formed as an alloy of copper and the different kind element. In this case, it is possible to improve the strength. Also, it is possible to protect the surface of the copper containing metal film and to reduce the stress migration of the copper containing metal film. When Be, Mg, Zn, Pd, Ag, Cd, Au or Hg is used as the different kind element, the resistance increase of the copper containing metal film can be suppressed. Also, when Zr or Ti is used as the different kind element, it is possible to improve the fitness between the copper containing metal film and the insulating film and the barrier metal film. Also, when Mg is used as the different kind element, it is possible to prevent the corrosion of the copper containing metal film surface.

When the average size of the grains in the copper containing metal film is equal to or more than 1 µm, the boundaries of the grains in the copper containing metal film surface can be reduced. Here, the grain size is calculated as an average of the length in a longer axis and the length in a shorter axis of each grain. The average grain size is an average of the grain sizes. Thus, it is possible to improve the stress migration endurance of the copper containing metal film. Also, when a different kind element containing film is formed on the surface of the copper containing metal film, it is possible to control the film thickness of the different kind element containing film appropriately by reducing the number of boundaries, although it is difficult for the different kind element containing film to be uniformly formed in the boundary portion of the grains.

A bias sputtering method can be carried out by applying RF (high frequency) bias or a DC (direct current) bias to the semiconductor substrate. At this time, ion irradiation energy (plasma potential+self bias), which is applied to the semiconductor substrate, is a high bias, e.g., 80 eV or more, preferably, 200 eV or more. By forming the second copper containing metal film by such a bias sputtering method, the plane orientation of the copper containing metal film can be made substantially uniform through a subsequent thermal treatment. Also, it is possible to make the average grain size of these copper containing metal film can equal to or more than 1 μm.

In the present invention, the step of forming a different kind element containing film may include a step of forming an alloy of copper and different kind element on the surface of the copper containing metal film. It should be noted that "alloy" in this specification means one obtained by melting two or more metal elements and solidifying it, and may contain a nonmetal or metalloid element in addition to the metal element. Also, as the structure state of alloy, there are a case of solid solution, a case of intermetallic compound and a case of mixture of them, based on the mixture of elements. That is, a substance in which the element is added more than a solid solution limit is also referred to as "alloy".

In the relatively thick wiring line of equal to or more than 1 μm, it is easy for the stress migration to be caused in the conventional examples because the grain size is small, compared with the wiring line width and the boundaries of a lot of grains existed in the copper film surface. In the present invention, the grain size can be made large. Therefore, the number of boundaries of the grains in the copper containing metal film surface can be reduced. Thus, it is possible to improve in the wiring line stress migration endurance.

The barrier metal film in the present invention contains refractory metal such as Ti, W and Ta. For example, as the preferable barrier metal film, films of material such as Ti, TiN, W, WN, Ta and TaN are exemplified. Especially, a tantalum-based barrier metal is preferably used and in which a TaN film and a Ta film are laminated. The barrier metal film can be formed by various methods such as a sputtering method, a CVD method.

Amorphous metal in the present invention is Cu silicide. The Cu silicide is formed by siliciding the surface of the copper containing metal film. The siliciding is carried out by exposing the surface of the copper containing metal film to a gas containing silicon. For example, as the gas containing silicon, a gas obtained by diluting monosilane, disilane, trisilane or tetrasilane with inert gas such as nitrogen gas is used. In this way, by diluting the gas containing silicon with the inert gas, the rate of the siliciding can be reduced so that the film thickness of the silicide layer can be controlled to a preferable thickness. Preferably, an average film thickness of the silicide layer can be made equal to or more than 5 nm. Thus, the stress migration to the first wiring line can be reduced. Also, preferably, the upper limit of the average film thickness of the silicide layer can be made equal to or less than 30 nm. Thus, the stress migration to the first wiring line can be reduced. Also, the high performance semiconductor device can be manufactured in a high production yield without undergoing influence of contact resistance between a connection plug and the first wiring line. Also, the siliciding may be carried out by an ion implantation. Moreover, by implanting Si ions, the boundaries in the first wiring line surface can be made discrete.

In the present invention, there are various methods of cleaning the surface portion of the first wiring line. For example, an anti-corrosion processing of the copper containing metal film surface by an anti-corrosion agent, a plasma process method under a deoxidizing atmosphere or a rinsing method of the copper containing metal film surface with a rinsing liquid are exemplified.

For example, benzotriazole (BTA) and benzotriazole derivative can be used as the anti-corrosion agent in the present invention. In this case, the anti-corrosion agent is generally solution in which the concentration of BTA or the derivative is equal to or less than 3%. Also, by including, in a solution, a soluble compound which does not contain a metal atom in molecule and contains one or more nitrogen atom, the concentration of BTA or the derivative can be made more than 3%. For example, as a soluble compound, ammonium hydroxide, tetramethylammonium hydroxide, amin compound and amide compound and so on can be given. By using BTA or the derivative as the anti-corrosion agent, the copper containing metal film surface after a CMP process can be protected in a good state. The oxidation of the copper containing metal film surface can be prevented.

Moreover, heterocyclic compound has the six-fold-ring containing nitrogen atom in the molecule can be used as the anti-corrosion agent. Such a heterocyclic compound shows good anti-corrosion operation due to the chelate operation of the nitrogen atom in the complex ring, and has good biodegradation property.

Also, the heterocyclic compound which has a five or six-fold-ring containing the following atomic group may be used as the anti-corrosion agent:

—C(OH)=N— or

—CONH—

The following materials are given as specific examples of the heterocyclic compound: purine and the derivative such as purine, 6-aminopurine, 2-amino-6-oxopurine, 6-furfurylaminopurine, 2,6-(1H. 3H)-purinedione, 2-amino-6-hydroxy-8-mercaptopurine, allopurinol, uric acid, kinetin, zeatin, guanine, xanthine, hypozanthine, adenine, theophylline, caffeine, and theobromine; azaguanine and the derivative such as 8-azaguanine; pteridine and pterin and the derivatives of them such as pteridine, pterin, 2-amino-4,6-dihydroxypteridine, 2-amino-4,7-dihydroxypteridine, and 2-amino-4,6,7-trihydroxypteridine; cyanuric acid and isocyanuric acid and the derivatives of them such as tris-carboxy methyl cyanuric acid, tris-carboxy ethyl cyanuric acid, and tris-carboxy methyl isocyanuric acid; hydantoin and allantoin and the derivatives of them such as hydantoin, dimethyl hydantoin, and allantoin(5-ureidehydantoin); barbituric acid and the derivative; nicotine acid and the derivative such as isonicotinic acid, and citrazinic acid. They may be used individually and tow or more. In the above, purine and the derivative; cyanuric acid and isocyanuric acid and the derivatives; and nicotine acid and the derivative are preferably used. It is because they shows the excellent anti-corrosion effect to metals such as copper and has good biodegradation property.

In the above, especially, purine and the derivative never inflict damage on a semiconductor substrate and various films formed on it and show the excellent anti-corrosion effect to metals such as copper. Therefore, it is preferably used. Especially, the compound shown by the following general equation (1), i.e., uric acid is naturally widely distributed and has the high safety. Also, uric acid has excellent biodegradation property, the conspicuously excellent anti-corrosion and it is preferably used.

[化1]

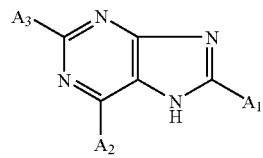

(A1, A2 and A3 independently show a hydrogen atom, a hydroxyl base, and alkyl base or amino base with carbons of 1 to 5, respectively)

It is desirable that at least one of A2 and A3 is hydroxyl in the above equation. In this case, the compound has the structure which has amide combination in the complex annulus, and the good anti-corrosion operation and biodegradation.

A gas such as nitrogen, argon or helium and can be used for the plasma process in the present invention. For example, an ammonia plasma process can be used as the plasma process under a deoxidizing atmosphere. By carrying out the plasma process in the deoxidizing atmosphere, the oxide on the wiring line copper containing metal film surface can be deoxidized. Also, when BTA is used as the anti-corrosion agent, it is difficult for BTA to be removed, but BTA can be removed through evaporation by carrying out the plasma process immediately before the siliciding process.

The rinsing liquid in the present invention can contain carboxylic acid or the salt. The carboxylic acid may contain oxalic acid, citric acid, malic acid, maleic acid, succinic acid, tartaric acid or malonic acid.

Various type of low dielectric constant materials can be used for an insulating film for a wiring line and for an interlayer insulating film between upper and lower wiring lines. Preferably, the insulating film is a film containing ladder-type oxide such as ladder-type siloxane hydride. For example, the ladder-type siloxane hydride film, or a laminate film of film of the ladder-type siloxane hydride film and a $SiO_2$ film is desirable. The ladder-type siloxane hydride is a polymer which has a ladder-type molecule structure. The dielectric constant is 2.9 or below preferably from the viewpoint of the wiring line delay prevention, and also the low film density is desirable. For example, it is desirable that the film density is from 1.50 g/cm$^3$ to 1.58 g/cm$^3$ and the refractive index at the wavelength of 633 nm is from 1.38 to 1.40. As a specific instance of such film material, L-Ox can be exemplified.

Figure 19:
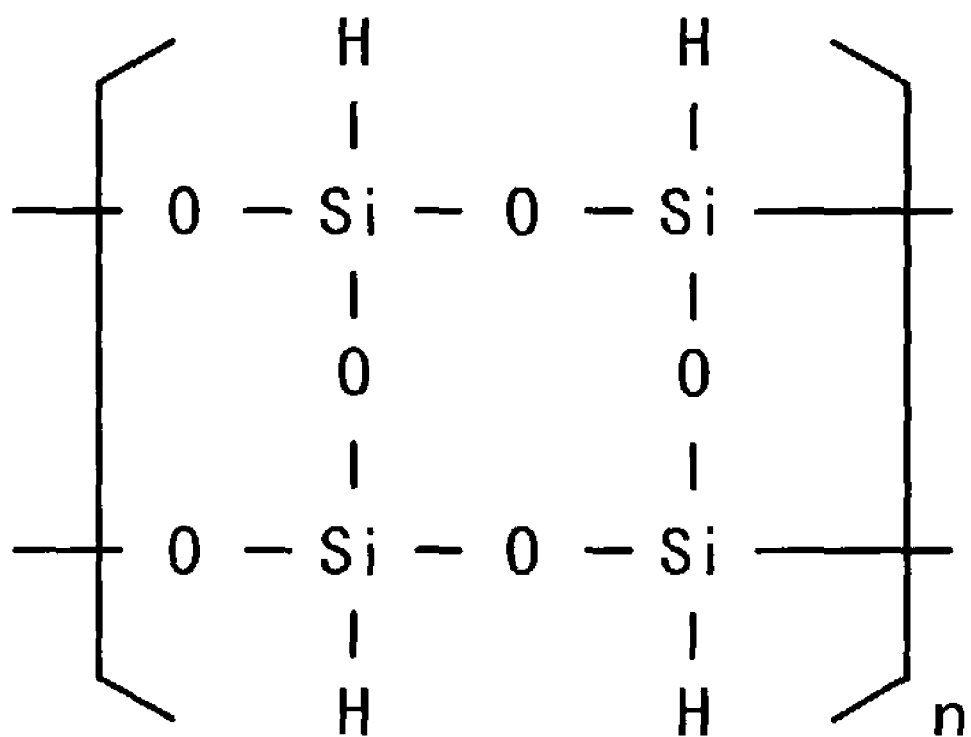
FIG. 19 is a diagram showing the structure of L-Ox with a ladder-type siloxane hydride structure.
Figures 28, 29:
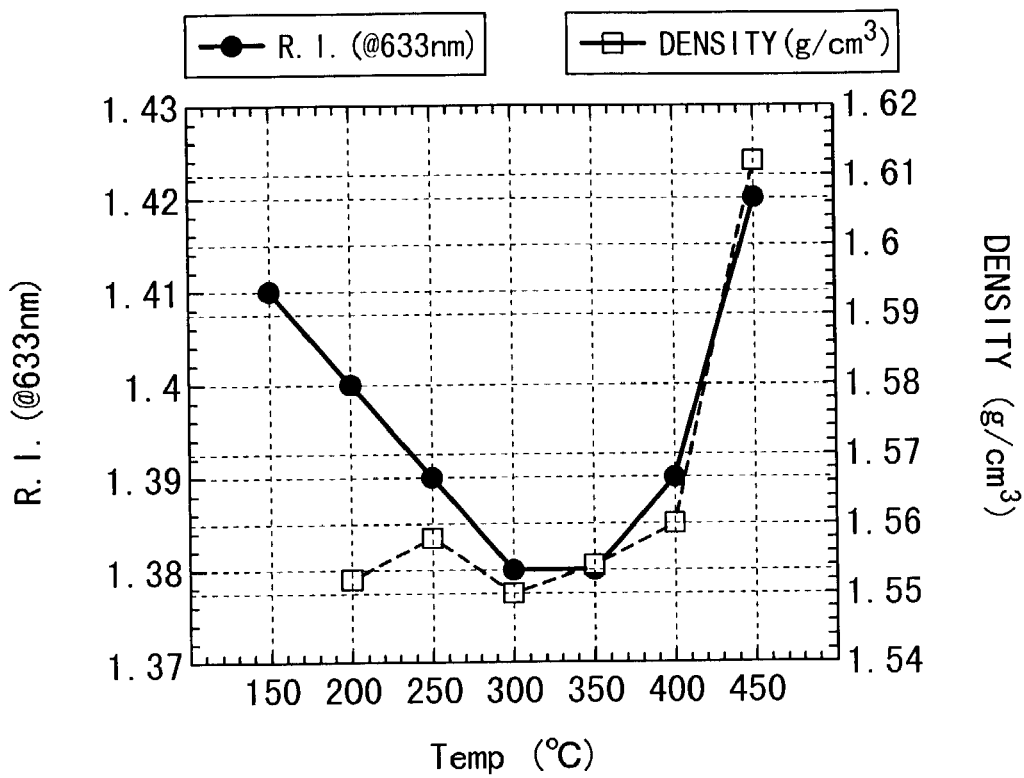
FIG. 28 is a diagram showing sintering condition dependence of the refractive index and density of L-Ox.
FIG. 29 is a diagram showing the physical data of L-Ox.

FIG. 19 shows the structure of L-Ox (trade mark) which has ladder-type siloxane hydride structure. In FIG. 19, n is a positive number equal to or more than 1. FIG. 29 shows the physical data of L-Ox with such a structure.

Figure 20:
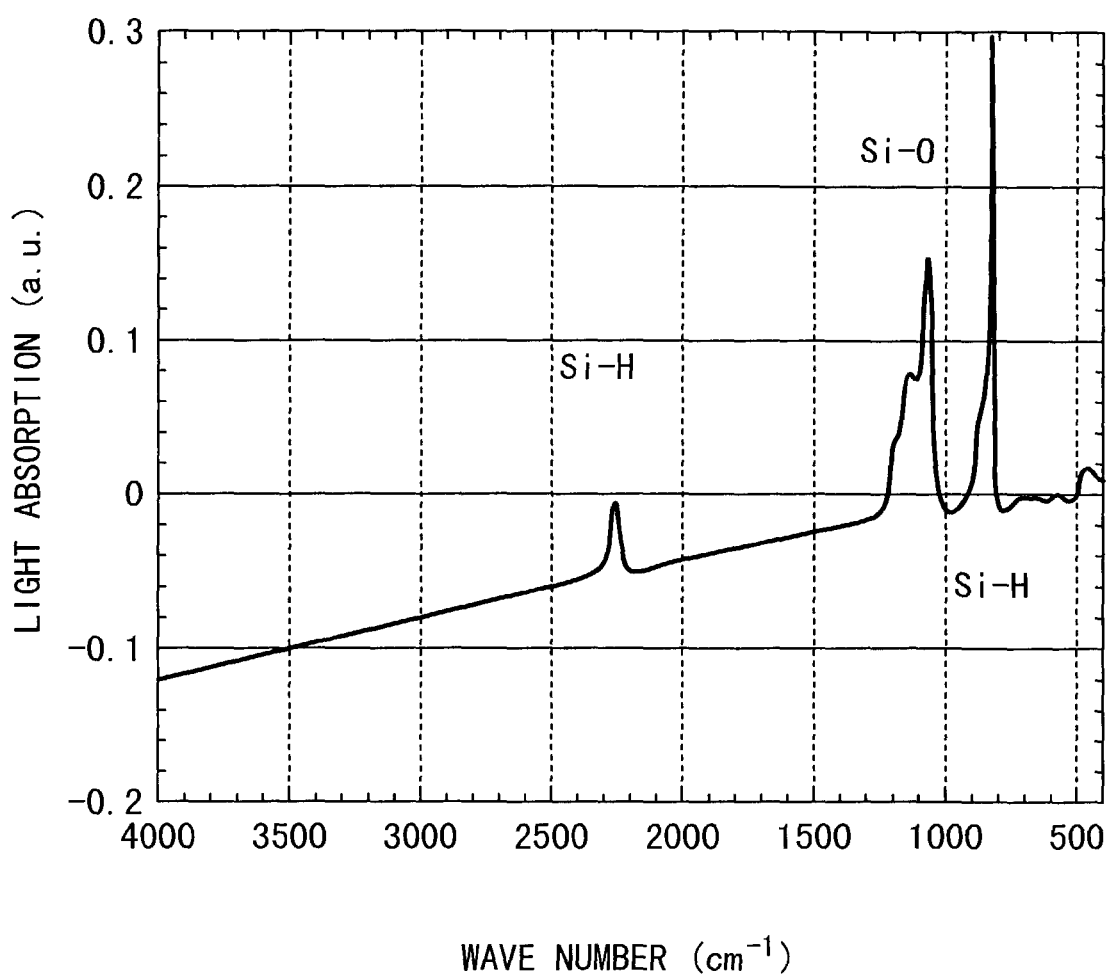
FIG. 20 is a diagram showing the IR spectrum of L-Ox.

It was confirmed from the observation result of FT-IR that L-Ox has the structure of FIG. 19. It was the sharp spectrum of a Si—H combination which appeared in about 830 cm$^{-1}$ that was characteristic in the chart of FIG. 20. The steepness of this spectrum suggests that L-Ox has a 2-dimension structure. Also, the spectrum of another Si—H combination appeared near 870 cm$^{-1}$ in the higher wave number side with extremely small peak. This fact would show that the measurement object material has the 2-dimension structure.

The physical properties of L-Ox change depending on the sintering condition. This fact will be described with reference to FIG. 28.

When being sintered in a range of 200 C to 400 C in the atmosphere of inert gas such as nitrogen, the L-Ox has following characteristic.

In FIG. 28, R.I. shows refractive index at the wavelength of 633 nm. The refractive index is a parameter which directly influences dielectric constant, and this value changes between 1.38 to 1.40. The value exceeds 1.40 when the sintering temperature is less than 200 C or is higher than 400 C.

Also, the density of the L-Ox which is sintered in the range of 200 C to 400 C is 1.50 to 1.58 g/cm$^3$. The density exceeds 1.60 g/cm$^3$ in case of the sintering temperature over 400 C, and the density could not be measured in case of the sintering temperature less than 200 C.

Also, in the case of the sintering temperature less than 200 C, a combination assumed to be Si—OH was measured in about 3650 cm$^{-1}$ from FTIR spectrum. In the case of the sintering temperature over 400 C, the increase of the density becomes conspicuous.

From the above, it would be found that L-Ox with a low dielectric constant characteristic can be stably obtained through the sintering process in the temperature range of 200 C to 400 C when an insulating film containing the L-Ox is formed.

Figure 21:
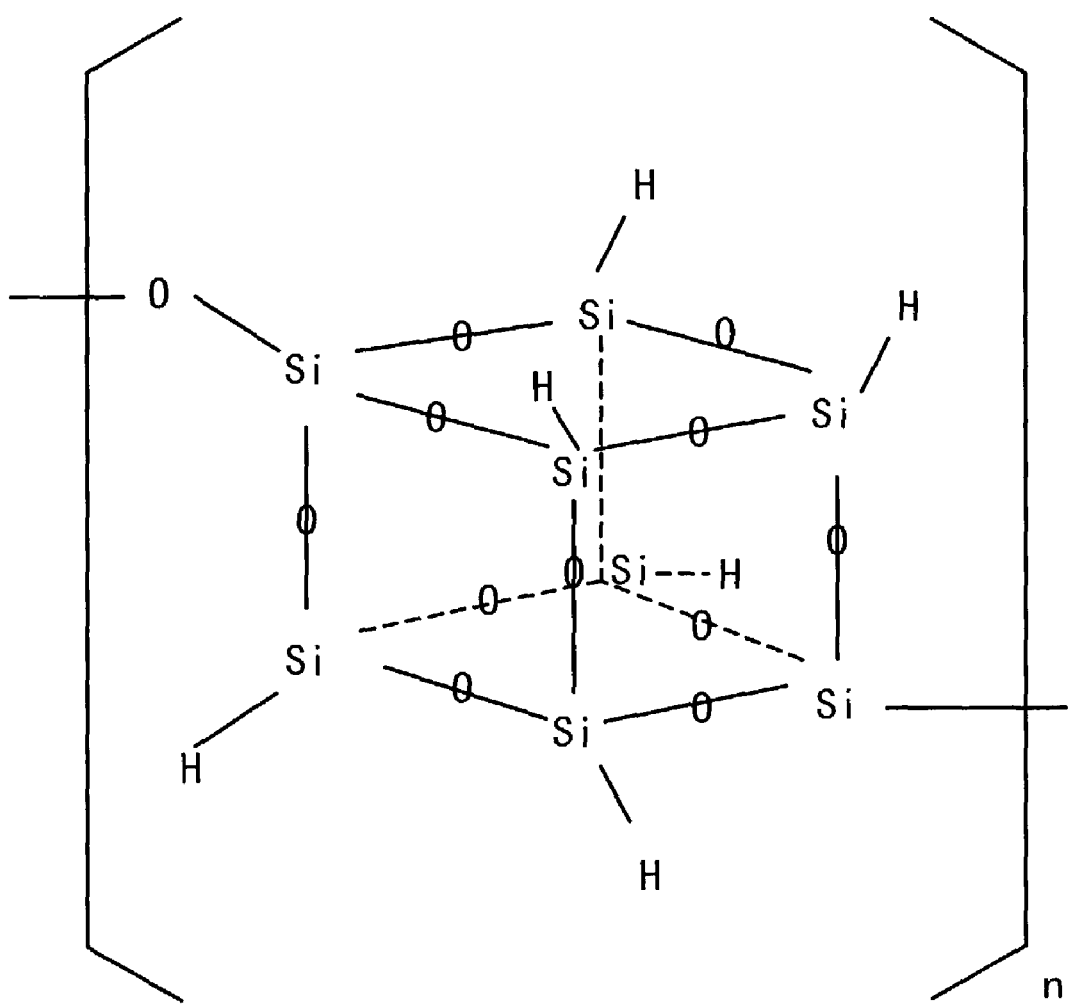
FIG. 21 is a diagram showing the molecule skeleton of HSQ.

FIG. 21 shows the molecule skeleton of HSQ (Hydrogen Silsesquioxane) with the hydrogen Silsesquioxane structure and 3-dimentional structure which are conventionally known (Semiconductor Technology Outlook, 1998, pp. 431–435).

The materials of the two structures are different from each other in the film stability in the manufacture process and the L-Ox is conspicuously excellent. This could be considered that the decreasing amount of Si—H is less in the L-Ox, compared with HSQ. Also, it could be considered as one of the causes that that the state of the combination of hydrogen atom in the insulating film is different. That is, in HSQ, a hydrogen atom is combined in the corner of the solid structure, whereas in L-Ox a hydrogen atom is combined with the side of the ladder structure. Therefore, it could be considered that the density of the neighborhood of the hydrogen atom is lower and the hydrogen combination in HSQ becomes the structure which is wealthy in the reactivity than L-Ox about HSQ. The difference in the film stability between HSQ and L-Ox will be described later with reference to the embodiments.

In the description below, it should be noted that, the ladder-type siloxane hydride shown in FIG. 21 is appropriately described as L-Ox.

In the present invention, various films can be used as the diffusion prevention film. However, it is desirable that for example, sic, SiCN, SiOC, or siON are used. By using the material of such a low dielectric constant, the capacity between the wiring lines can be reduced.

Also, when SiCN is used for the diffusion prevention film, the advantage is achieved that the manufacture reliability is improved when a siliciding process of the wiring line is carried out. When siliciding process is carried out, the formed silicide layers are different between when SiCN is used for the diffusion prevention film and when SiN is used. FIGS. 27A and 27B shows examples of a sequence of gas and RF power. In case of the SiN, the flowed gas is SiH4, NH3, or N2. On the other hand, in case of the SiCN, the flowed gas is trimethylsilane (hereinafter, are 3MS), $SiH_4$, $NH_3$, and $N_2$. First, in the formation of a SiN film, $N_2$ is flowed without the application of RF power, and the oxidation protection film (e.g., BTA) in the wiring line surface is desorbed with heater heat. Subsequently, $SiH_4$ is introduced to form a silicide layer on the Cu surface. Subsequently, $NH_3$ is introduced to form a SiN film. In this case, however, in order to generate plasma stably before RF power is applied, the mark is possible, it is necessary that $SiH_4$ and $NH_3$ are introduced at the same time and the gases are stabilized. At this time, $SiH_4$ resolves on the Cu wiring line surface and a silicide layer becomes thicker excessively so that the deviation of the wiring line layer resistance becomes large. On the other hand, in case of the SICN, $N_2$ is first flowed without the application of RF power, like SiN, and the oxidation protection film (e.g., BTA) on the wiring line surface is desorbed with the heater heat. Subsequently, $SiH_4$ is introduced and a silicide layer is formed on the Cu surface. Next, the $SiH_4$ gas is stopped and 3MS and NH3 gas are introduced and then the step of the gas stabilization is started. In this case, because 3MS is not resolved on the Cu surface, the unnecessary silicide layer is not formed unlike the case of the SiN and it is possible to suppress the deviation of the wiring line layer resistance.

Next, the semiconductor device with a copper containing wiring line structure according to the first embodiment of the present invention will be described.

Figure 1A:
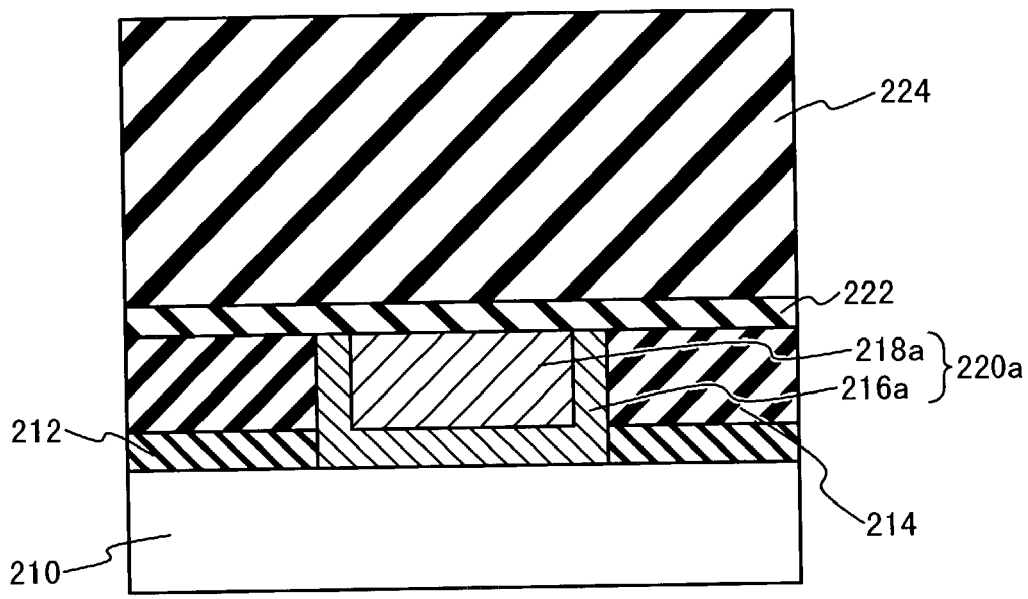
FIGS. 1A to 1E are cross sectional views showing a wiring line and a connection plug formed by a dual damascene method.
Figure 1B:
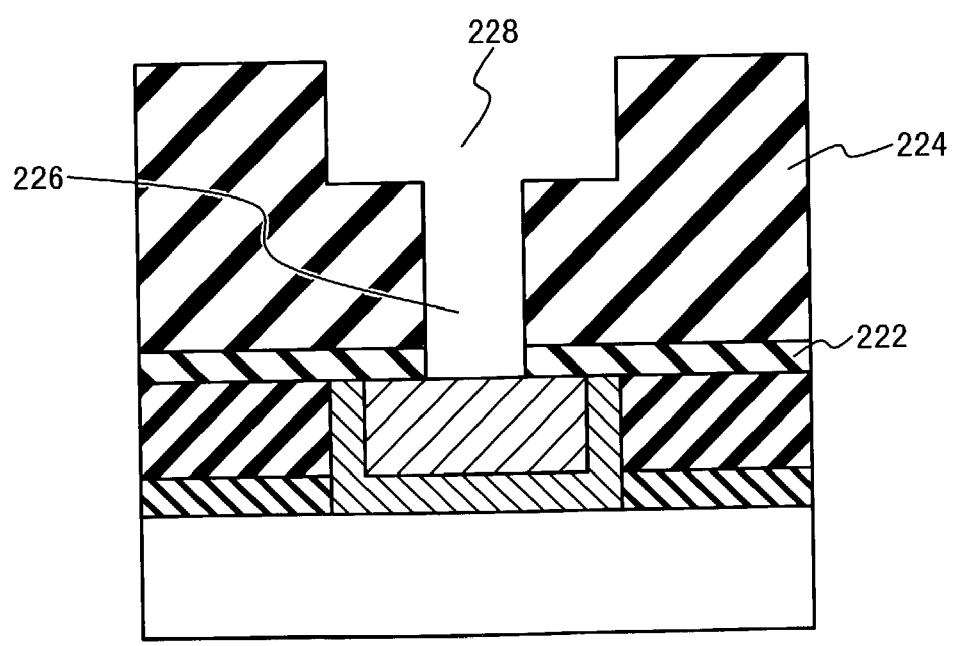
Figure 1C:
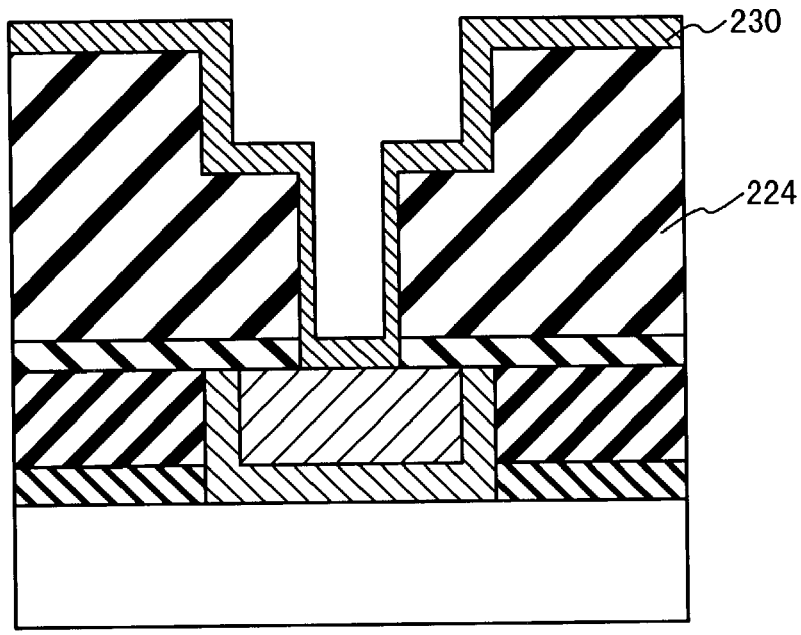
Figure 1D:
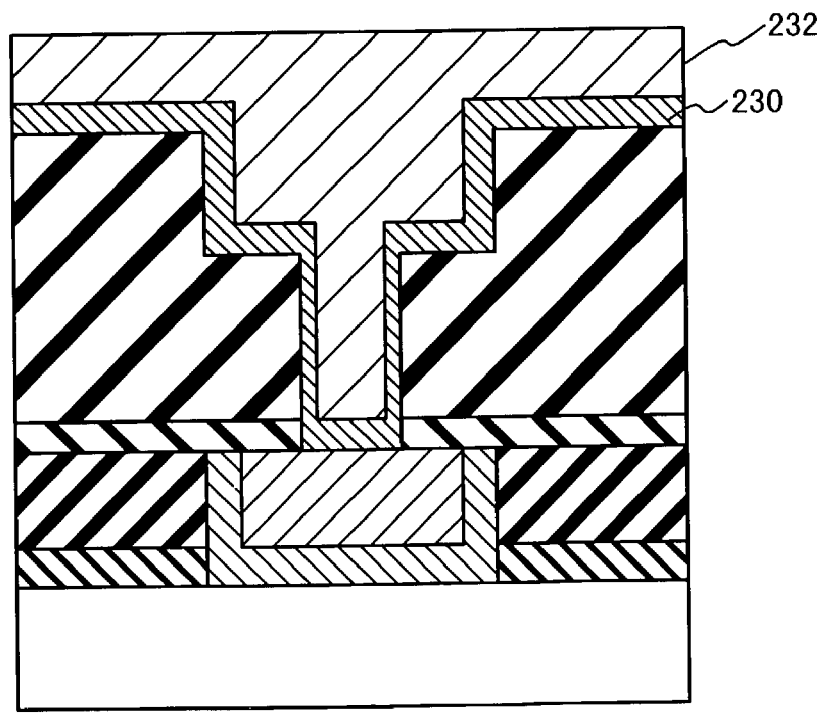
Figure 1E:
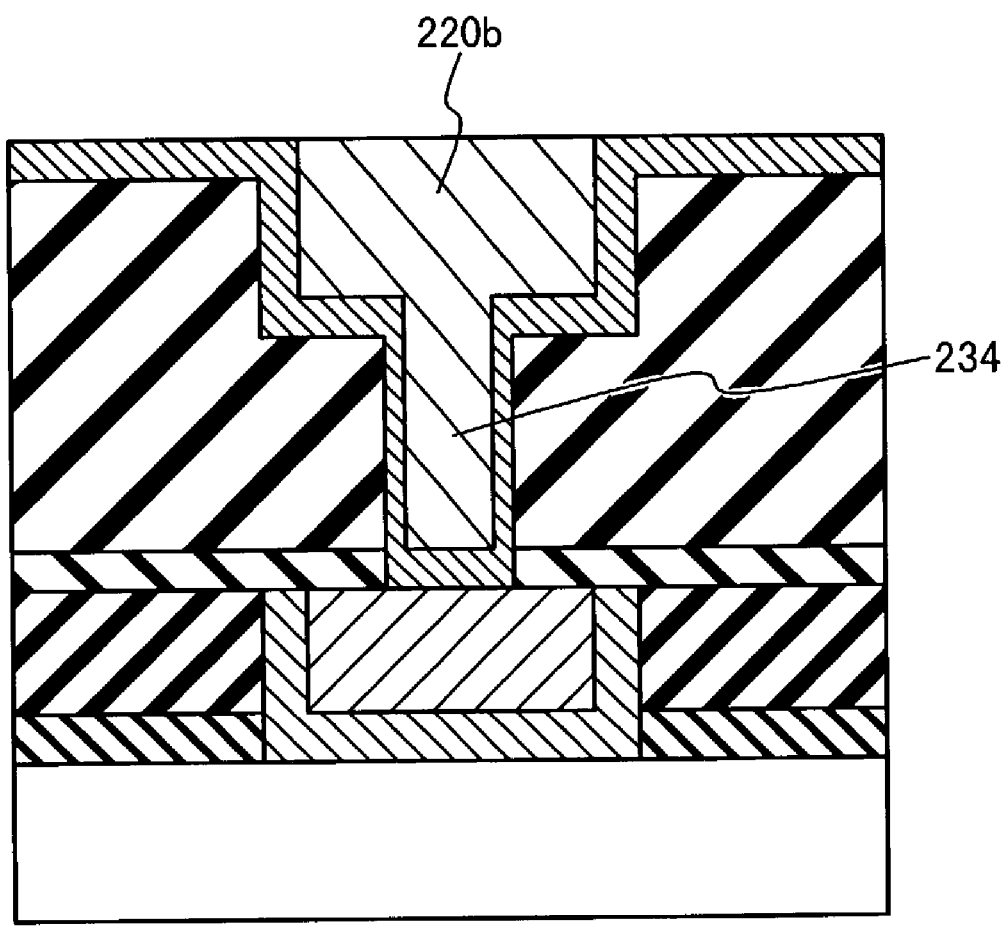
Figure 2:
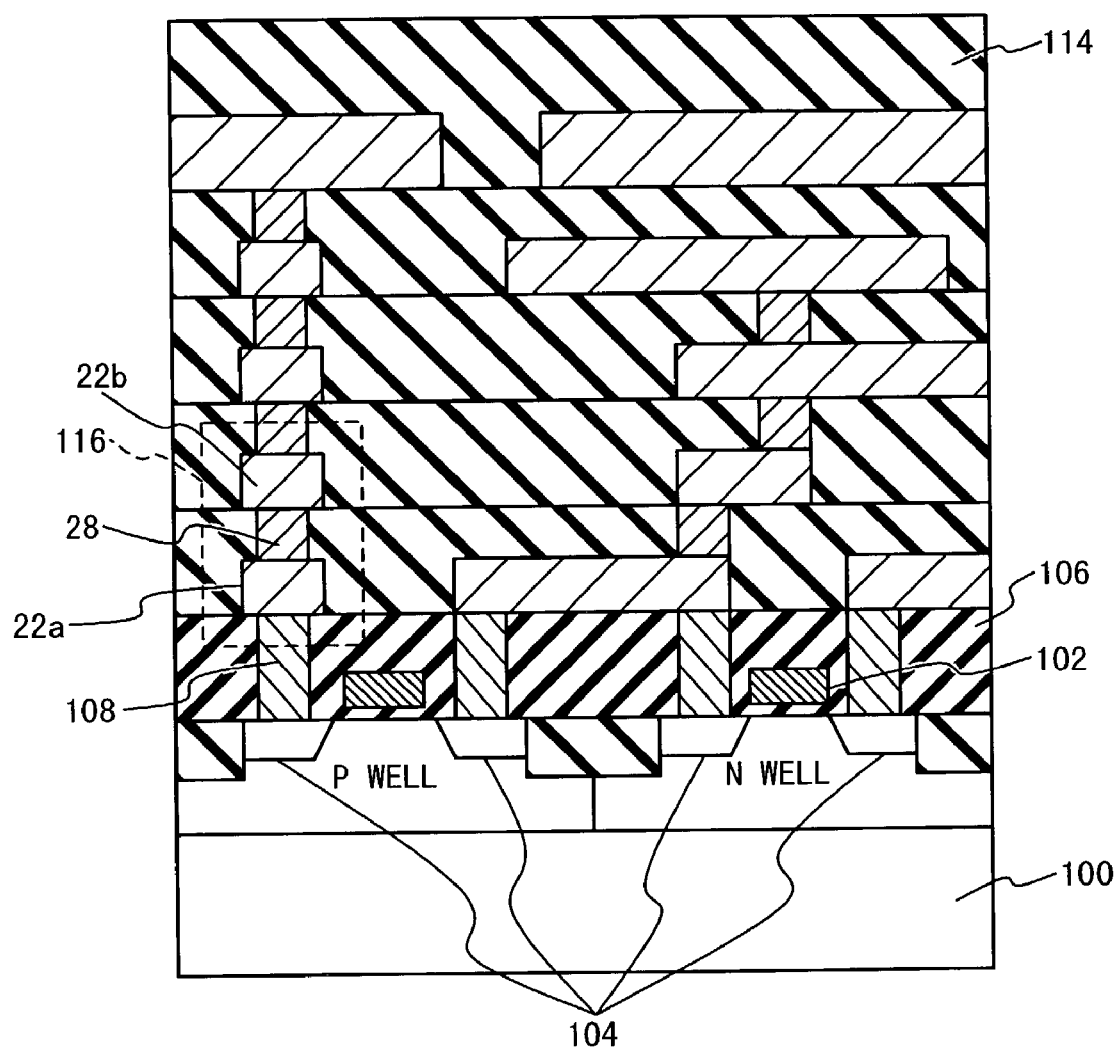
FIG. 2 is a cross sectional view showing a semiconductor device in which copper containing metal wiring lines are stacked, according to the present invention.

FIG. 2 is a cross sectional view showing an example of the semiconductor device according to the present invention. A MOS transistor is formed to have a gate electrode 102, diffusion layers 104 on a silicon substrate 100. An insulating film 106 is formed to cover the MOS transistor. The copper connection plug s108 are formed in the insulating film 106 to connect with the diffusion layers 104 and a first copper wiring line 22*a*, a connection plug 28 and a second copper wiring line 22*b* are formed in order on the surface portion. A copper wiring line layer is formed to have the same or similar structure on the surface portion of the layer containing the copper wiring line, and a passivation film 114 is provided for the uppermost layer. It should be noted that the first copper wiring line 22*a* is electrically connected with the device formed on the silicon substrate 100. Also, a set of the first copper wiring line 22*a*, the connection plug 28 and the second copper wiring line 22*b* to be described below may be provided for whichever layer of the semiconductor device shown in FIG. 2.

The embodiments of the present invention will be described with reference to a wiring line structure surrounded by the dotted line section 116 of FIG. 2 as an example.

(Embodiment 1)

Figure 3:
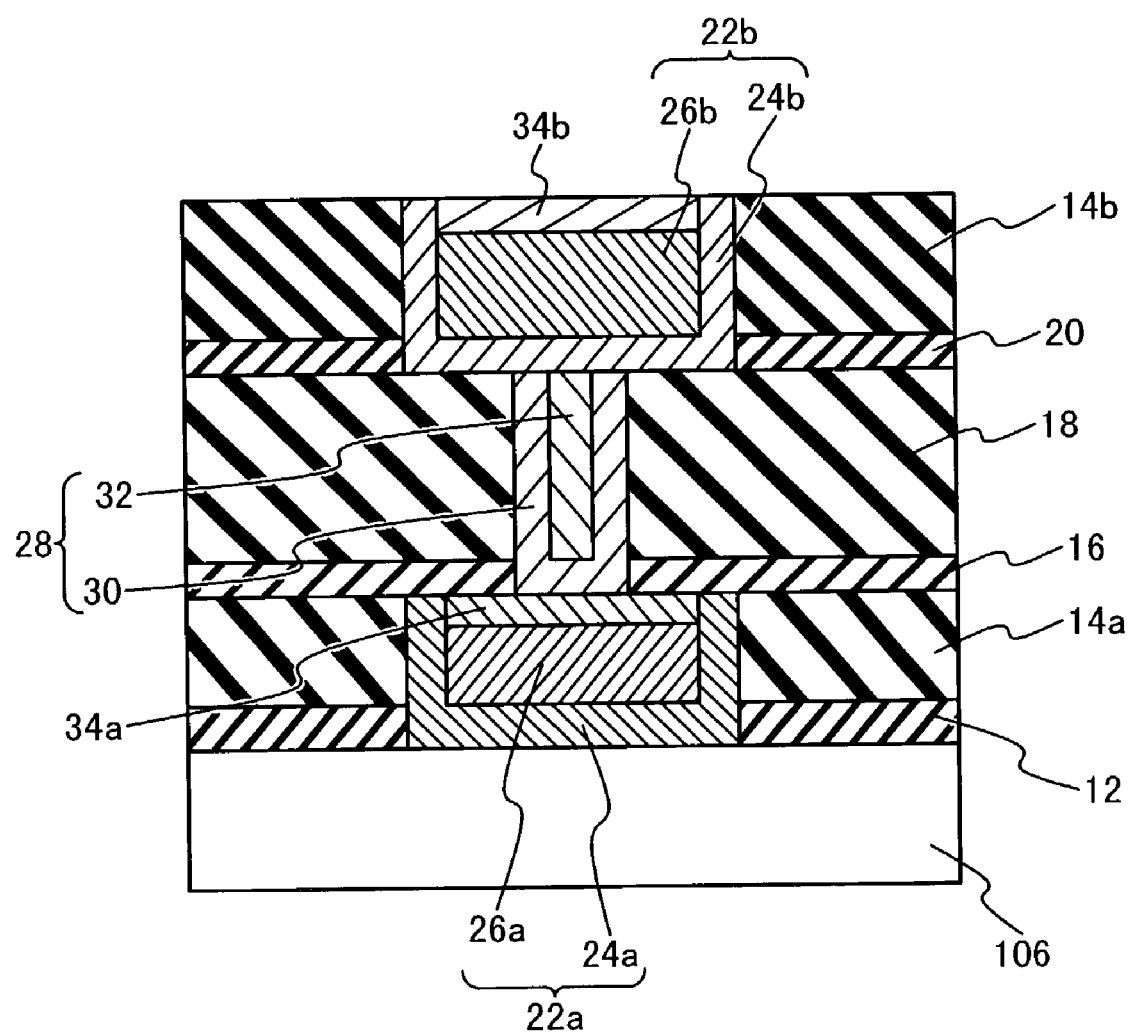
FIG. 3 is a cross sectional view showing a wiring line structure in a first embodiment of the present invention.

FIG. 3 is a cross sectional view showing the wiring line structure in the first embodiment of the present invention. A first laminate layer 14*a* in which a first SiCN film 12, L-Ox film and a $SiO_2$ film are laminated in this order, and a second laminate layer 14*b* in which a second SiCN film 16, a silicon oxide film 18, a third SiCN film 20 and a L-Ox film and a $SiO_2$ film are laminated are laminated on an insulating film 106 on the silicon substrate (not shown). In the first laminate layer 14*a* and the second laminate layer 14*b*, the first copper wiring line 22*a* and the second copper wiring line 22*b* are formed, respectively.

The first copper wiring line 22*a* are formed of a tantalum-based barrier metal film 24*a* and a copper film 26*a*. In the silicon oxide film 18, a connection plug 28 is formed to connect with the surface of the first copper wiring line 22*a*. The connection plug 28 is formed of a tantalum-based barrier metal film 30 and a copper film 32. In the second laminate layer 14*b*, the second copper wiring line 22*b* is formed to connect with the surface of the connection hole. The second copper wiring line 22*b* is formed of a tantalum-based barrier metal film 24*b* and the copper film 26*b*. Also, a first Cu silicide layer 34*a* is formed on the surface of the first copper wiring line 22*a*, and the second Cu silicide layer 34*b* is formed on the surface of the second copper wiring line 22*b*, respectively.

Hereinafter, the manufacturing method of the wiring line structure 1 of the first embodiment shown in FIG. 3 will be described with reference to FIGS. 4A to 4N.

Figure 4A:
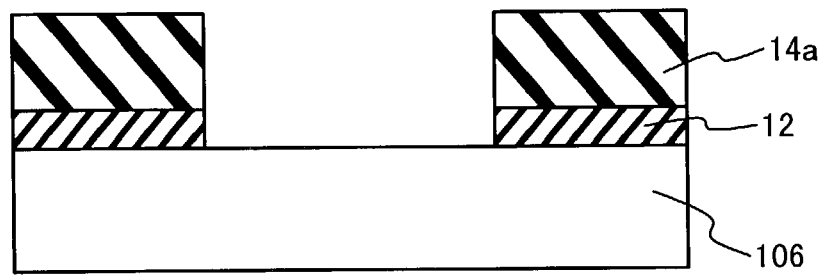
FIGS. 4A to 4N are cross sectional views showing the wiring line structure formed by a method of forming the wiring line structure according to the first embodiment of the present invention.

FIG. 4A shows the structure in which a wiring line groove is formed in first SiCN film 12 and the first laminate layer 14*a*. This structure is formed by etching the first SiCN film 12 and the first laminate layer 14*a* step-by-step after the first SiCN film 12 and the first laminate layer 14*a* are formed and then a resist film (not shown) is patterned into a predetermined shape.

Figure 4B:
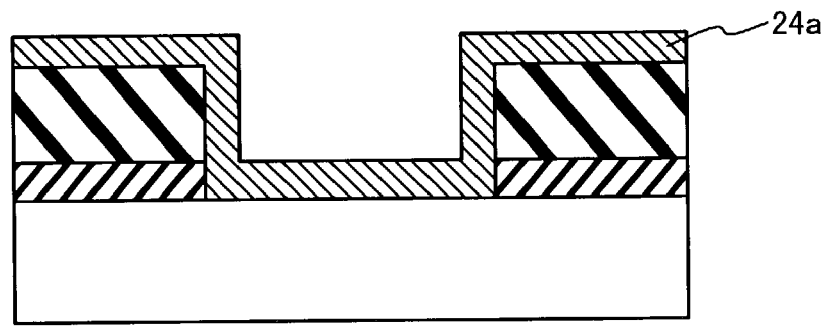

Next, the tantalum-based barrier metal film 24*a* is formed in which Ta and TaN are deposited on the substrate surface (the film thickness of about 20 nm for Ta, and the film thickness of about 10 nm for TaN) by a sputtering method and a reactivity sputtering method (FIG. 4B).

Figure 4C:
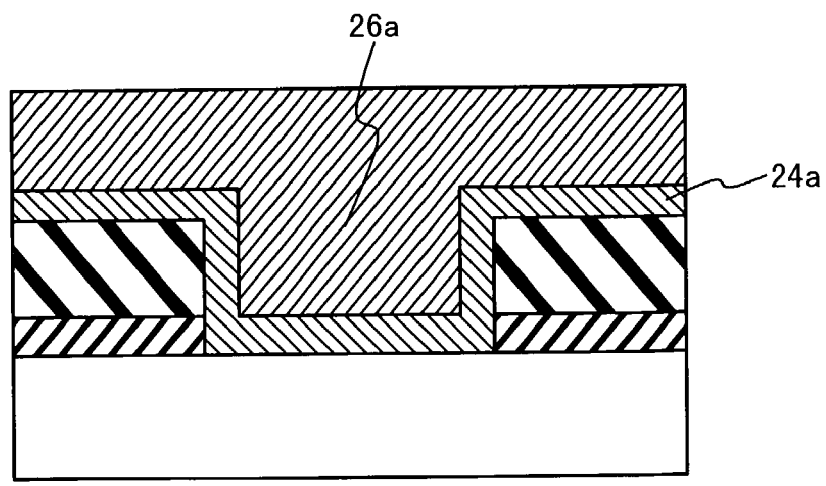

Subsequently, as shown in FIG. 4C, the copper film 26*a* is formed on the tantalum-based barrier metal film 24*a*. The copper film 26*a* is formed as follows by a plating method. First, a seed copper film of copper is deposited by the sputtering method for growth of a copper plating film. Next, the substrate is immersed in copper sulfate solution with the liquid temperature of about 25 C so that the copper film 26*a* is formed by an electrolysis plating method (the film thickness of about 600 nm in a flat section).

Next, an annealing process is carried out to the substrate thus obtained, for about 30 minutes at 350 C. Through the annealing process at such a high temperature, the particle diameter of a grain in the copper film 26*a* becomes large, compared with the particle diameter before the annealing process. Thus, a portion where a plurality of boundaries of the grains exposed in the surface of the copper film 26*a* overlap decreases relatively. Therefore, it becomes difficult for the cavity to be produced. Also, the resistance value of the first copper wiring line 22*a* after such an annealing process decreases the resistance value thereof before the annealing process. For example, the annealing process may be carried out in a temperature range of 200 C to 500 C.

Figure 4D:
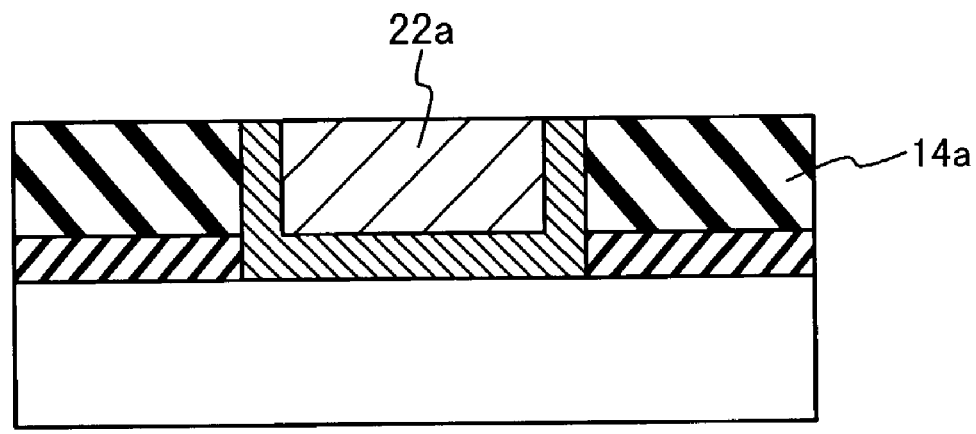

Next, the unnecessary copper film 26*a* and the tantalum-based barrier metal film 24*a* which are formed outside the wiring line groove are removed by a chemical mechanical polish (CMP) method. The copper film 26*a* and so on are left inside the wiring line groove. Thus, the first copper wiring line 22*a* is formed (FIG. 4D).

The anti-corrosion process is carried out in which the surface of the copper film 26*a* is processed by BTA as an anti-corrosion agent immediately after the CMP process to the copper film 26*a*. Here, 0.05% BTA solution is used. By this, the surface of the copper film 26*a* is protected by BTA when a sample is transferred for the following process after the CMP process. Therefore, the copper film 26*a* can be prevented from being oxidized.

Figure 4E:
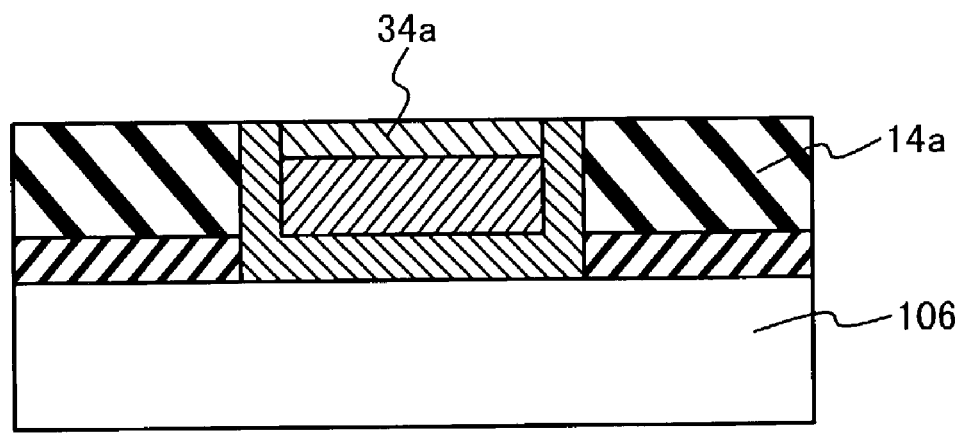

Next, as shown in FIG. 4E, the first Cu silicide layer 34*a* is formed on the surface of the copper film 26*a* of the first copper wiring line 22*a*. The method of forming the first Cu silicide layer 34*a* will be described below.

After BTA is removed through evaporation by an ammonia plasma process (for 30 seconds at 350 C), $SiH_4$ is flowed for about 60 seconds (the flow rate of $SiH_4$ is 5000 sccm, while the flow rate of $N_2$ is 50 sccm) under the pressure of 3 torr at the temperature of 350 C. Thus, the surface of the copper film 26*a* is silicided. The first Cu silicide layer 34*a* with the thickness of about 10 nm is formed. By the fluorescence X ray analysis, the existence of CuSix is confirmed.

Figure 4F:
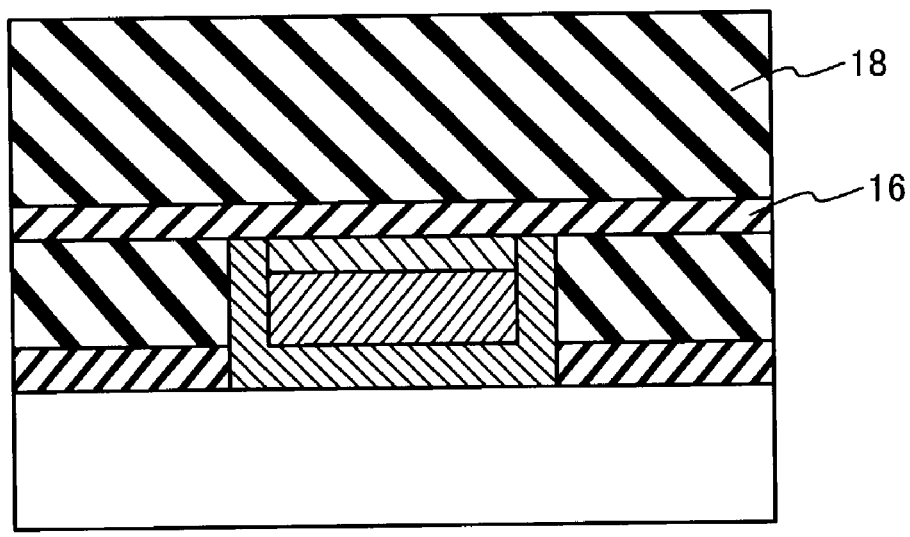

Next, the second SiCN film 16 (the film thickness of about 70 nm), the silicon oxide film 18 (the film thickness of about 350 nm) are formed (FIG. 4F).

Figure 4G:
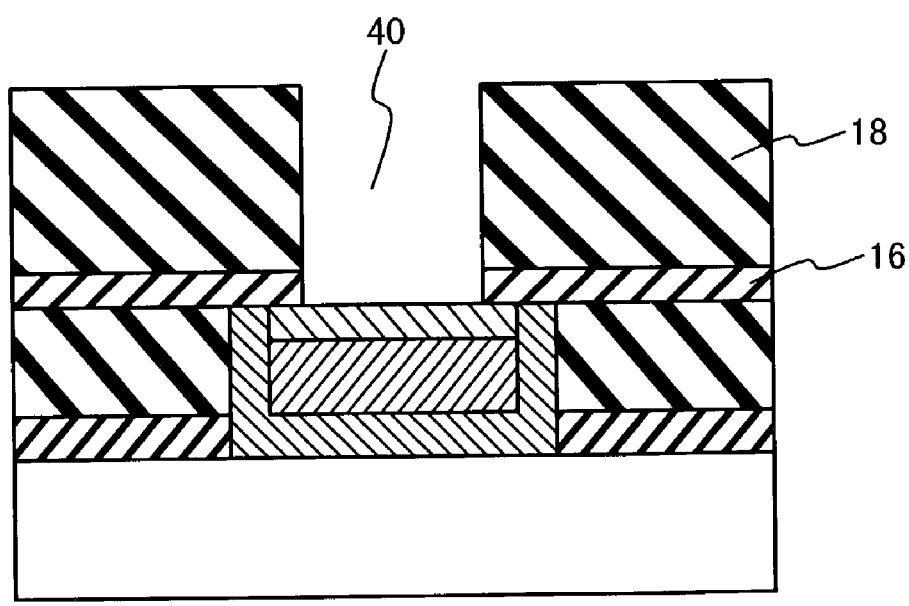

Next, the silicon oxide film 18 is etched using a lithography method until the second SiCN film 16 is exposed. Subsequently, the etching gas is replaced and the second SiCN film 16 is etched until the surface of the first Cu silicide layer 34*a* is exposed. Thus, as shown in FIG. 4G, the connection hole 40 is formed.

Figure 4H:
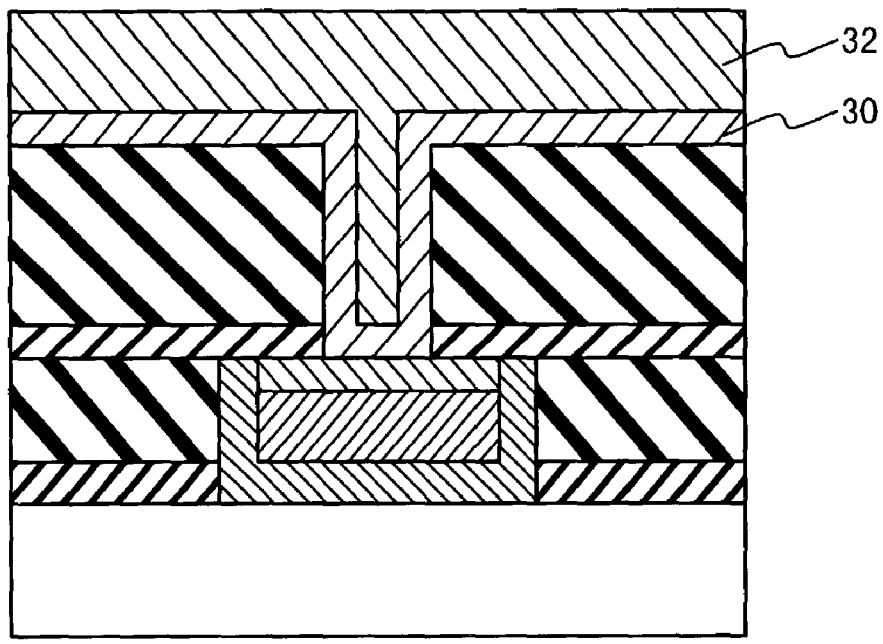
Figure 4I:
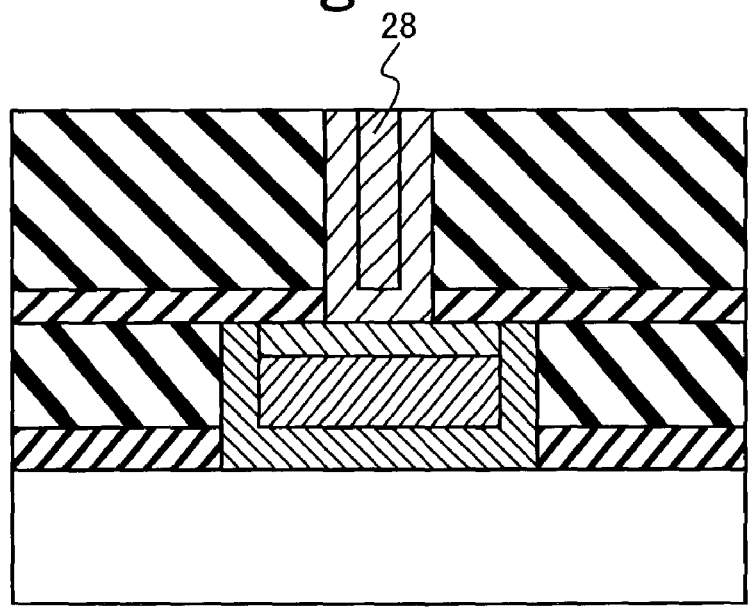

Next, in order to fill the inside of the connection hole 40, the tantalum-based barrier metal film 30 and the copper film 32 (the thickness of about 650 nm in the flat section) are formed in this order (FIG. 4H). The copper film 32 is formed by the plating method like the copper film 26a of the first copper wiring line 22a. Subsequently, a flattening process by the CMP is carried out and the connection plug 28 is formed (FIG. 4I).

Figure 4J:
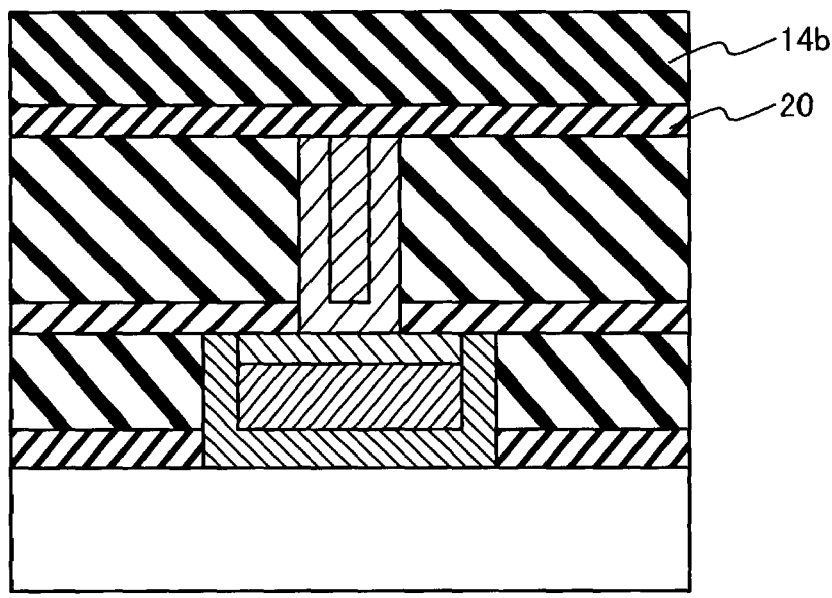
Figure 4K:
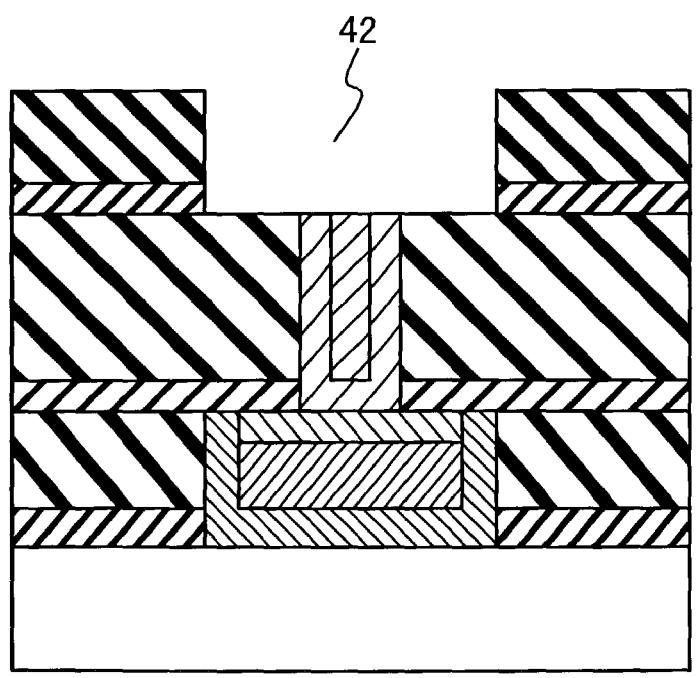
Figure 4L:
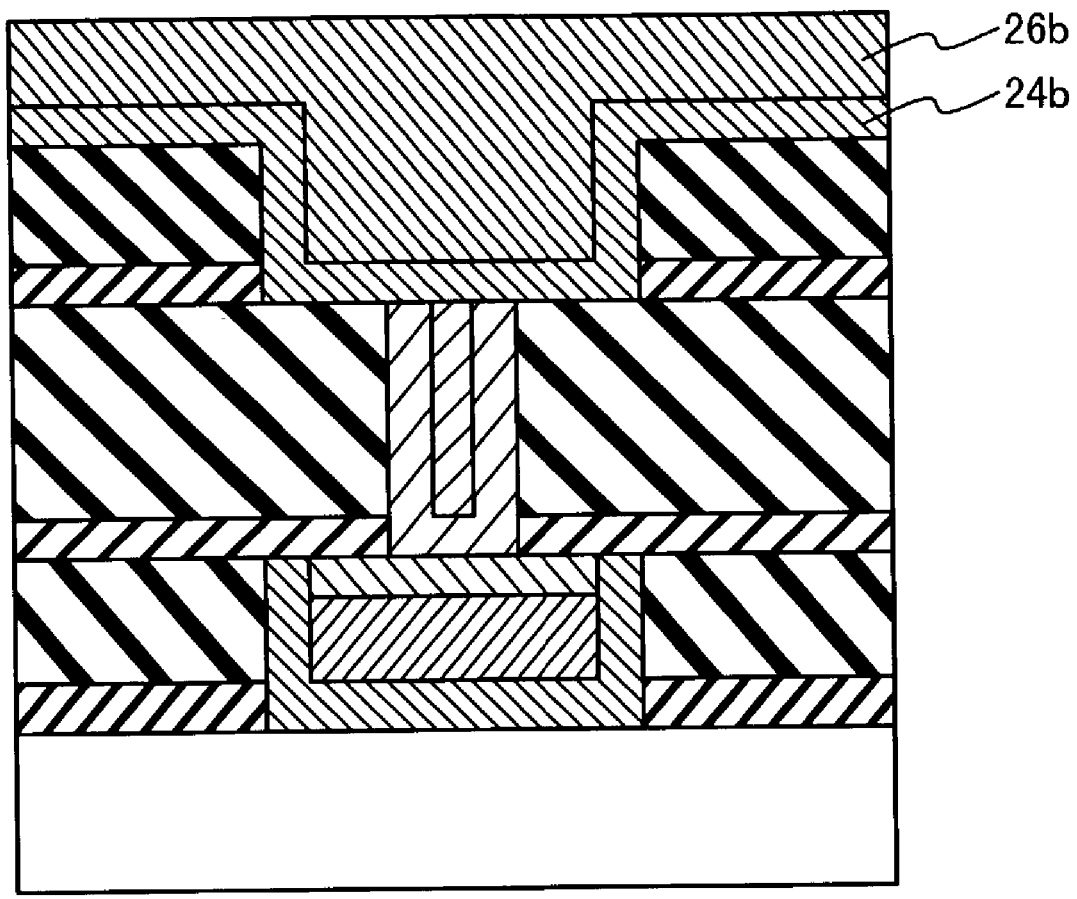
Figure 4M:
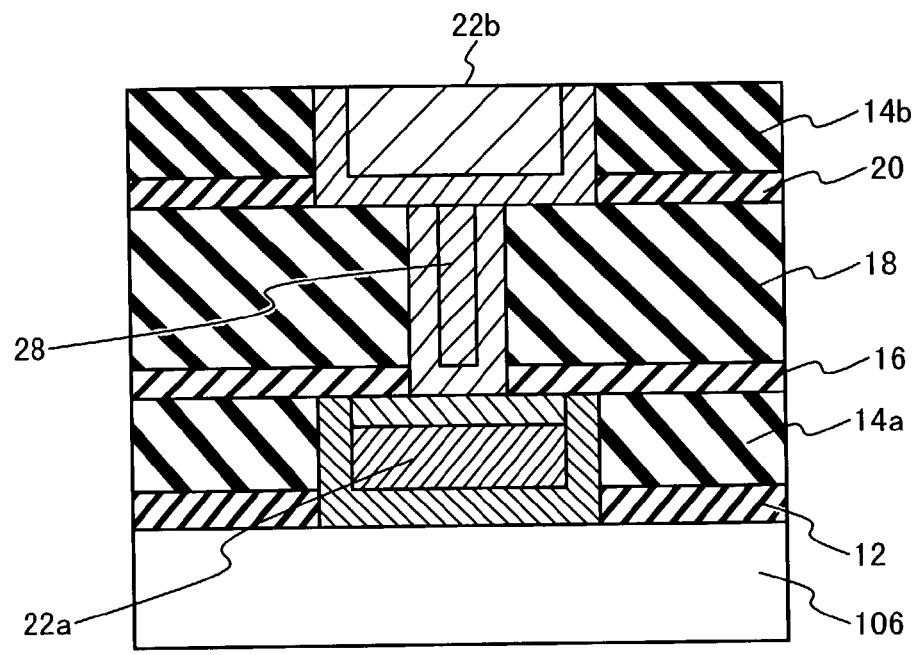
Figure 4N:
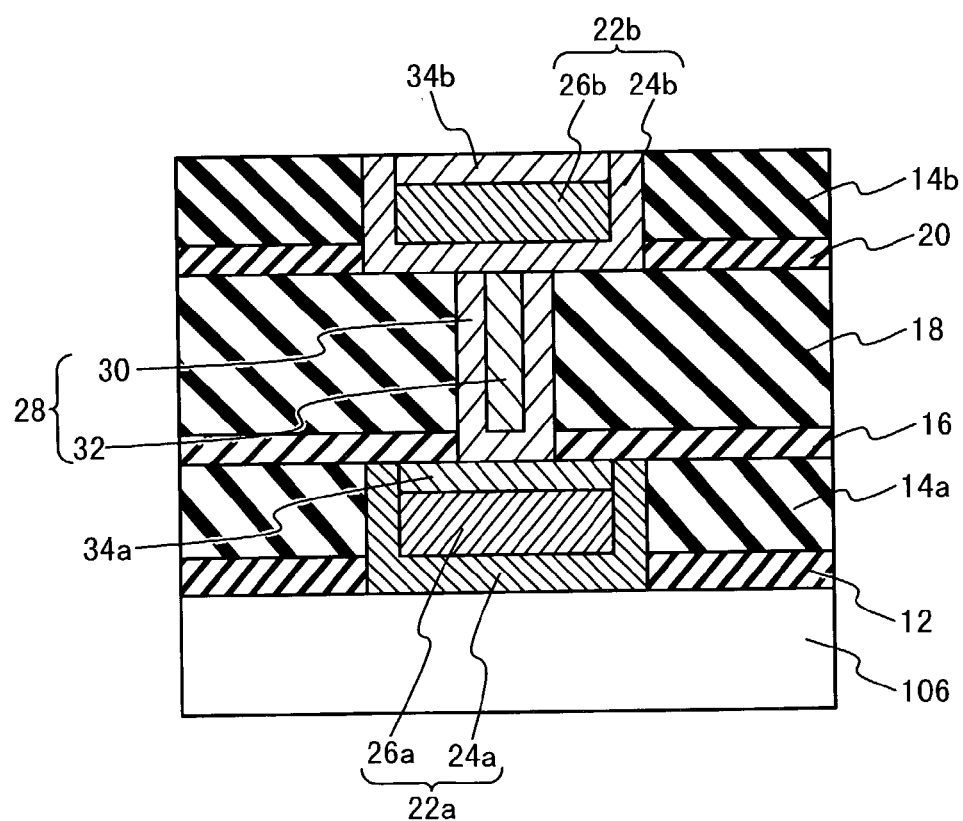

Next, the third SiCN film 20 (the film thickness of about 70 nm) and the second laminate layer 14b (the film thickness of about 300 nm) are formed on a surface portion of the connection plug 28 (FIG. 4J). Then, the wiring line groove 42 is formed by a dry etching (FIG. 4K). Subsequently, the tantalum-based barrier metal film 24b and the copper film 26b are formed in this order (the film thickness of about 600 nm in the flat section) in order to fill the groove 42 (FIG. 4L). The copper film 26b is formed with the plating method like the copper film 26a of the first copper wiring line 22a. Subsequently, the flattening process by the CMP process is carried out and the second copper wiring line 22b is formed (FIG. 4M). Subsequently, the anti-corrosion process to the copper film 26b by BTA is carried out. After BTA is removed in the evaporation by the ammonia plasma process, a siliciding process is carried out and the second Cu silicide layer 34b is formed (FIG. 4N).

As mentioned above, the wiring line structure is formed as shown in FIG. 3. By repeating the above-mentioned processes, it is possible to manufacture the semiconductor device with the multiple wiring line structure of 3 or more layers, as shown in FIG. 2.

(Embodiment 2)

The second embodiment is different from the first embodiment in that BTA is evaporated and removed through a heating process at about 350 C instead of the ammonia plasma process, before the siliciding process of the surface of the copper film 26a and the surface of the copper film 26b. Through the heating process, the wiring line structure shown in FIG. 3 is formed. It should be noted that the heating temperature at which BTA is evaporated and removed may be from 150 C to 450 C. By the fluorescence X ray analysis of the formed wiring line structure, the existence of CuSix is confirmed.

By carrying out the ammonia plasma process for the evaporation and removal of the BTA as in the first embodiment, the siliciding process can be carried out while BTA is removed. Therefore, it is possible to control the siliciding process such as a film thickness control of the Cu silicide. Also, by carrying out the heating process for the evaporation and removal of the BTA as in the second embodiment, the corrosion of the boundaries of the grains in the surface of the copper film 26a or the surface of the copper film 26b by gas such as ammonia can be prevented. Therefore, the good wiring line structure can be formed.

(Embodiment 3)

Figure 5:
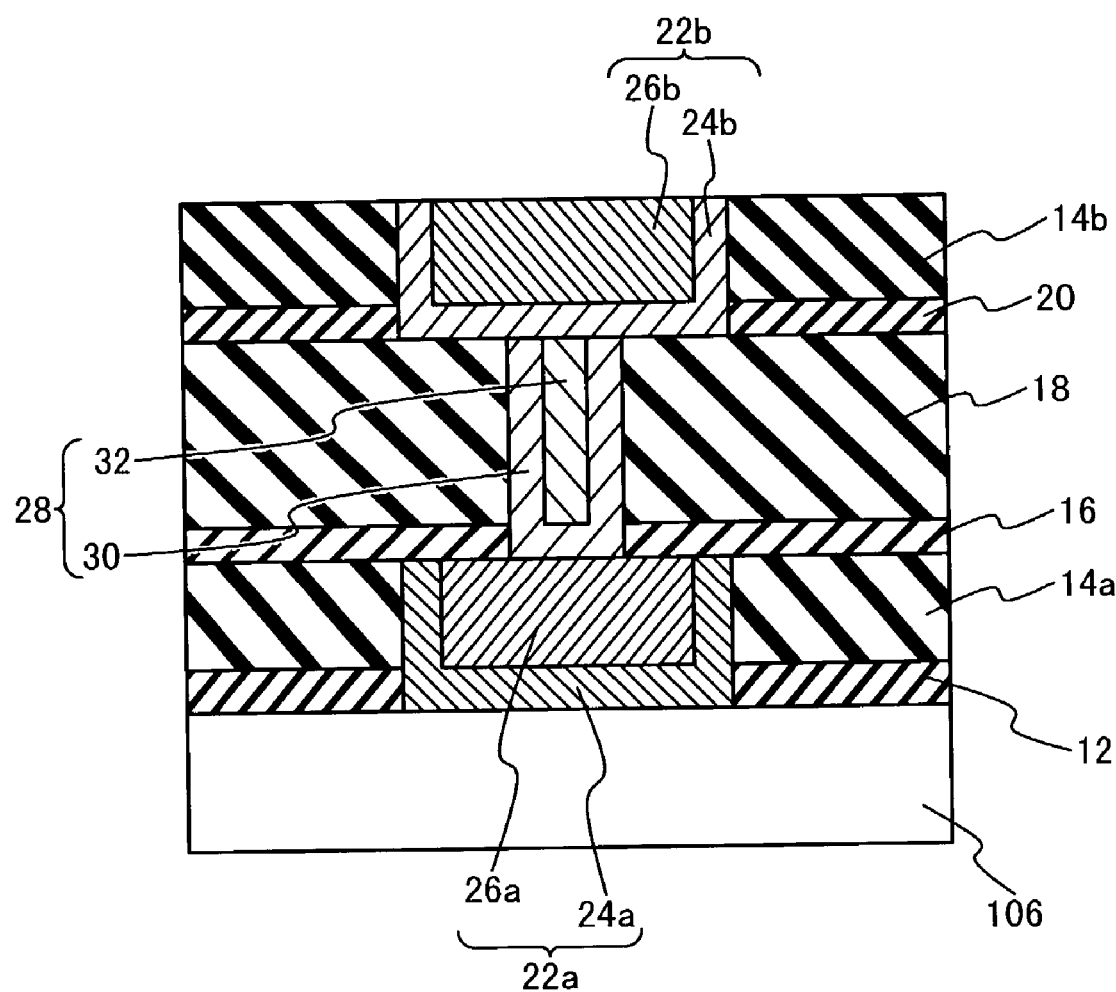
FIG. 5 is a cross sectional view showing the wiring line structure in a third embodiment of the present invention.

FIG. 5 is a diagram showing the wiring line structure in the third embodiment. The third embodiment is different from the first embodiment in that the first Cu silicide layer 34a and the second Cu silicide layer 34b are not formed, and that the BTA anti-corrosion processing is not carried out. The description of the same components of FIG. 5 as those of FIG. 3 will be omitted by allocating the same reference numerals.

In the third embodiment, the processes are carried out as in the first embodiment until the CMP process to the copper film 26a of the first copper wiring line 22a process. Subsequently, the second SiCN film 16 and the silicon oxide film 18 are formed without carrying out the siliciding process of the surface of the copper film 26a. Before the second SiCN film 16 is formed, a surface treat process of the copper film 26a of the first copper wiring line 22a is carried out by the ammonia plasma process. The process after the silicon oxide film 18 is formed is also the same as the first embodiment. The wiring line structure shown in FIG. 5 is formed through the above processes.

(Embodiment 4)

The fourth embodiment is different from the third embodiment in that BTA anti-corrosion processing is carried out immediately after the CMP process to the surface of the copper film 26a or the surface of the copper film 26. Subsequently, before forming of second SiCN film 16, a surface treating of the copper film 26a of the first copper wiring line 22a is carried out by the ammonia plasma process. The wiring line structure similar to that shown in FIG. 5 is formed through this process. In this way, the surfaces of the copper films 26a and 26b can be protected by the BTA anti-corrosion process immediately after the CMP process. Therefore, the reliability of the semiconductor device containing such a copper wiring line can be increased through the anti-corrosion operation to on the copper film surfaces.

(Embodiment 5)

FIGS. 6A to 6F are cross sectional views showing the wiring line structure manufacturing process in the fifth embodiment. The fifth embodiment is different from the first embodiment in that the connection plug 28 and the second copper wiring line 22b are formed by the dual damascene method. The same components of FIGS. 6A to 6F as those of FIG. 3 are allocated the same reference numerals, and the description will be omitted.

Figure 6A:
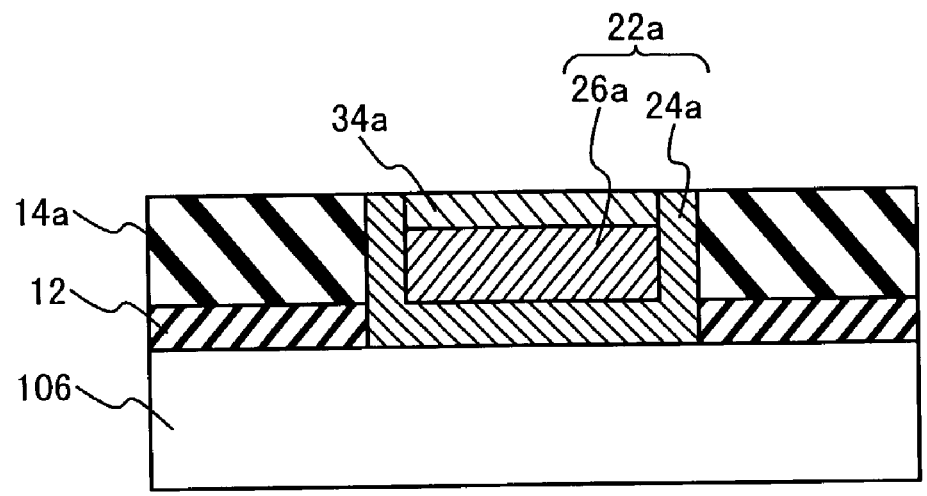
FIGS. 6A to 6F are cross sectional views showing the wiring line structure formed by a method of forming the wiring line structure according to a fifth embodiment of the present invention.

First, the first copper wiring line 22a is formed as in the first embodiment described with reference to FIGS. 4A to 4N. Then, the first Cu silicide layer 34a is formed on the surface of the copper film 26a (FIG. 6A).

Figure 6B:
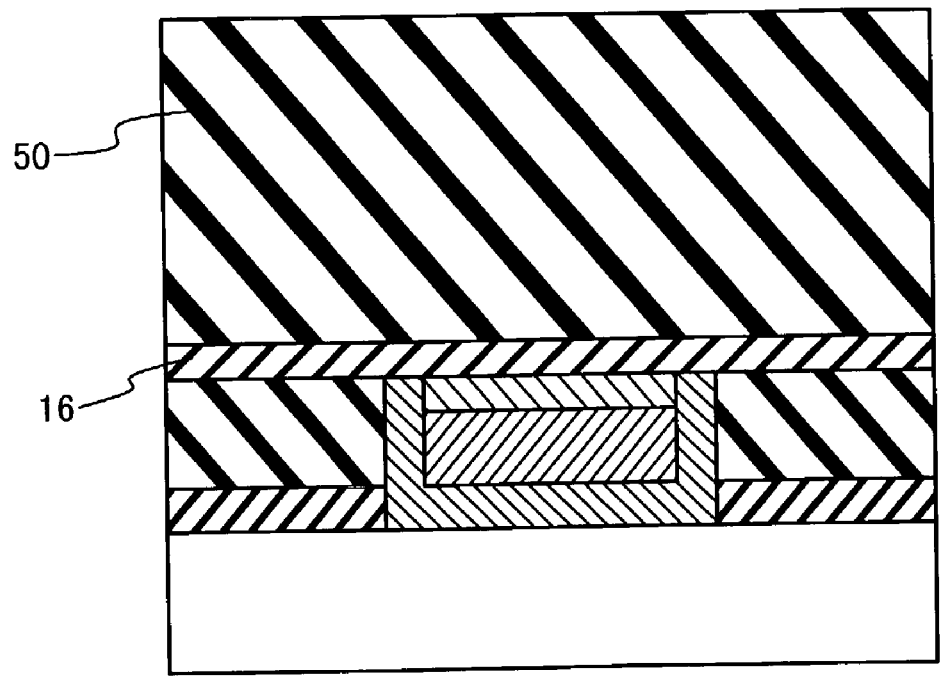

Next, the second SiCN film 16 and the silicon oxide film 50 are formed (FIG. 6B).

Figure 6C:
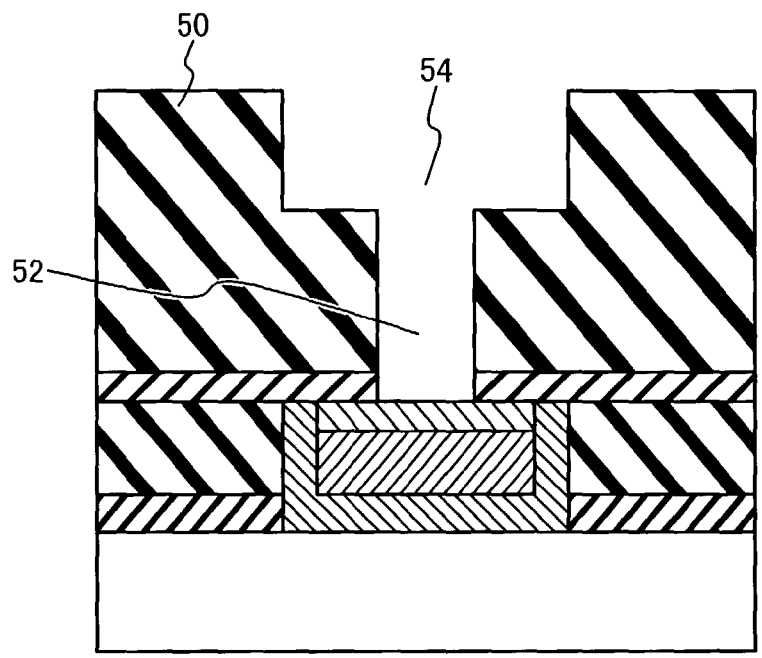
Figure 6D:
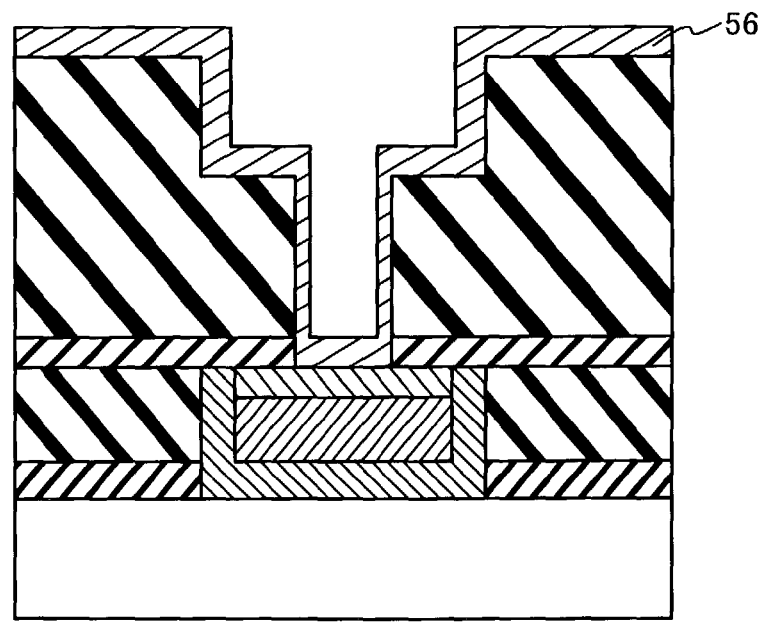

Next, as shown in FIG. 6C, a connection hole 52 for the connection plug 28 and a wiring line groove 54 are formed in the silicon oxide film 50 by a step-by-step etching method using a lithography method. Subsequently, the etching gas is changed and the etching of the second SiCN film 16 is carried out. Subsequently, as shown in FIG. 6D, the tantalum-based barrier metal film 56 is formed on the whole surface of the silicon oxide film 50 containing the connection hole 52 and the wiring line groove 54. The tantalum-based barrier metal film 56 is formed of a Ta film and a TaN film.

Figure 6E:
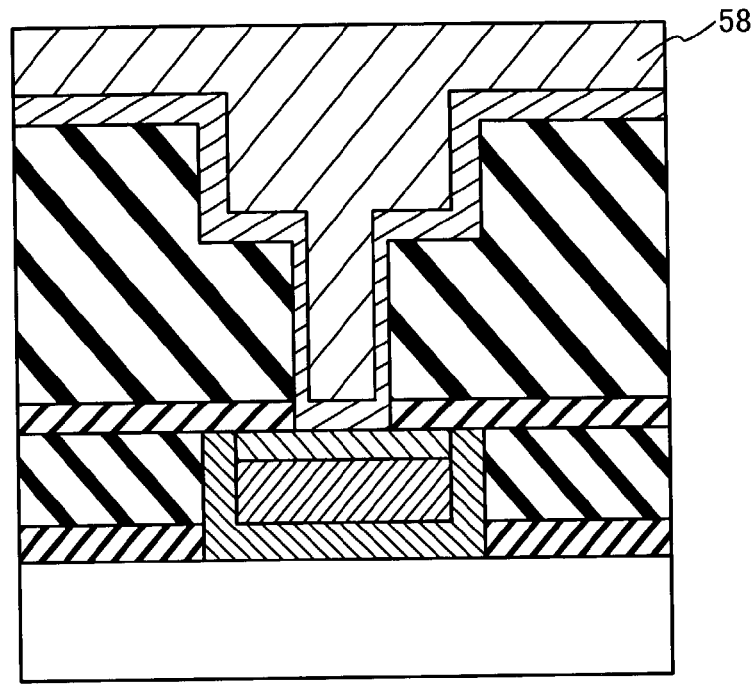
Figure 6F:
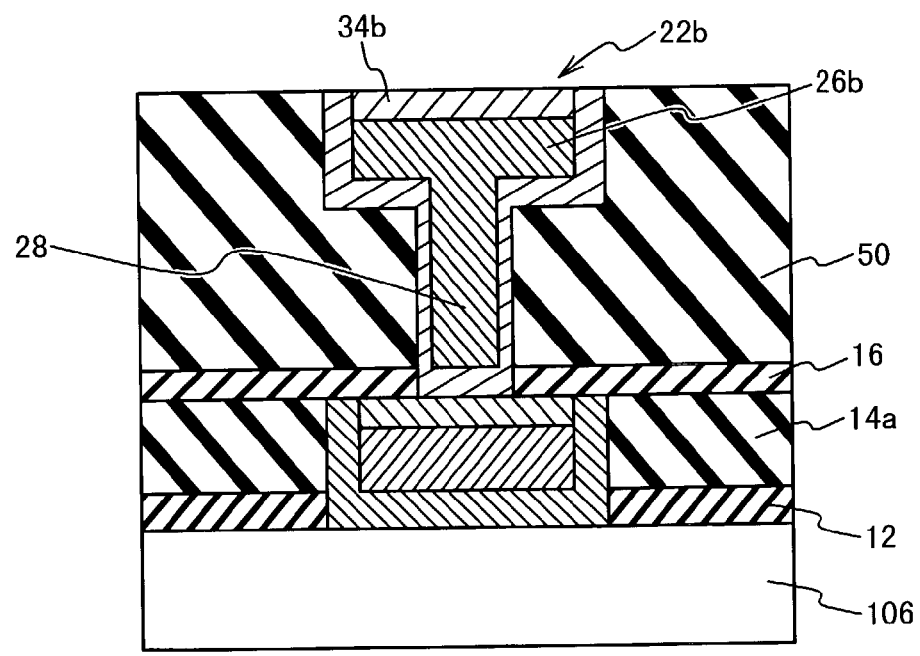

Next, as shown in FIG. 6E, a copper film 58 is formed on the tantalum-based barrier metal film 56 to fill the connection hole 52 and the wiring line groove 54. Subsequently, a CMP flattening process is carried out to remove the copper film 58 and the tantalum-based barrier metal film 56 from a portion other than the wiring line groove 54. Through this process, the connection plug 28 and the second copper wiring line 22b are formed. Subsequently, the BTA anti-corrosion process is carried out. After the BTA is evaporated and removed by the ammonia plasma process, a siliciding process is carried out. Thus, the second Cu silicide layer 34b is formed (FIG. 6F). The wiring line structure in the fifth embodiment is formed by above processes. The existence of CuSix was confirmed by the fluorescence X ray analysis of the formed wiring line structure. Also, the existence of an amorphous region was confirmed in the wiring line structure formed in the first, second and fifth embodiments by the X ray diffraction.

(Embodiment 6)

Figure 7A:
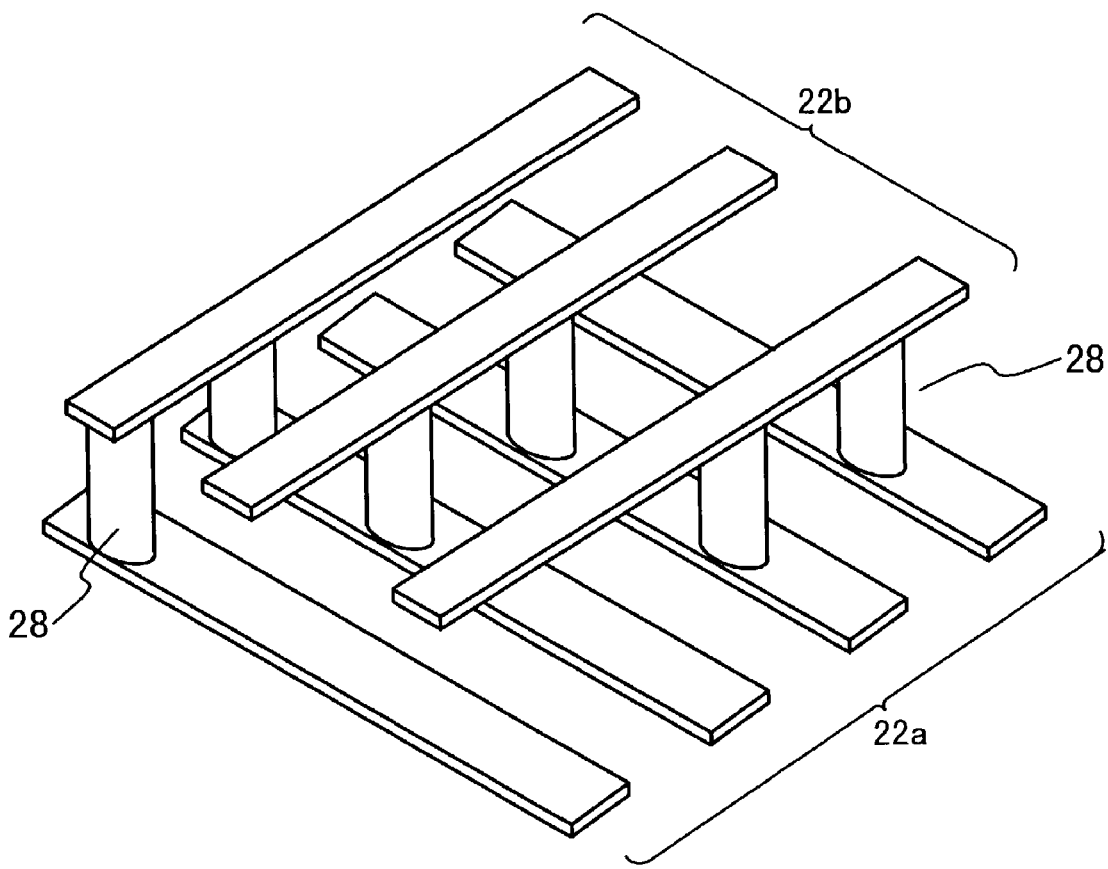
FIG. 7A is a schematic diagram showing a 2-layer wiring line structure used for evaluation of the embodiments.
Figure 7B:
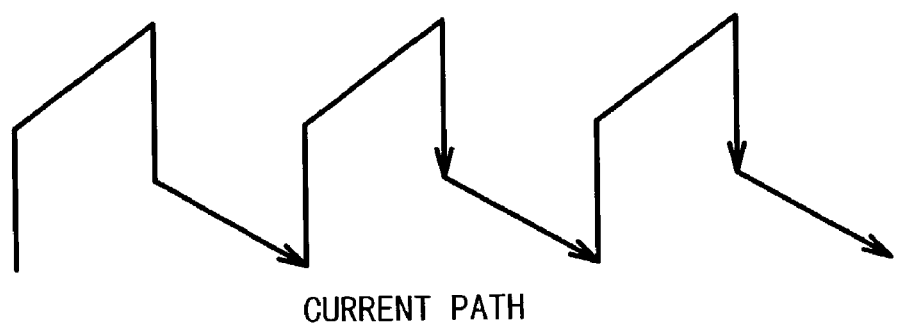
FIG. 7B is a diagram showing a current path in the 2-layer wiring line structure shown in FIG. 7A.

2-layer wiring line structures as shown in FIG. 7A are formed by the methods in the first to fifth embodiments to examine the production yields, respectively. The 2-layer wiring line structure is called a via-chain. The 10,000 first copper wiring lines 22a are provided in parallel and the 10,000 second copper wiring lines 22b are provided in parallel to be orthogonal to the first copper wiring lines. These wiring lines are connected by 20,000 connection plugs 28. In the figure, the semiconductor substrate, an interlayer insulating film and so on are omitted. When a predetermined voltage is applied between the two ends of this via-chain, the current flows in the direction shown in FIG. 7B by the arrows. Thus, the resistance of the 10,000 first copper wiring lines 22a, the 10,000 second copper wiring lines 22b and the 20,000 connection plugs 28 is measured. The 2-layer wiring line structures corresponding to the first to fifth embodiments are called the wiring line structures 1 to 5, respectively. The existence of CuSix was confirmed in the wiring line structures 1, 2 and 5 by the fluorescence X ray analysis.

Also, a comparison sample is formed in which the copper film 26a of the first copper wiring line 22a is formed, and the BTA anti-corrosion process and the ammonia plasma process are carried out, and then the connection plug 28 and the second copper wiring line 22b are formed by the dual damascene method without the siliciding process of the surface of the copper film 26a (Wiring line structure 6).

After being formed, the wiring line structure from 1 to 6 were located for 500 hours at the temperature of 150 C. Subsequently, the production yield examination of the via-chains was carried out. Also, a sample as a reference was prepared in which SiH$_4$ gas was flowed to form a silicide layer while generating plasma (Wiring line structure 7). The production yield of the via-chain was measured in the 2-layer wiring line structures (reference wiring line structure 1 and reference wiring line structure 2) which were formed like the wiring line structures 1 and the wiring line structure 5 and were left for 500 hours at the room temperature. The following table 1 shows the production yield (%) of each wiring line structure when it was supposed that the production yields in the reference wiring line structures 1 and 2 were 100% and the production yield in the wiring line structure 6 was 0%.

TABLE 1

| | | Product yield (%) |
|---|---|---|
| WS1 (150 C., 500 hr) | BTA-NH3pl-SiH4-single | 98 |
| WS2 (150 C., 500 hr) | BTA-SiH4-Single | 100 |
| WS3 (150 C., 500 hr) | NH3pl-Single | 15 |
| WS4 (150 C., 500 hr) | BTA-NH3pl-single | 40 |
| WS5 (150 C., 500 hr) | BTA-NH3pl-SiH4-double | 90 |
| WS6 (150 C., 500 hr) | BTA-NH3pl-double | 0 |
| RWS1 (150 C., 500 hr) | BTA-NH3pl-SiH4-single | 100 |
| RWS2 (150 C., 500 hr) | BTA-NH3pl-SiH4-double | 100 |

Figure 8:
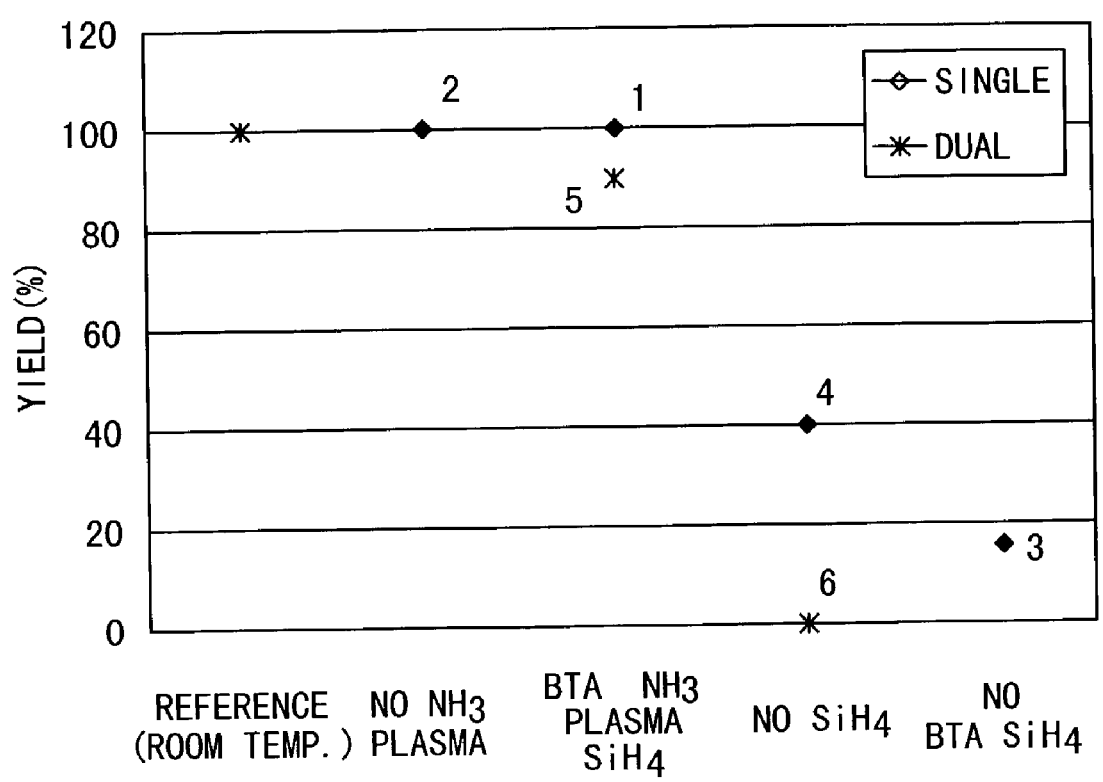
FIG. 8 is a graph showing production yields shown in table 1.

WS: wiring line structure
RWS: reference wiring line structure
NH3pl: NH3 plasma FIG. 8 is a graph showing data of the production yield shown in table 1. As shown in FIG. 8, there is no difference between the single damascene method and the dual damascene method in the reference wiring line structures 1 and 2 which were left at the room temperature is not present. Also, the production yield is approximately 100% in the wiring line structure 1 and the wiring line structure 2 in which the BTA anti-corrosion process and the siliciding process are carried out and which are formed using the single damascene method.

The production yield is 40% in the wiring line structure 4 which is formed using the single damascene method like the wiring line structure 1 and the siliciding process is not carried out. This value is less than a half of the production yield of the wiring line structure 1. It could be considered that this results from that the copper film 26a of the first copper wiring line 22a is protected by the first Cu silicide layer 34a, and a stress from the second copper wiring line 22b as an upper layer and connection plug 28 is relaxed so that the generation of the cavity in the first copper wiring line 22a can be prevented.

The production yield is 90% in the wiring line structure 5 which is formed by the dual damascene method and in which the siliciding process is carried out. This production yield is greatly improved, compared with the wiring line structure 6 (production yield of 0%) in which the siliciding process is not carried out although it is formed using the dual damascene method. It could be considered that the increase of the production yield results from that the copper film 26a of the first copper wiring line 22a is protected by the first Cu silicide layer 34a, and a stress from the second copper wiring line 22b as an upper layer and connection plug 28 is relaxed so that the generation of the cavity in the first copper wiring line 22a can be prevented.

Also, the production yield is improved in the wiring line structure 1 formed using the single damascene method, compared with the wiring line structure 5 formed using the dual damascene method. In the wiring line structure 5, the sucking-up of copper into the connection plug 28 occurs from the second copper wiring line 22b formed using the dual damascene method. As a result, a cavity is produced between the connection plug 28 and the first copper wiring line 22. However, in the wiring line structure 1 formed using the single damascene method, the generation of such a cavity could be prevented.

Also, the production yield is 15% in the wiring line structure 3 in which neither of the BTA anti-corrosion process and the siliciding process are carried out. This value is improved, compared with the production yield in the wiring line structure 6 in which the BTA anti-corrosion process is carried out and is formed using the dual damascene method. From the above, it could be understood that the formation of the copper wiring line by the single damascene method results in the improvement of the production yield.

Moreover, as for the wiring line structures in which the siliciding process is not carried out, the production yield is decreased by the difference in the production yield between the wiring line structure 5 and the wiring line structure 1 or more, in the wiring line structure 6 formed using the dual damascene method, compared with the wiring line structure 4 formed using the single damascene method. It could be considered that this results from that the sucking-up of copper by the second copper wiring line 22b happens from the first copper wiring line 22a in addition to the connection plug 28, so that the cavity is generated between the first copper wiring line 22a and the connection plug 28 when the surface of the copper film 26a of the first copper wiring line 22a is not protected by the first Cu silicide layer 34a.

Also, a leak current is measured between the wiring lines in each wiring line structure. The result is shown in FIGS. 26A and 26B. The leak current is hardly present in the wiring line structures 1 to 6. However, the leak current is large in the wiring line structure 7 in which plasma is generated and the silicide layer is formed. This could be considered as the result that a polysilicon layer is formed on the wiring line insulating film and Cu atoms are diffused into the insulating film.

From the above results, it is found that the production yield can be increasingly improved by protecting the copper film 26*a* of the first copper wiring line 22*a* by the first Cu silicide layer 34*a*. Also, it is found that the production yield is greatly improved even if the second copper wiring line 22*b* is formed on the connection plug 28 provided on the first copper wiring line 22*a* and the surface peripheral portion of the connection plug 28 using the single damascene method. Also, it is found that the production yield further improved by the combination of the protection of the copper film 26*a* by the first Cu silicide layer 34*a* and the formation of the connection plug 28 and the second copper wiring line 22*b* using the single damascene method. Also, it is found that it is preferable from the prevention of leak between wiring lines that the silicide layer is formed without generating plasma.

It should be noted that the production yield examination of the via-chain was carried out in the same way to the wiring line structure which was formed in the similar processes to the first, second and fifth embodiments and a process was added that the surface of the copper film 26*a* is rinsed with oxalic acid before the BTA anti-corrosion process after the CMP process to the copper film 26*a* of the first copper wiring line 22*a*. The result was equal to or better than the above-mentioned result. It could be considered that this results from that the chelate operation of the oxalic acid effectively removes a copper oxide (CuOx) film from the surface of the copper film 26*a*.

(Embodiment 7)

The seventh embodiment is different from the first embodiment or the second embodiment in a method of forming the first copper wiring line 22*a* and the second copper wiring line 22*b*. As described with reference to FIGS. 4A to 4N in the first embodiment, the tantalum-based barrier metal film 24*a* is formed in the wiring line groove.

Figure 13A:
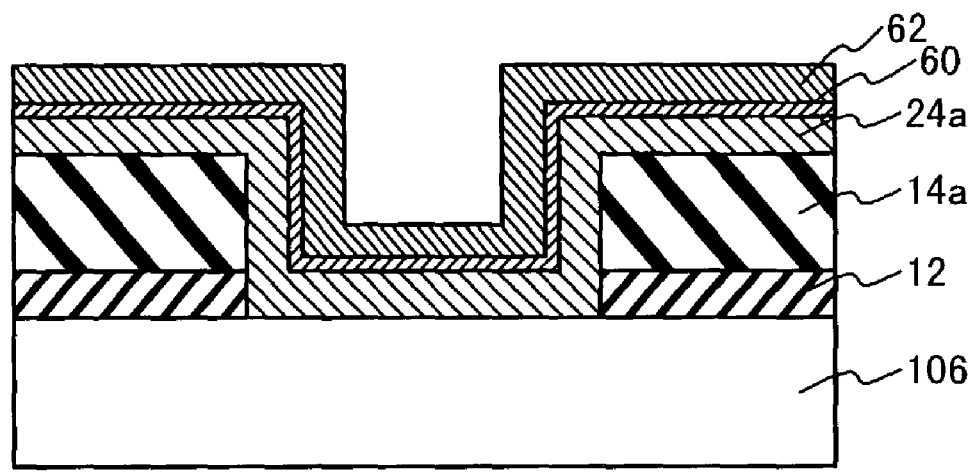
FIGS. 13A to 13D are cross sectional views showing the wiring line structure formed by a method of forming the wiring line structure according to a seventh embodiment of the present invention.

Hereinafter, the manufacturing method of the first copper wiring line 22*a* in the seventh embodiment will be described with reference to FIGS. 13A to 13D. First, a seed copper film 60 (about 100 nm) is formed by a sputtering method on the tantalum-based barrier metal film 24*a*. Subsequently, in order to fill a part of the wiring line groove, a plating copper film 62 (the film thickness of about 150 nm in the flat section) is formed on the seed copper film 60 by the electrolysis plating method (FIG. 13A). At this time, the plating copper film 62 has (111) orientation. Also, it is assumed that the total film thickness of the seed copper film 60 and the plating copper film 62 is t1.

Figure 13B:
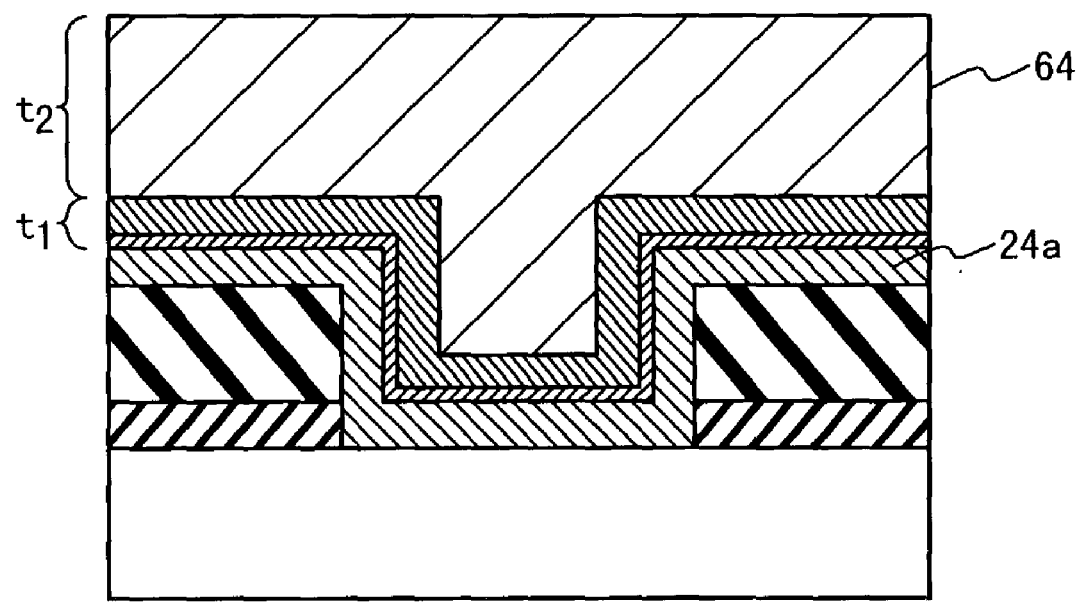

Subsequently, the copper oxide in the surface of the plating copper film 62 is sputtered and deoxidized by the Ar/$H_2$ plasma with the room temperature in a cleaning chamber. A bias sputtering copper film 64 (the film thickness of about 900 nm in a flat section) is formed on the plating copper film 62 in the Cu sputtering chamber by a bias sputtering method without exposing the substrate to the atmosphere by applying a DC bias to the silicon substrate (FIG. 13B). The bias sputtering copper film 64 is formed while argon ions are irradiated to a sputtering growth surface. At this time, the ion irradiation energy applied to the silicon substrate (the plasma potential+self bias) is a high bias, e.g., 80 eV or more, preferably, 200 eV or more. In order to prevent the temperature rise by the plasma irradiation during the growth of the film, the substrate temperature is set to −5 C. Also, the bias sputtering copper film 64 is formed to have the film thickness t2 of the bias sputtering copper film 64 thicker than the above-mentioned t1. At this time, it is confirmed that the bias sputtering copper film 64 had (111) orientation.

Figure 13C:
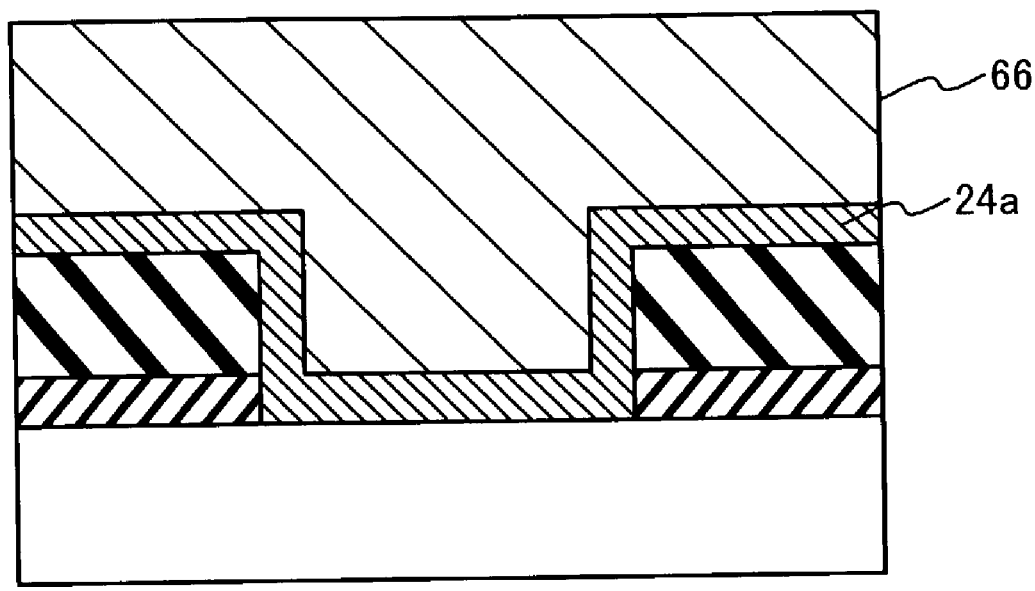
Figure 17:
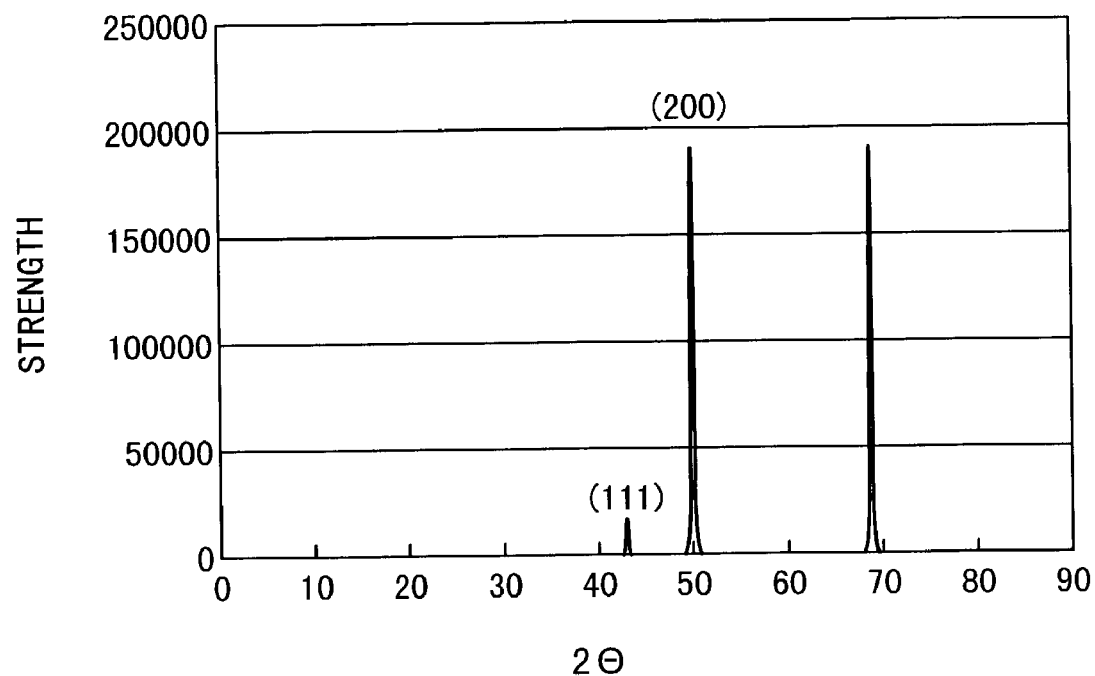
FIG. 17 is a diagram showing the analysis result by an X-ray diffraction method.

Next, a heat treatment process is carried out for 30 minutes at 400 C in the inert gas atmosphere. Through the heat treatment process, the crystal orientation of the bias sputtering copper film 64, plating copper film 62 and seed copper film 60 changes to (200). At the same time, a copper film 66 is formed to have the average grain size of the huge grains of hundreds of μm (FIG. 13C). FIG. 17 is a diagram showing the analysis result of the copper film 66 formed as mentioned above by the X-ray diffraction method. As shown in this figure, the grains of 93% (190468/204419) or more have plane orientation (200) in the copper film 66 surface. Also, when the grain size in the surface of the copper film 66 is confirmed by the optical microscope, most of the grains are larger than 100 to 200 μm, or more and some are larger than 500 μm.

Figure 13D:
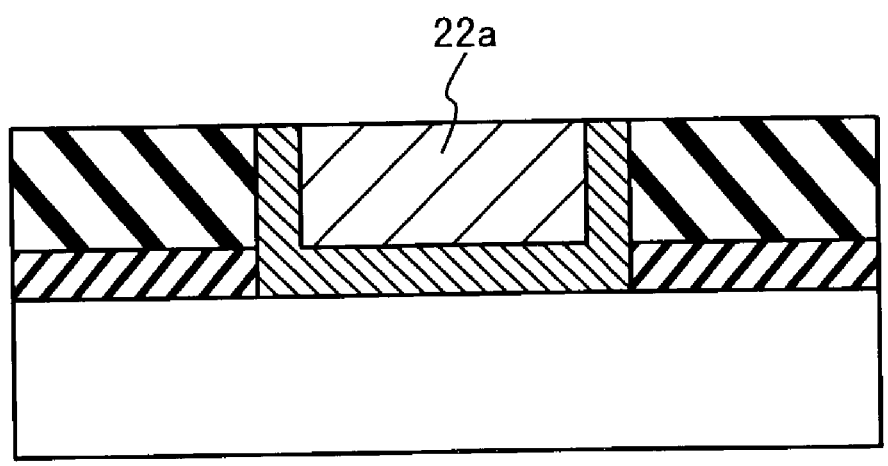

Next, the unnecessary copper film 66 and the tantalum-based barrier metal film 24*a* formed outside the wiring line groove are removed by the CMP process such that only the copper film 66 and so on are left inside the wiring line groove. Thus, the first copper wiring line 22*a* is formed (FIG. 13D). A part of the samples is examined in this step. It could be confirmed that a 70% of the copper film 66 of the first copper wiring line 22*a* is formed with single grains. In this case, the wiring line width of the first copper wiring line 22*a* is 10 μm, the length of the wiring line is 100 μm and the film thickness is 300 nm.

After this, the surface process of the copper film 66 by BTA is carried out like the second embodiment, and the first Cu silicide layer 34*a* is formed after the BTA is evaporated and removed by the heating process of about 350 C. Subsequently, the connection plug 28 is formed like the first embodiment and the second embodiment. The second copper wiring line 22*b* is formed like the first copper wiring line 22*a* mentioned above in this embodiment.

As mentioned above, a bias sputtering copper film 64 is formed on the plating copper film 62, and then a heat-treating is carried out. Thus, the plane orientation of the crystal of copper can be controlled. In this way, the surface of copper film 66 can be uniformly kept, and the Cu silicide layer can be uniformly formed on the copper film 66. Therefore, the film thickness of the Cu silicide layer can be appropriately controlled, and while suppressing the resistance increase rate of the first copper wiring line 22*a* and the second copper wiring line 22*b*, these wiring lines can be protected.

Moreover, because the grain size of copper can be made large through the above mentioned heat treatment process, the number of the boundaries of the grains in the copper film 66 surface can be substantially reduced. Thus, the stress migration endurance of the wiring line structure can be increased. Also, in the seventh embodiment, the Cu silicide layer is formed in the surface of the copper film 66. Therefore, the displacement of the crystal of copper can be suppressed, and the stress migration endurance of the wiring line structure can be improved. Also, because the grain size of the copper film of the copper wiring line can be made large, the wiring line resistance can be reduced. Also, because the boundary of the grain is hardly generated in the surface of the copper film 66 in this embodiment, the Cu silicide can be uniformly formed from this viewpoint. It could be confirmed by an outward appearance test apparatus (KLA-Tencor) that the Cu silicide layer is formed uniformly in the wiring line surface in this embodiment.

(Embodiment 8)

The eighth embodiment is different from the seventh embodiment in that a CVD copper film 68 is formed by a plasma CVD method instead of that the seed copper film 60 and plating copper film 62 when the first copper wiring line 22a and the second copper wiring line 22b are formed.

Figure 14A:
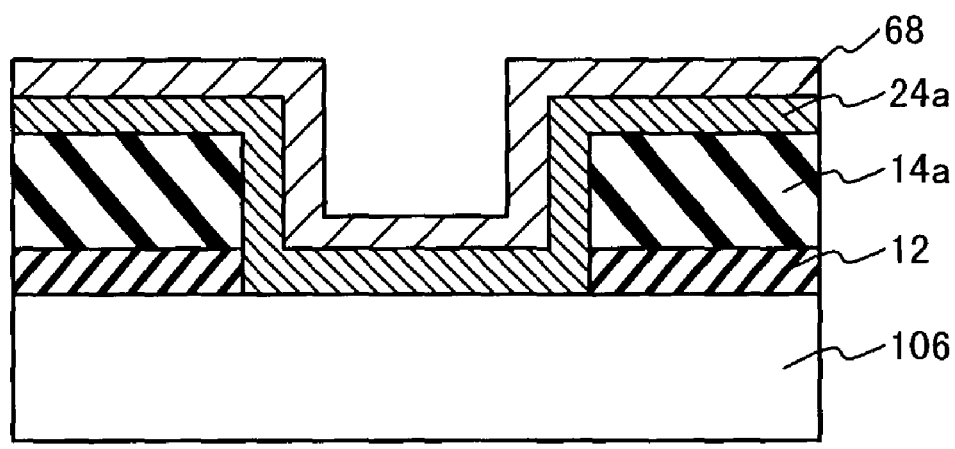
FIGS. 14A to 14D are cross sectional views showing the wiring line structure formed by a method of forming the wiring line structure according to an eighth embodiment of the present invention.

The eighth embodiment will be described with reference to FIGS. 14A to 14D. After the tantalum-based barrier metal film 24a is formed, the CVD copper film 68 is formed by the plasma CVD method (the film thickness of about 200 nm in a flat section) (FIG. 14A). At this time, the crystal orientation of the CVD copper film 68 is (111).

Figure 14B:
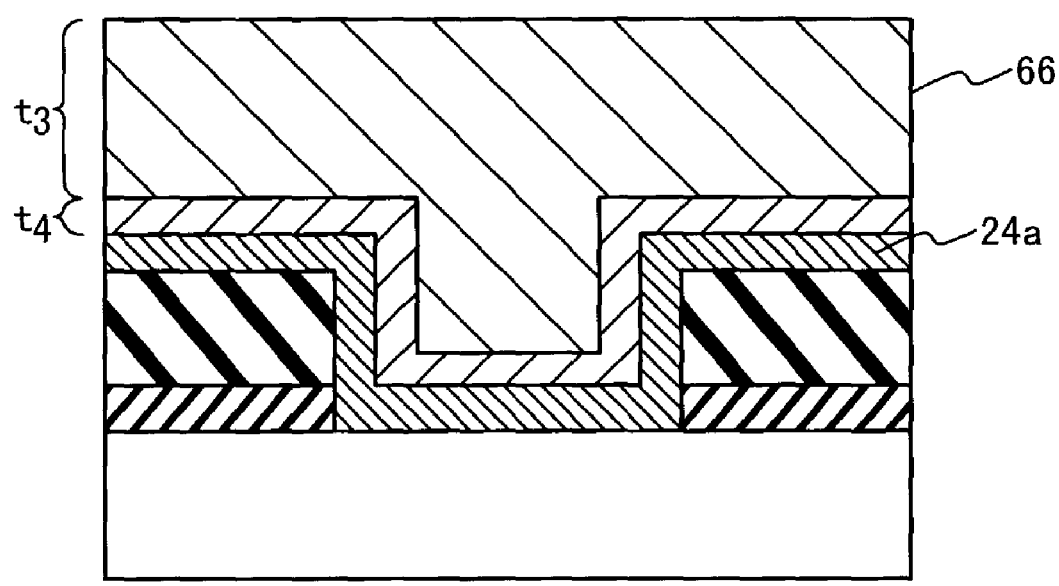

Next, the copper oxide in the CVD copper film 68 surface is sputtered and reduced by the Ar/H$_2$ plasma with the room temperature in the cleaning chamber like the seventh embodiment. Without exposing the substrate to the atmosphere, a DC bias is applied to the substrate in the Cu sputtering chamber, and a bias sputtering copper film 64 is formed on the CVD copper film 68 by the bias sputtering method (the film thickness of about 900 nm in a flat section) (FIG. 14B). The condition of the bias sputtering is like the seventh embodiment. Also, in this embodiment, the bias sputtering copper film 64 is formed such that the film thickness t4 of bias sputtering copper film 64 is thicker than the film thickness t3 of the CVD copper film 68, like the seventh embodiment.

Figure 14C:
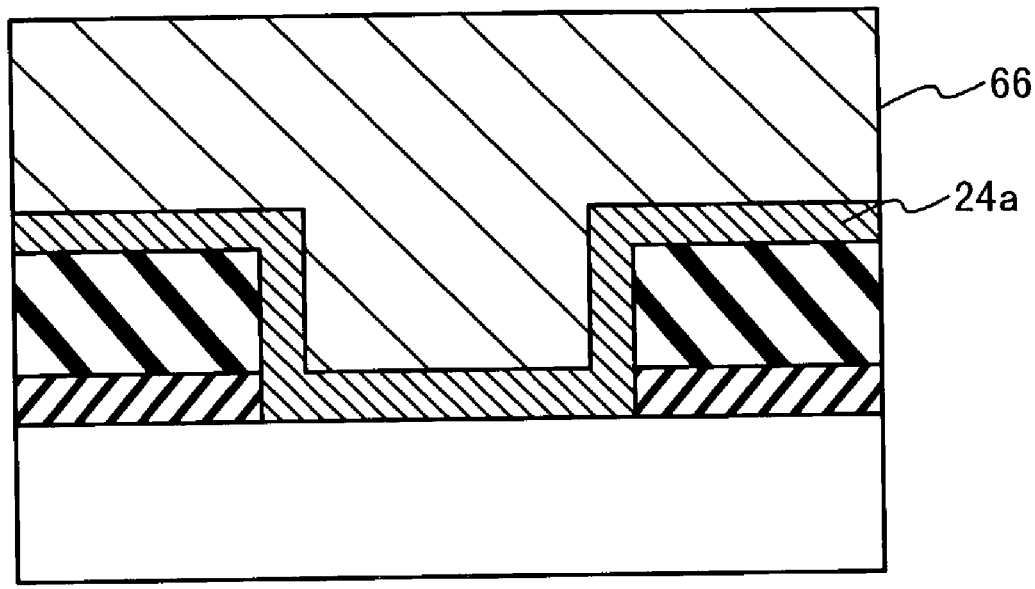

Next, a heat treatment process is carried out for 30 minutes at 400 C in the inert gas atmosphere. Through the heat treatment process, the crystal orientation of the bias sputtering copper film 64 and the CVD copper film 68 is changed to (200), and at the same time, the copper film 66 is formed to have the huge grains with the average grain size of hundreds of μm (FIG. 14C).

Figure 14D:
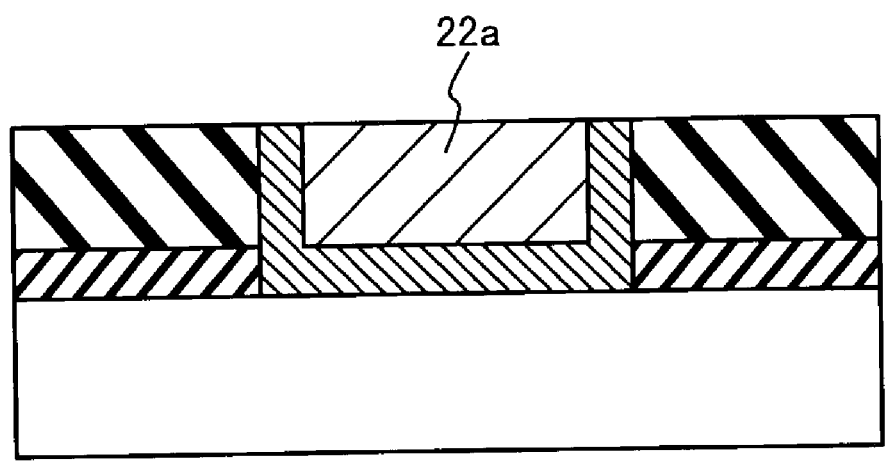

Next, the unnecessary copper film 66 and the tantalum-based barrier metal film 24a formed outside the wiring line groove are removed by the CMP process. The first copper wiring line 22a is formed such that only the copper film 66 and so on are left inside the wiring line groove (FIG. 14D).

After this, the first Cu silicide layer 34a and the connection plug 28 are formed like the seventh embodiment. The second copper wiring line 22b is formed like the above-mentioned first copper wiring line 22a in this embodiment.

(Embodiment 9)

Figure 15A:
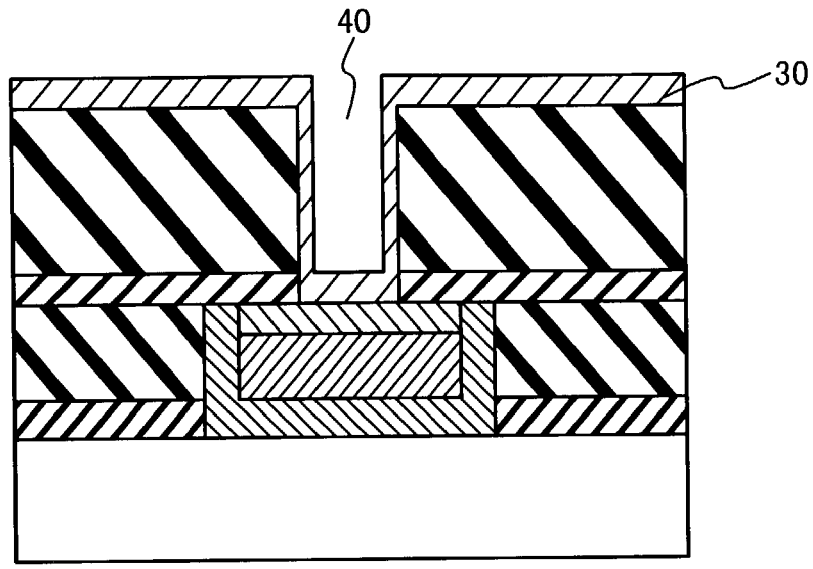
FIGS. 15A to 15D are cross sectional views showing the wiring line structure formed by a method of forming the wiring line structure according to a ninth embodiment of the present invention.

The ninth embodiment is different from the seventh embodiment in the method of forming the connection plug 28. After the first copper wiring line 22a is formed, as described in the seventh embodiment, the connection hole 40 is formed in the second SiCN film 16 and the silicon oxide film 18, as described with reference to FIG. 4A to 4L in the first embodiment. Subsequently, the tantalum-based barrier metal film 30 is formed inside the connection hole 40 (FIG. 15A).

Figure 15B:
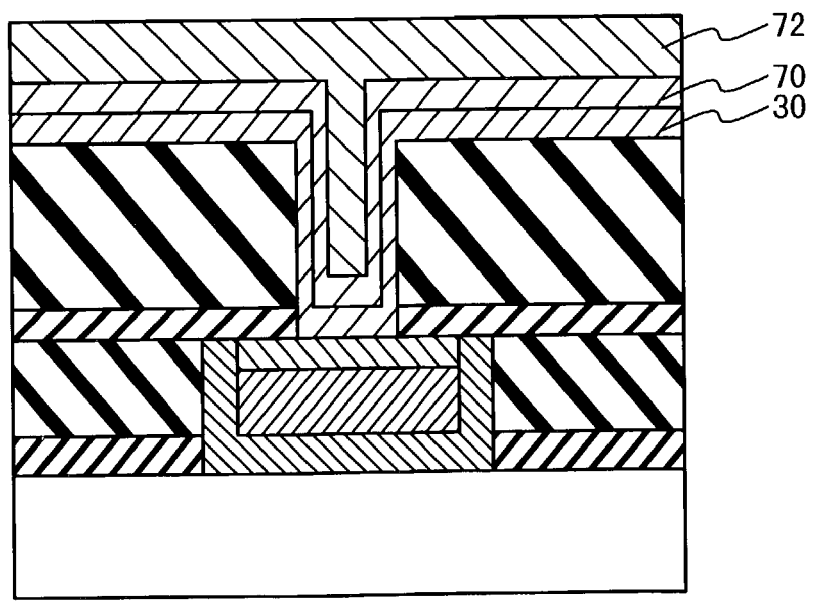
Figure 15C:
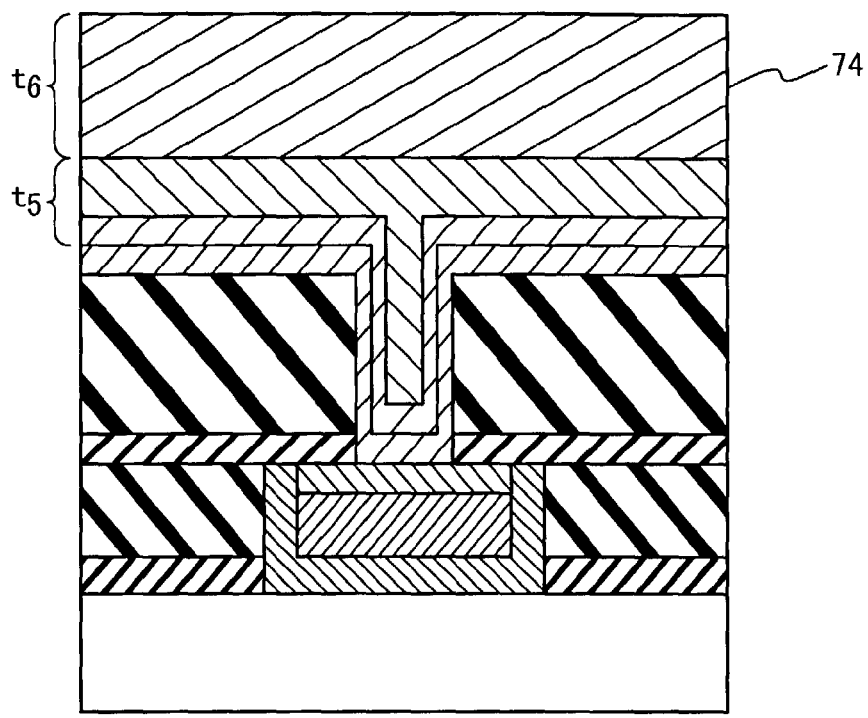

Next, the seed copper film 70 is formed on the tantalum-based barrier metal film 30 by the sputtering method. Subsequently, the plating copper film 72 is formed on the seed copper film 70 by the electrolysis plating method (FIG. 15B). Subsequently, a DC bias is applied to the substrate and a bias sputtering copper film 74 is formed on the plating copper film 72 by the bias sputtering method (FIG. 15C). In this case, the bias sputtering copper film 74 is formed while argon ions are irradiated to the sputtering growth surface. The condition of the bias sputtering is like the seventh embodiment. Also, the bias sputtering copper film 74 is formed such that the film thickness t6 of the bias sputtering copper film 74 is larger than the total film thickness t5 of the seed copper film 70 and the plating copper film 72.

Figure 15D:
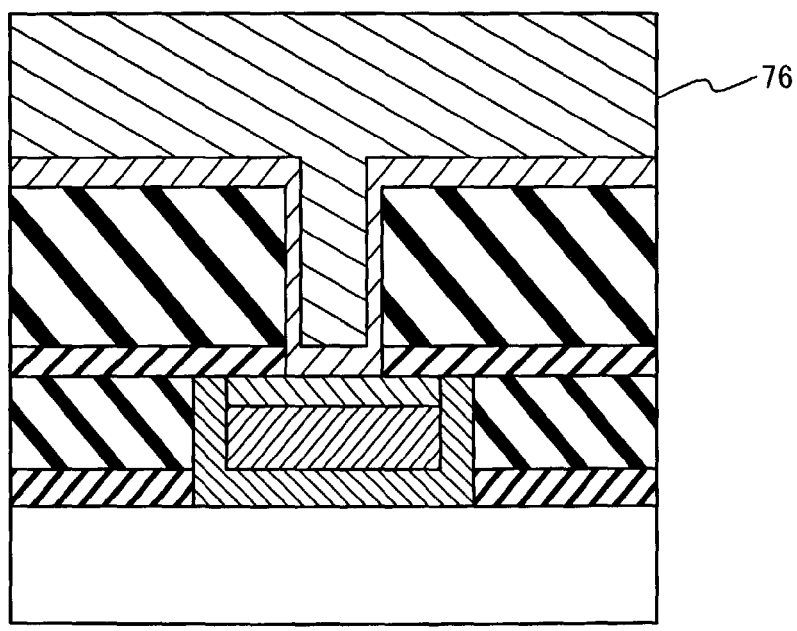

Next, the heat treatment process is carried out in the inert gas atmosphere. Through this heat treatment process, the crystal orientation of the bias sputtering copper film 74, the plating copper film 72 and the seed copper film 70 changes to (200). At the same time, the copper film 76 is formed to have the huge grains with the average grain size of hundreds of μm (FIG. 15D).

Next, a CMP flattening process is carried out as described with reference to FIGS. 4A to 4N in the first embodiment and the connection plug 28 is formed. Subsequently, the second copper wiring line 22b is formed like the seventh embodiment.

In the ninth embodiment, the plane orientation of the crystal in the surface of the copper film of he connection plug 28 can be made (200). The grain size of copper can be made large. Therefore, the stress migration endurance of the connection plug 28 can be increased. Also, because the grain size of the copper film of a copper wiring line and a plug can be made large, the wiring line resistance can be reduced.

(Embodiment 10)

The tenth embodiment is different from the fifth embodiment in the method of forming the first copper wiring line 22a and the second copper wiring line 22b. The connection hole 52 and the wiring line groove 54 are formed as described with reference to FIGS. 6A to 6F in the fifth embodiment. The tantalum-based barrier metal film 56 is formed on the whole surface of the silicon oxide film 50 containing the connection hole 52 and the wiring line groove 54. It should be noted that in the tenth embodiment, the first copper wiring line 22a is formed in the same method as the second copper wiring line 22b to be described below.

Figure 16A:
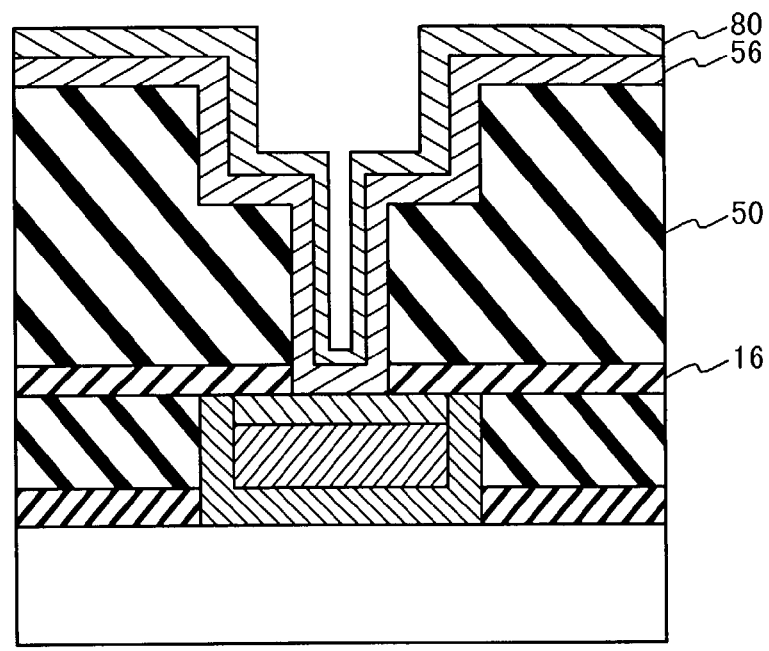
FIGS. 16A to 16D are cross sectional views showing the wiring line structure formed by a method of forming the wiring line structure according to a tenth embodiment of the present invention.
Figure 16B:
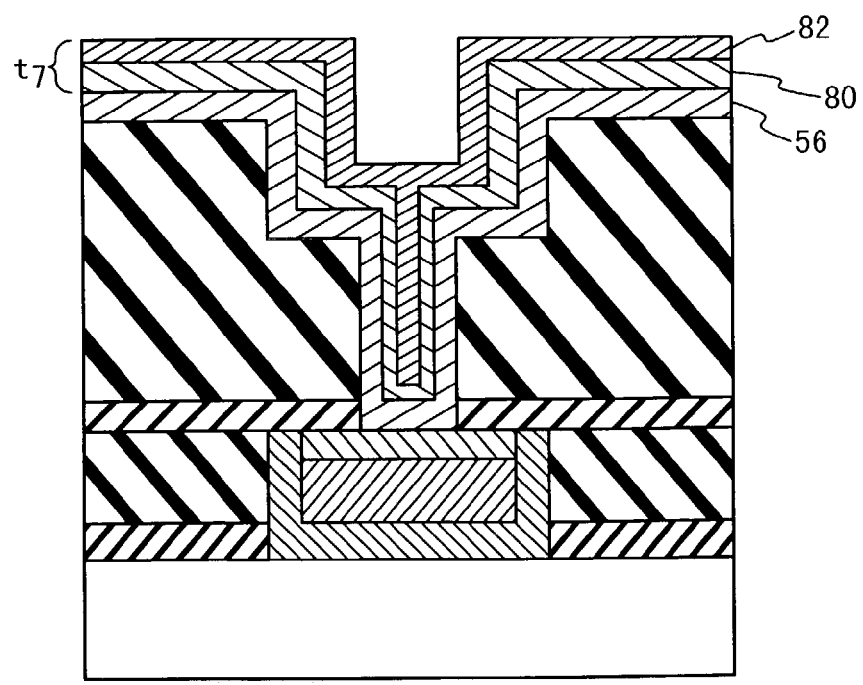

Hereinafter, the manufacturing method of the second copper wiring line 22b in the tenth embodiment will be described with reference to FIGS. 16A to 16D. First, the seed copper film 80 (about 100 nm) is formed on tantalum-based barrier metal film 56 by the sputtering method (FIG. 16A). Next, the plating copper film 82 is formed on seed copper film 80 by the electrolysis plating method (the film thickness of about 200 nm in a flat section) (FIG. 16B). At this time, the plating copper film 82 has (111) orientation. It is assumed that the total film thickness of the seed copper film 80 and the plating copper film 82 is t7.

Figure 16C:
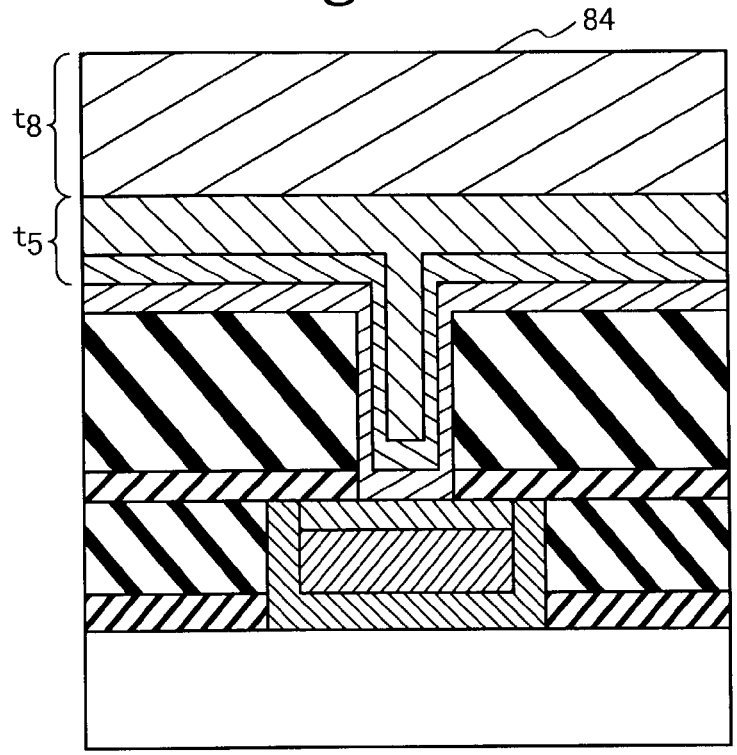

The copper oxide in the plating copper film 82 surface is sputtered and deoxidized by the Ar/H$_2$ plasma with the room temperature in the laundering chamber. Without exposing the substrate to the atmosphere, a DC bias is applied to the substrate in the Cu sputtering chamber, and the bias sputtering copper film 84 is formed on the plating copper film 82 by the bias sputtering method (the film thickness of about 900 nm in a flat section) (FIG. 16C). The bias sputtering copper film 84 is formed while argon ions are irradiated to the sputtering growth surface. In this case, the ion irradiation energy applied to the silicon substrate (the plasma potential+ self bias) is a high bias, e.g., 80 eV or more, preferably, 200 eV or more. The substrate temperature is set to −5 C to prevent temperature rise by the plasma irradiation. Also, the bias sputtering copper film 84 is formed such that the film thickness t8 of the bias sputtering copper film 84 is thicker than the above-mentioned t7.

Figure 16D:
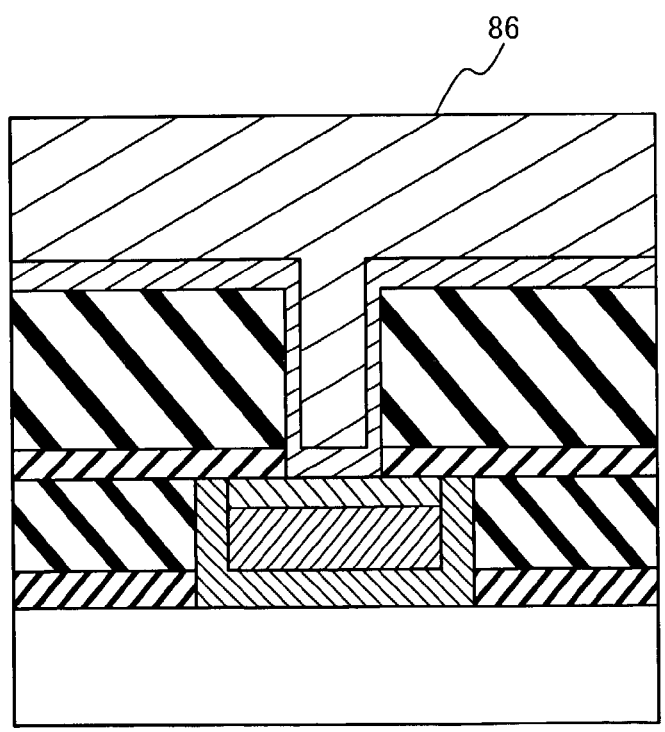

Next, the heat treatment process is carried out for 30 minutes at 400 C in the inert gas atmosphere. Through the heat treatment process, the crystal orientation of the bias sputtering copper film 84, the plating copper film 82 and the seed copper film 80 changes to (200). at the same time, the copper film 86 is formed to have the huge grain with the average grain size of hundreds of μm (FIG. 16D).

Next, the CMP flattening process is carried out, as described with reference to FIGS. 6A to 6F in the fifth embodiment and the second copper wiring line 22b is formed.

Next, the surface treat process of the copper film 86 by BTA is carried out like the fifth embodiment. Subsequently, the second Cu silicide layer 34b is formed after the BTA is evaporated and removed by the heating process of about 350 C.

The plane orientation of the copper crystal can be controlled by forming the bias sputtering copper film 84 on the above-mentioned plating copper film 82 and carrying out the heat treatment process. In this way, the surface of the copper film 86 can be uniformly kept. Therefore, the Cu silicide layer can be uniformly formed on the copper film 86. Also, the film thickness of the Cu silicide layer can be appropriately controlled, and while suppressing the resistance increase rate of the first copper wiring line 22a and the second copper wiring line 22b, these wiring lines can be protected.

Moreover, the grain size of copper can be made large through the above-mentioned heat treatment process. Therefore, the number of boundaries of the grains in the copper film 86 surface can be substantially reduced. Thus, the stress migration endurance of the wiring line structure can be increased. Also, because the Cu silicide layer is formed in the copper film 86 surface in the tenth embodiment, the displacement of the crystal of copper can be suppressed. Moreover, the stress migration endurance of the wiring line structure can be improved. Also, because the grain size of the copper film of the copper wiring line and the plug can be made large, the wiring line resistance can be reduced. Also, because the grain size of the copper film of the copper wiring line can be made large, the wiring line resistance can be reduced. Moreover, because the boundary of the grain is hardly generated in the copper film 86 surface at this embodiment, the Cu silicide layer can be uniformly formed from this viewpoint.

(Embodiment 11)

The 2-layer wiring line structures as shown in FIG. 7A are formed in the method mentioned in the above second, fourth and seventh embodiments and the production yield of the via-chain resistance is measured like the sixth embodiment. Here, the 1,000,000 first copper wiring lines 22a are provided in parallel and the 1,000,000 second copper wiring lines 22b are provided in parallel so as to be orthogonal to the wiring lines 22a. 2,000,000 connection plugs 28 are connected between these wiring lines. The 2-layer wiring line structure corresponding to the second, fourth and seventh embodiments are respectively called wiring line structure a2, wiring line structure a4 and wiring line structure a7. It was confirmed by the fluorescence X ray analysis that the CuSix is present in the wiring line structure a2 and the wiring line structure a7.

The wiring line structure a2, the wiring line structure a4 and the wiring line structure a7 were left for 500 hours at the temperature 150 C. With each of the wiring line structures, the initial value of the resistance value of the via-chain is set to 100% and the resistance value of the sample is calculated as a relative value. The table shows a range of resistance values when a plurality of samples are prepared and the evaluation is carried out. The higher value shows the higher stress migration endurance.

TABLE 2

| | Method | Cu silicide | Product yield (%) |
|---|---|---|---|
| WS a2 | plating | present | 60–78 |
| WS a4 | plating | no | 8–24 |
| WS a7 | Plating-bias sputtering | present | 93–100 |

WS: wiring line structure

As shown in the table 2, the copper films formed in the plating method and the bias sputtering method are subjected to the heat treat process. The plane orientation of the crystal in the surface of the copper film is changed to (200) and the grain is grown largely. Then, the production yield is 93 to 100% in the wiring line structure a7 in which the siliciding process is carried out. The production yield is better than the production yield of 60 to 78% in the wiring line structure a2 in which the siliciding process is carried after a copper film is formed by the plating method. Also, the production yields in the wiring line structure a7 and the wiring line structure a2 are greatly improved more than that of the wiring line structure a4 in which the copper film is formed by the plating method but the siliciding process is not carried out. In this way, from the result of the eleventh embodiment, it could be confirmed that it is possible to effectively restrain the stress migration by siliciding the surface of the wiring line formed of copper. Moreover, it could be confirmed that the stress migration could be further restrained by making a plane orientation in the surface of the copper film uniform and making the grains of the copper film large to reduce the number of grains in the copper film surface.

(Embodiment 12)

The twelve embodiment is different from the seventh to tenth embodiments in that a tungsten cap layer is a formed instead that the Cu silicide layer 34a or 34b is formed on the surface of the first copper wiring line 22a and the second copper wiring line 22b shown in FIG. 2.

After the copper film 66 is formed like the seventh embodiment, an unnecessary copper film 66 and tantalum-based barrier metal film 24a formed outside the wiring line groove are removed by the CMP process. The copper film 66 and so on are left inside only the wiring line groove. Thus, the first copper wiring line 22a is formed. Subsequently, $WF_6$ and $H_2$ are made to act for about 60 seconds in a W-CVD chamber and a tungsten cap layer is formed on the copper film 66 surface of the first copper wiring line 22a.

Next, a silicon oxide film 18 is formed directly on the first copper wiring line 22a without the second SiCN film 16 being formed. Subsequently, the connection plug 28 is formed like the seventh embodiment and the second copper wiring line 22b is formed as in the above-mentioned first copper wiring line 22a.

The copper film on the copper wiring line surface is protected by the tungsten cap layer in the wiring line structure thus obtained. Therefore, it is possible to prevent the oxidation of the copper film surface and the diffusion of copper into the interlayer insulating film, even if the diffusion prevention film such as the second SICN film 16 shown in FIG. 2 is not formed or the diffusion prevention film is thin. In this way, the capacity of the semiconductor device can be reduced and the semiconductor device can be manufactured to meet the demand of the high speed operation. Also, cross talk between the wiring lines can be reduced.

Also, in the wiring line structure formed in the twelfth embodiment, the tungsten cap layer is formed on the surface of the copper film 66 in which the grain size is large and the plane orientation is uniform. Therefore, the film thickness can be made uniform, compared with the film formed on the copper film surface formed by only the usual plating method, and the wiring line resistance can be reduced.

It should be noted that various processes described in each embodiment may be appropriately combined.

(Embodiment 13)

Two kinds of wiring line structures are formed using L-Ox and HSQ, and the siliciding process is carried out through the $SiH_4$ irradiation. In this case, it could be confirmed that the endurance of the film was largely changed. Hereinafter, the experiment data will be described.

The $SiH_4$ irradiation is carried out in a chamber of the plasma CVD apparatus and the condition is the process temperature of 350 C, the process pressure of about 4 Torr, the $SiH_4$ flow rate of 50 sccm, and the $N_2$ flow rate of 2500 sccm. HSQ and L-Ox are coated and baked at about 200 C by a hot plate and then sintered for 30 minutes in the nitrogen atmosphere of 350 C in a diffusion furnace. Thus, blank wafers with the film thickness of 300 nm are used. The film thickness and the refractive index are measured by spectroellipsometer, and the capacitance is measured by a mercury probe apparatus. The dielectric constant is calculated from the measured values.

Figure 22:
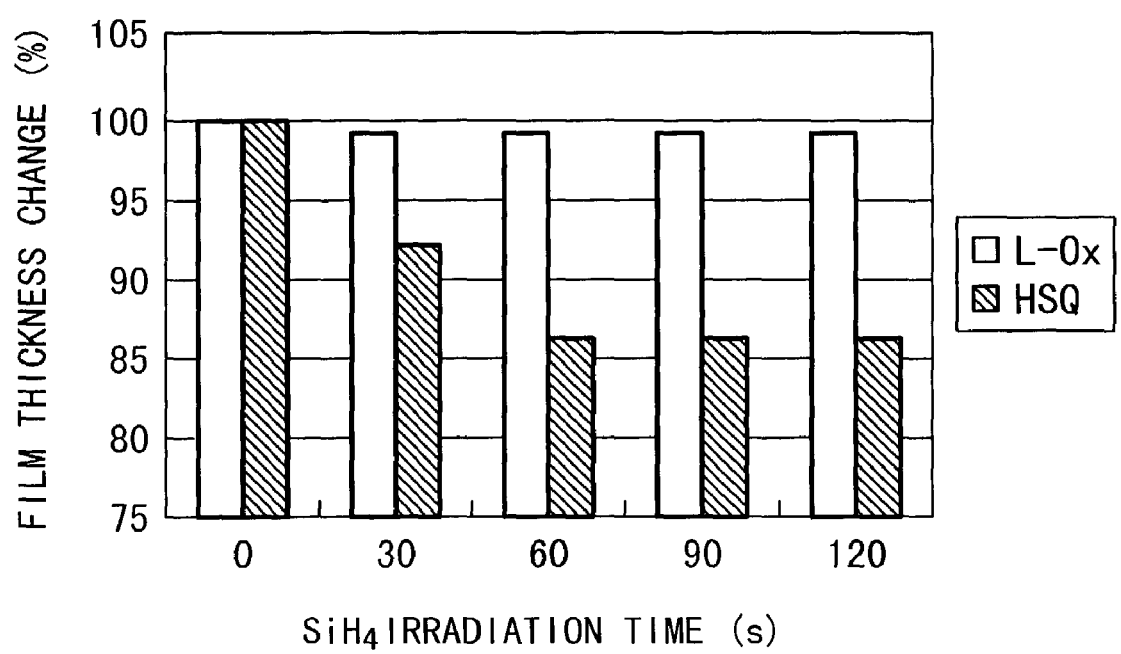
FIG. 22 is a diagram showing relation of $SiH_4$ irradiation process time and film thickness change.
Figure 23:
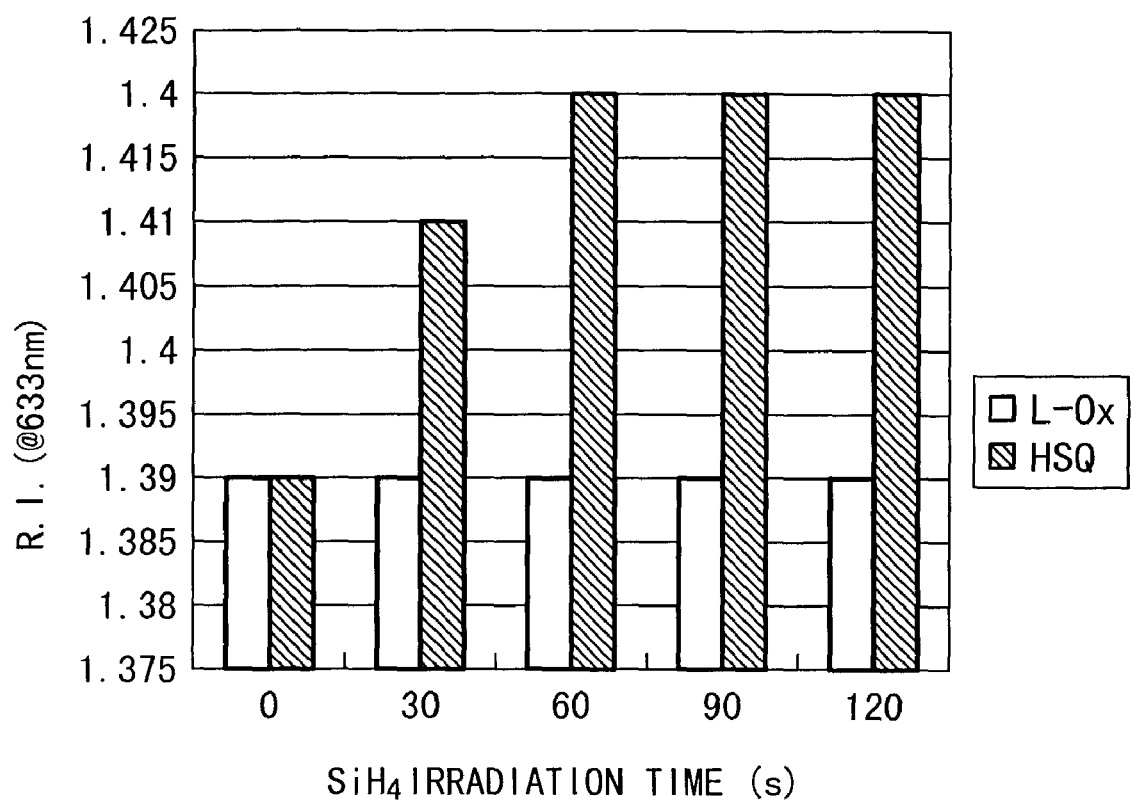
FIG. 23 is a diagram showing relation of $SiH_4$ irradiation process time and refractive index change.
Figure 24:
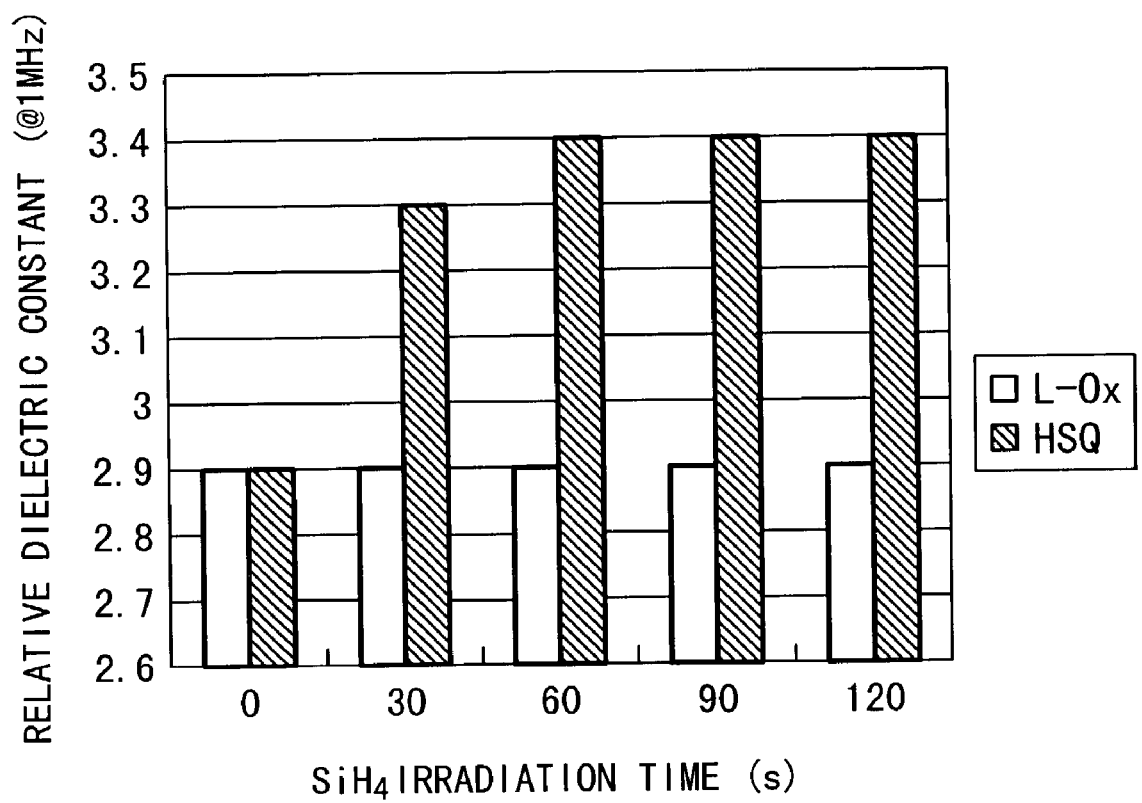
FIG. 24 is a diagram showing relation of $SiH_4$ irradiation process time and dielectric constant change.

FIG. 22, FIG. 23 and FIG. 24 show experiment results of the relation between the $SiH_4$ irradiation time and the film thickness contraction rate change, between the $SiH_4$ irradiation time and the refractive index change, and between the $SiH_4$ irradiation time and the dielectric constant change, respectively.

As shown in FIG. 22, in L-Ox, the film thickness contraction rate keeps 99% of an initial value regardless of the SiH4 irradiation process time from 0 to 120 sec. and hardly changes. In HSQ, the film thickness decreased as the $SiH_4$ irradiation time extends, and decreases to about 80% of the initial value in 120 sec.

Also, as shown in FIG. 23, the refractive index at the wavelength of 633 nm changes from 1.39 at the original time to 1.42 at 120 sec. in case of HSQ, whereas the refractive index keeps 1.39 in the irradiation time from 0 to 120 sec. in case of L-Ox.

Also, as shown in FIG. 24, the dielectric constant increases from 2.9 at the initial time to 3.4 at 120 sec. through the $SiH_4$ irradiation process in case HSQ, whereas the dielectric constant keeps 2.9 as the initial value.

From the above results, it is seen that L-Ox is more excellent than HSQ in the endurance to $SiH_4$ irradiation as to either of the film thickness, the refractive index, and the dielectric constant. It could be considered that the difference in such $SiH_4$ irradiation process endurance depends on the difference of the reactivity of the above-mentioned hydrogen combination.

When the $SiH_4$ irradiation process is carried out, L-Ox is more preferable than HSQ as the material of the interlayer insulating film.

It should be noted that a difference between L-Ox and HSQ is present about the liquid medicine endurance. Especially, comparing an etching rate to ammonium fluoride and diluted HF, the etching rate is large in L-Ox, compared with HSQ. FIGS. 25A is a diagram showing the experiment result. A wafer are immersed into etching liquid of ammonium fluoride and the diluted HF for a predetermined time and the etching quantity at positions ① to ⑤ of the wafer of FIG. 25B were measured. FIG. 25A shows the result and a unit of each value in the table is angstrom.

As described above, according to the present invention, it is possible to improve the production yield of the semiconductor device containing a copper containing metal wiring line by protecting a surface portion the copper containing metal film. Also, it is possible to improve the production yield of the semiconductor device containing a copper containing metal wiring line by separately forming the copper containing metal wiring line and the connection plug under the wiring line. Moreover, it is possible to improve the production yield of the semiconductor device containing a copper containing metal wiring line by combining them. As described above, according to the semiconductor device of the present invention and the manufacturing method of the semiconductor device, the reliability of the semiconductor device can be increased.

Moreover, because the boundaries of the grains in the copper containing metal film surface can be reduced, the protection film can be uniformly formed on the copper containing metal film surface. Therefore, the stress migration endurance can be increased while controlling the film thickness of the protection film and suppressing the resistance increase rate of the copper containing metal film. Also, because the grain size of the copper containing metal film can be made large, the resistance of the copper containing metal film can be made low, and it is possible to improve the migration endurance.

What is claimed is:

1. A method of manufacturing a semiconductor device, comprising:

forming a first wiring line composed of a copper containing metal film on or above a semiconductor substrate;

changing a surface portion of said first wiring line into an amorphous layer;

forming a first interlayer insulating film on a whole surface of said semiconductor substrate to cover said first wiring line;

selectively removing said first interlayer insulating film to form a connection hole reaching said amorphous surface portion of said first wiring line;

forming a barrier metal film to cover an inner surface of said connection hole and directly contact said amorphous surface portion of said first wiring line, and then forming a copper containing metal film to fill said connection hole;

removing said copper containing metal film formed outside said connection hole;

forming a second interlayer insulating film on a whole surface of said semiconductor substrate to cover said copper containing metal film formed in said connection hole;

selectively removing said second interlayer insulating film to form a wiring line groove such that said copper containing metal film formed in said connection hole is exposed at a bottom;

forming a barrier metal film to cover an inside of said wiring line groove and then forming a copper containing metal film to fill said wiring line groove; and removing said copper containing metal film outside said wiring line groove to form a second wiring line wherein said step of forming said first wiring line comprises the steps of:

forming a first copper containing metal film by a plating method;

forming a second copper containing metal film by a sputtering method on a surface of said semiconductor substrate to cover said first copper containing metal film; and carrying out thermal treatment to said first copper containing metal film and said second copper containing metal film.

2. The manufacturing method of a semiconductor device according to claim 1, wherein said copper containing metal film of said first wiring line is formed by a plating method.

3. The manufacturing method of a semiconductor device according to claim 1, wherein said insulating film includes ladder-type siloxane hydride.

4. The manufacturing method of a semiconductor device according to claim 1, further comprising the step of:
forming a diffusion preventing film composed of SiC, SiCN, SiN or SiOC on said first wiring line before said step of forming said insulating film,
wherein said step of forming said connection hole comprises the step of:
selectively removing said first interlayer insulating film and said diffusion preventing film to form said connection hole.

5. The manufacturing method of a semiconductor device according to claim 1, wherein the surface portion is exposed during the changing into an amorphous layer.

6. A method of manufacturing a semiconductor device, comprising:
forming a first wiring line composed of a copper containing metal film on or above a semiconductor substrate;
siliciding a surface portion of said first wiring line;
forming a first interlayer insulating film on a whole surface of said semiconductor substrate to cover said first wiring line;
selectively removing said first interlayer insulating film to form a connection hole reaching said silicided surface portion of said first wiring line;
forming a barrier metal film to cover an inner surface of said connection hole and directly contact said silicided surface portion of said first wiring line, and then forming a copper containing metal film to fill said connection hole;
removing said copper containing metal film formed outside said connection hole;
forming a second interlayer insulating film on a whole surface of said semiconductor substrate to cover said copper containing metal film formed in said connection hole;
selectively removing said second interlayer insulating film to form a wiring line groove such that said copper containing metal film formed in said connection hole is exposed at a bottom;
forming a barrier metal film to cover an inside of said wiring line groove and then forming a copper containing metal film to fill said wiring line groove; and
removing said copper containing metal film outside said wiring line groove to form a second wiring line wherein said step of forming said first wiring line comprises the steps of:
forming said first copper containing metal film by a plating method;
forming a second copper containing metal film by a sputtering method on a surface of said semiconductor substrate to cover said first copper containing metal film; and
carrying out thermal treatment to said first copper containing metal film and said second copper containing metal film.

7. The manufacturing method of a semiconductor device according to claim 6, wherein said copper containing metal film of said first wiring line is formed by a plating method.

8. The manufacturing method of a semiconductor device according to claim 6, wherein said insulating film includes ladder-type siloxane hydride.

9. The manufacturing method of a semiconductor device according to claim 6, further comprising the step of:
forming a diffusion preventing film composed of SiC, SiCN, SiN or SiOC on said first wiring line before said step of forming said insulating film,
wherein said step of forming said connection hole comprises the step of:
selectively removing said first interlayer insulating film and said diffusion preventing film to form said connection hole.

10. The manufacturing method of a semiconductor device according to claim 6, wherein the surface portion is exposed during the siliciding.

11. A method of manufacturing a semiconductor device, comprising the steps of:
forming a first wiring line composed of a copper containing metal film on or above a semiconductor substrate;
cleaning a surface portion of said first wiring line;
forming a first interlayer insulating film on a whole surface of said semiconductor substrate to cover said first wiring line;
selectively removing said first interlayer insulating film to form a connection hole reaching said first wiring line directly above said cleaned surface portion thereof;
forming a barrier metal film to cover an inner surface of said connection hole and then forming a copper containing metal film to fill said connection hole;
removing said copper containing metal film formed outside said connection hole;
forming a second interlayer insulating film on a whole surface of said semiconductor substrate to cover said copper containing metal film formed in said connection hole;
selectively removing said second interlayer insulating film to form a wiring line groove such that said copper containing metal film formed in said connection hole is exposed at a bottom;
forming a barrier metal film to cover an inside of said wiring line groove and then forming a copper containing metal film to fill said wiring line groove; and
removing said copper containing metal film outside said wiring line groove to form a second wiring line wherein said step of forming said first wiring line comprises the steps of:
forming said first copper containing metal film by a plating method;
forming a second copper containing metal film by a sputtering method on a surface of said semiconductor substrate to cover said first copper containing metal film; and
carrying out thermal treatment to said first copper containing metal film and said second copper containing metal film.

12. The manufacturing method of a semiconductor device according to claim 11, wherein said copper containing metal film of said first wiring line is formed by a plating method.

13. The manufacturing method of a semiconductor device according to claim 11, wherein said insulating film includes ladder-type siloxane hydride.

14. The manufacturing method of a semiconductor device according to claim 11, further comprising the step of:
forming a diffusion preventing film composed of SiC, SiCN, SiN or SiOC on said first wiring line before said step of forming said insulating film, wherein said step of forming said connection hole comprises the step of:
selectively removing said first interlayer insulating film and said diffusion preventing film to form said connection hole.

15. A manufacturing method of a semiconductor device, comprising the steps of:
forming an insulating film on a semiconductor substrate;
forming a first wiring line composed of a copper containing metal film in said insulating film;
siliciding a surface portion of said first wiring line; and
forming a connection plug connected with said silicided portion of said first wiring line and a second wiring line connected with said connection plug on said first wiring line, said connection plug and said second wiring line being composed of a copper containing metal film wherein said step of siliciding a surface layer of said first wiring line comprises the step of:
exposing said surface portion of said first wiring line to a gas containing silicon in a state of no plasma.

16. The manufacturing method of a semiconductor device according to claim 15, further comprising the step of:
cleaning said surface portion of said first wiring line before said step of forming said connection plug after said step of forming said first wiring line.

17. The manufacturing method of a semiconductor device according to claim 16, wherein said step of cleaning said surface portion of said first wiring line comprises the step of:
rinsing said surface portion of said first wiring line with liquid containing carboxylic acid or the salt.

18. The manufacturing method of a semiconductor device according to claim 17, wherein said carboxylic acid contains at least one selected from the group consisting of oxalic acid, citric acid, malic acid, maleic acid, succinic acid, tartaric acid or malonic acid.

19. The manufacturing method of a semiconductor device according to claim 16, wherein said step of cleaning said surface portion of said first wiring line comprises the step of:
processing said surface portion of said first wiring line with anti-corrosion agent containing benzotriazole or benzotriazole derivative.

20. The manufacturing method of the semiconductor device according to claim 16, wherein said step of cleaning said surface portion of said first wiring line comprises the step of:
carrying out a plasma process to said first wiring line.

21. The manufacturing method of a semiconductor device according to claim 16, wherein said step of cleaning said surface portion of said first wiring line comprises the step of:
carrying out said plasma process to said first wiring line in a deoxidization atmosphere.

22. The manufacturing method of a semiconductor device according to claim 16, wherein said copper containing metal film of said first wiring line is formed by a plating method.

23. The manufacturing method of a semiconductor device according to claim 16, wherein said insulating film includes ladder-type siloxane hydride.

24. The manufacturing method of a semiconductor device according to claim 23, wherein ladder-type siloxane hydride contains L-Ox.

25. The manufacturing method of a semiconductor device according to claim 23, wherein said forming said insulating film comprises the step of:
sintering said insulating film in an atmosphere temperature in a range of 200 to 400° C.

26. The manufacturing method of a semiconductor device according to claim 15, further comprising the step of:
forming a diffusion preventing film composed of SiC, SiGN, SiN or SiOC on said first wiring line before said step of forming said insulating film, and
wherein said step of forming said connection hole comprises the step of:
selectively removing said first interlayer insulating film and said diffusion preventing film to form said connection hole.

27. The manufacturing method of a semiconductor device according to claim 26, wherein said diffusion preventing film is SiCN film.

28. The manufacturing method of a semiconductor device according to claim 15, wherein said step of forming said first wiring line comprises the steps of:
forming said first copper containing metal film by a plating method;
forming a second copper containing metal film by a sputtering method on a surface of said semiconductor substrate to cover said first copper containing metal film; and
carrying out thermal treatment to said first copper containing metal film and said second copper containing metal film.

29. A manufacturing method of a semiconductor device, comprising the steps of:
forming, on a semiconductor substrate, a copper containing metal film to have substantially uniform plane orientation; and
forming a different kind element containing film, containing a different kind element which is different from copper, by changing a surface portion of said copper containing metal film.

30. A manufacturing method of a semiconductor device, comprising the steps of:
forming a copper containing metal film on a semiconductor substrate by a plating method to have an average grain size equal to or larger than 1 μm; and
forming a different kind element containing film, containing a different kind element which is different from copper, by changing a surface portion of said copper containing metal film.

31. The manufacturing method of a semiconductor device according to claim 29 or 30, wherein said step of forming said copper containing metal film comprises the steps of:
forming a first copper containing metal film on said semiconductor substrate;
forming a second copper containing metal film by a sputtering method on said semiconductor substrate to cover said first copper containing metal film; and
carrying out thermal treatment to said first copper containing metal film and said second copper containing metal film.

32. The manufacturing method of the semiconductor device according to claim 31, further comprising the steps of:
forming an insulating film on said semiconductor substrate; and
forming a concave section in said insulating film, and
wherein said step of forming said first metal film comprises the step of:
forming said first copper containing metal film to fill a part of said concave section;

said step of forming said second copper containing metal film comprises the step of:

forming said second copper containing metal film to fill a remaining part of said concave section, and said step of forming said copper containing metal film comprises the step of:

removing said first copper containing metal film and said second copper containing metal film outside said concave section.

33. The manufacturing method of a semiconductor device according to claim 32, wherein said concave section is a wiring line groove and said copper containing metal film forms a wiring line.

34. The manufacturing method of the semiconductor device according to claim 31, wherein said second copper containing metal film is formed by a bias sputtering method in which a bias is applied to said semiconductor substrate.

35. The manufacturing method of the semiconductor device according to claim 31, wherein said step of forming said second copper containing metal film comprises the step of:

forming said second copper containing metal film such that a film thickness of said second copper containing metal film in a flat portion is thicker than a film thickness of said first copper containing metal film in the flat portion.

36. The manufacturing method of the semiconductor device according to claim 31, wherein said different kind element is silicon, and said step of forming said different kind element containing film comprises the step of:

siliciding a surface portion of said copper containing metal film.

37. The manufacturing method of the semiconductor device according to claim 31, wherein said step of forming said different kind element containing film comprises the step of:

forming an alloy of copper and said different kind element on the surface of said copper containing metal film.

38. The manufacturing method of the semiconductor device according to claim 31, wherein said step of forming said different kind element containing film comprises the step of:

converting a surface portion of said copper containing metal film into an amorphous layer.

39. The manufacturing method of the semiconductor device according to claim 31, wherein said step of forming said copper containing metal film comprises the step of:

forming said copper containing metal film such that a plane orientation in the surface of said copper containing metal film is (200).

40. A manufacturing method of a semiconductor device, comprising the steps of:

forming on a semiconductor substrate, a copper containing metal film to have substantially uniform plane orientation at a surface of said copper containing metal film; and forming a different kind element containing film containing a different kind element which is different from copper on said surface of said copper containing metal film, wherein said step of forming said copper containing metal film comprises the steps of:

forming a first copper containing metal film on said semiconductor substrate;

forming a second copper containing metal film by a sputtering method on said semiconductor substrate to cover said first copper containing metal film; and carrying out thermal treatment to said first copper containing metal film and said second copper containing metal film, and wherein said second copper containing metal film is formed by a bias sputtering method in which a bias is applied to said semiconductor substrate.

41. A manufacturing method of a semiconductor device, comprising the steps of:

forming on a semiconductor substrate, a copper containing metal film to have substantially uniform plane orientation at a surface of said copper containing metal film; and forming a different kind element containing film containing a different kind element which is different from copper on said surface of said copper containing metal film, wherein said step of forming said copper containing metal film comprises the steps of:

forming a first copper containing metal film on said semiconductor substrate;

forming a second copper containing metal film by a sputtering method on said semiconductor substrate to cover said first copper containing metal film; and carrying out thermal treatment to said first copper containing metal film and said second copper containing metal film, and wherein said step of forming said copper containing metal film comprises the step of:

forming said copper containing metal film such that a plane orientation in the surface of said copper containing metal film is (200).

42. A manufacturing method of a semiconductor device, comprising the steps of:

forming a copper containing metal film on a semiconductor substrate having by a plating method to have an average grain size equal to or larger than 1 μm; and forming a different kind element containing film containing a different kind element which is different from copper on said surface of said copper containing metal film, wherein said step of forming said copper containing metal film comprises the steps of:

forming a first copper containing metal film on said semiconductor substrate;

forming a second copper containing metal film by a sputtering method on said semiconductor substrate to cover said first copper containing metal film; and carrying out thermal treatment to said first copper containing metal film and said second copper containing metal film, and wherein said second copper containing metal film is formed by a bias sputtering method in which a bias is applied to said semiconductor substrate.

43. A manufacturing method of a semiconductor device, comprising the steps of:

forming a copper containing metal film on a semiconductor substrate having by a plating method to have an average grain size equal to or larger than 1 μm; and forming a different kind element containing film containing a different kind element which is different from copper on said surface of said copper containing metal film, wherein said step of forming said copper containing metal film comprises the steps of:
  forming a first copper containing metal film on said semiconductor substrate;
  forming a second copper containing metal film by a sputtering method on said semiconductor substrate to cover said first copper containing metal film; and
  carrying out thermal treatment to said first copper containing metal film and said second copper containing metal film, and
wherein said step of forming said copper containing metal film comprises the step of:
  forming said copper containing metal film such that a plane orientation in the surface of said copper containing metal film is (200).

44. A manufacturing method of a semiconductor device, comprising the steps of:
  forming an insulating film on a semiconductor substrate;
  forming a first wiring line composed of a copper containing metal film in said insulating film;
  siliciding a surface portion of said first wiring line;
  forming a connection plug connected with said silicided surface portion of said first wiring line and a second wiring line connected with said connection plug on said first wiring line, said connection plug and said second wiring line being composed of a copper containing metal film; and
  cleaning said surface portion of said first wiring line before said step of forming said connection plug after said step of forming said first wiring line wherein said insulating film includes ladder-type siloxane hydride wherein said forming said insulating film comprises the step of:
  sintering said insulating film in an atmosphere temperature in a range of 200 to 400° C.

45. The manufacturing method of a semiconductor device according to claim 44, wherein said step of cleaning said surface portion of said first wiring line comprises the step of:
  rinsing said surface portion of said first wiring line with liquid containing carboxylic acid or the salt.

46. The manufacturing method of a semiconductor device according to claim 45, wherein said carboxylic acid contains at least one selected from the group consisting of oxalic acid, citric acid, malic acid, maleic acid, succinic acid, tartaric acid or malonic acid.

47. The manufacturing method of a semiconductor device according to claim 44, wherein said step of cleaning said surface portion of said first wiring line comprises the step of:
  processing said surface portion of said first wiring line with anti-corrosion agent containing benzotriazole or benzotriazole derivative.

48. The manufacturing method of the semiconductor device according to claim 44, wherein said step of cleaning said surface portion of said first wiring line comprises the step of:
  carrying out a plasma process to said first wiring line.

49. The manufacturing method of a semiconductor device according to claim 44, wherein said step of cleaning said surface portion of said first wiring line comprises the step of:
  carrying out said plasma process to said first wiring line in a deoxidization atmosphere.

50. The manufacturing method of a semiconductor device according to claim 44, wherein said copper containing metal film of said first wiring line is formed by a plating method.

51. The manufacturing method of a semiconductor device according to claim 44, wherein ladder-type siloxane hydride contains L-Ox.

52. A manufacturing method of a semiconductor device, comprising the steps of:
  forming an insulating film on a semiconductor substrate;
  forming a first wiring line composed of a copper containing metal film in said insulating film;
  siliciding a surface portion of said first wiring line;
  forming a connection plug connected with said first wiring line and a second wiring line connected with said connection plug on said first wiring line, said connection plug and said second wiring line being composed of a copper containing metal film; and
  cleaning said surface portion of said first wiring line before said step of forming said connection plug after said step of forming said first wiring line,
wherein said step of siliciding a surface layer of said first wiring line comprises the step of exposing said surface portion of said first wiring line to a gas containing silicon in a state of no plasma.

53. The manufacturing method of a semiconductor device according to claim 52, wherein said step of cleaning said surface portion of said first wiring line comprises the step of:
  rinsing said surface portion of said first wiring line with liquid containing carboxylic acid or the salt.

54. The manufacturing method of a semiconductor device according to claim 53, wherein said carboxylic acid contains at least one selected from the group consisting of oxalic acid, citric acid, malic acid, maleic acid, succinic acid, tartaric acid or malonic acid.

55. The manufacturing method of a semiconductor device according to claim 52, wherein said step of cleaning said surface portion of said first wiring line comprises the step of:
  processing said surface portion of said first wiring line with anti-corrosion agent containing benzotriazole or benzotriazole derivative.

56. The manufacturing method of the semiconductor device according to claim 52, wherein said step of cleaning said surface portion of said first wiring line comprises the step of:
  carrying out a plasma process to said first wiring line.

57. The manufacturing method of a semiconductor device according to claim 52, wherein said step of cleaning said surface portion of said first wiring line comprises the step of:
  carrying out said plasma process to said first wiring line in a deoxidization atmosphere.

58. The manufacturing method of a semiconductor device according to claim 52, wherein said copper containing metal film of said first wiring line is formed by a plating method.

59. The manufacturing method of a semiconductor device according to claim 52, wherein said insulating film includes ladder-type siloxane hydride.

60. The manufacturing method of a semiconductor device according to claim 59, wherein ladder-type siloxane hydride contains L-Ox.

61. The manufacturing method of a semiconductor device according to claim 59, wherein said forming said insulating film comprises the step of:
  sintering said insulating film in an atmosphere temperature in a range of 200 to 400° C.

62. A manufacturing method of a semiconductor device, comprising the steps of:
  forming an insulating film on a semiconductor substrate;
  forming a first wiring line composed of a copper containing metal film in said insulating film;
  siliciding a surface portion of said first wiring line;
  forming a connection plug connected with said first wiring line and a second wiring line connected with said connection plug on said first wiring line, said connection plug and said second wiring line being composed of a copper containing metal film; and cleaning said surface portion of said first wiring line before said step of forming said connection plug after said step of forming said first wiring line, wherein:
said insulating film includes ladder-type siloxane hydride; and said forming said insulating film comprises the step of sintering said insulating film in an atmosphere temperature in a range of 200 to 400° C.

* * * * *